(12) United States Patent
Vinciarelli et al.

(10) Patent No.: US 9,936,580 B1
(45) Date of Patent: Apr. 3, 2018

(54) METHOD OF FORMING AN ELECTRICAL CONNECTION TO AN ELECTRONIC MODULE

(71) Applicant: VLT, Inc., Sunnyvale, CA (US)

(72) Inventors: Patrizio Vinciarelli, Boston, MA (US); Robert Joseph Balcius, Methuen, MA (US); Steven P. Sadler, Billerica, MA (US); Mark Andrew Thompson, Royalston, MA (US)

(73) Assignee: VLT, Inc., Sunnyvale, CA (US)

( * ) Notice: Subject to any disclaimer, the term of this patent is extended or adjusted under 35 U.S.C. 154(b) by 0 days.

(21) Appl. No.: 14/596,914

(22) Filed: Jan. 14, 2015

(51) Int. Cl.
| | |
|---|---|
| H05K 3/30 | (2006.01) |
| H05K 1/14 | (2006.01) |
| H05K 1/18 | (2006.01) |
| H05K 1/02 | (2006.01) |
| H05K 3/36 | (2006.01) |
| B23K 1/00 | (2006.01) |
| B23K 1/20 | (2006.01) |

(52) U.S. Cl.
CPC ............ *H05K 1/141* (2013.01); *B23K 1/0016* (2013.01); *B23K 1/20* (2013.01); *H05K 1/0298* (2013.01); *H05K 1/181* (2013.01); *H05K 3/303* (2013.01); *H05K 3/36* (2013.01); *B23K 2001/12* (2013.01)

(58) Field of Classification Search
CPC .... H05K 1/0203; H05K 3/328; H05K 3/3447; H05K 5/064; H05K 7/02; H05K 7/2049; H05K 7/20436; H05K 7/20509; H05K 7/209; H05K 2201/105; H05K 2201/066; H05K 2201/10409; H01R 43/24

USPC ...... 29/592.1, 830, 832, 834, 840, 846, 852; 361/709–712, 715, 717–719
See application file for complete search history.

(56) References Cited

U.S. PATENT DOCUMENTS

| | | | |
|---|---|---|---|
| 3,409,805 | A | 11/1968 | Whippl |
| 4,326,765 | A | 4/1982 | Brancaleone |

(Continued)

FOREIGN PATENT DOCUMENTS

| | | |
|---|---|---|
| WO | WO95/27308 | 10/1995 |
| WO | WO2012/155036 | 11/2012 |

OTHER PUBLICATIONS

Braun et al.; "Opportunities of Wafer Level Embedded Technologies for MEMS Devices"; SEMI MEMS Tech Seminar; (possibly published on Sep. 26, 2013); 22 pp.

(Continued)

*Primary Examiner* — Paul D Kim
(74) *Attorney, Agent, or Firm* — Fish & Richardson P.C.

(57) ABSTRACT

Circuit assemblies can be electrically interconnected by providing a circuit assembly having a top surface, a bottom surface, and a perimeter edge connecting the top and bottom surfaces, the perimeter edge being formed of insulative material and having a plurality of conductive features embedded in and exposed on the surface of the edge. The conductive features are arranged in contact sets, and each contact set is separated from adjacent contact sets by a portion of the perimeter edge that is free of conductive features. Each contact set includes conductive features that together form a distributed electrical connection to a single node. The insulative material is selectively removed to form recesses adjacent the conductive features exposing additional surface contact areas along lateral portions of the conductive features in the recesses.

33 Claims, 57 Drawing Sheets

(56) References Cited

U.S. PATENT DOCUMENTS

| | | | |
|---|---|---|---|
| 4,366,342 A | 12/1982 | Breedlove | |
| 4,551,747 A | 11/1985 | Gilbert et al. | |
| 5,241,133 A | 8/1993 | Mullen et al. | |
| 5,471,366 A | 11/1995 | Ozawa | |
| 5,557,142 A | 9/1996 | Gilmore | |
| 5,728,600 A | 3/1998 | Saxelby, Jr. et al. | |
| 5,864,092 A | 1/1999 | Gore et al. | |
| 5,990,776 A | 11/1999 | Jitaru | |
| 6,184,585 B1 | 2/2001 | Martinez et al. | |
| 6,403,009 B1 | 6/2002 | Saxelby, Jr. et al. | |
| 6,734,552 B2 | 5/2004 | Combs | |
| 6,830,959 B2 | 12/2004 | Estacio | |
| 6,903,938 B2 | 6/2005 | Waffenschmidt | |
| 6,940,013 B2 | 9/2005 | Vinciarelli et al. | |
| 7,015,587 B1 | 3/2006 | Poddar | |
| 7,030,469 B2 | 4/2006 | Mahadevan et al. | |
| 7,049,682 B1 | 5/2006 | Mathews | |
| 7,198,987 B1 | 4/2007 | Warren | |
| 7,361,844 B2 | 4/2008 | Vinciarelli et al. | |
| 7,952,879 B1 * | 5/2011 | Vinciarelli | H05K 7/209 165/185 |
| 7,972,143 B2 | 7/2011 | Smejtek | |
| 7,994,888 B2 | 8/2011 | Ikriannikov | |
| 8,138,584 B2 | 3/2012 | Wang | |
| 8,299,882 B2 | 10/2012 | Ikriannikof | |
| 8,427,269 B1 | 4/2013 | Vinciarelli | |
| 8,966,747 B2 * | 3/2015 | Vinciarelli | H01R 43/24 29/830 |
| 2002/0096348 A1 | 7/2002 | Saxelby et al. | |
| 2003/0011054 A1 | 1/2003 | Jeun et al. | |
| 2004/0100778 A1 | 5/2004 | Vinciarelli et al. | |
| 2006/0097831 A1 | 5/2006 | Lotfi et al. | |
| 2007/0107935 A1 | 5/2007 | Hash et al. | |
| 2007/0241440 A1 | 10/2007 | Hoang et al. | |
| 2010/0197150 A1 | 8/2010 | Smejtek | |
| 2010/0246152 A1 | 9/2010 | Lin et al. | |
| 2010/0259909 A1 | 10/2010 | Ho et al. | |
| 2012/0287582 A1 | 11/2012 | Vinciarelli et al. | |
| 2014/0355218 A1 | 12/2014 | Vinciarelli et al. | |

OTHER PUBLICATIONS

AFM Microelectronics Inc., "General Purpose Capacitors", www.afmmicroelectronics.com, 13 pages, published on or before Jul. 26, 2010.

Bhat, Shriram N., et al., "Enhancement of Via Integrity in High-Tg Multilayer Printed Wiring Boards," Feb. 19, 2013, IEEE, 7 pgs.

International Search Report and Written Opinion, PCT/US2012/37495, May 6, 2013, 18 pages.

Kahn, "Technical Information: Multilayer Ceramic Capacitors—Materials and Manufacture", Microelectronics Inc., 9 pages, published on or before Jul. 26, 2010.

Reply to Action in U.S. Appl. No. 13/105,696, dated Mar. 25, 2014, Examiner Arbes, 10 pages.

Reply to Action in U.S. Appl. No. 14/116,642, dated May 9, 2016, Examiner Arbes, 16 pages.

Reply to Action in U.S. Appl. No. 14/635,420, dated Nov. 13, 2015, Examiner Arbes, 9 pages.

Reply to Ex Parte Quayle Action in U.S. Appl. No. 14/635,467, dated May 6, 2016, Examiner Arbes, 5 pages.

Reply to Notice of Allowance in U.S. Appl. No. 13/105,696, dated Jan. 23, 2015, Examiner Arbes, 2 pages.

USPTO Ex Parte Quayle Office Action in U.S. Appl. No. 14/635,467, dated Mar. 11, 2016, Examiner Arbes, 5 pages.

USPTO Notice of Allowance in U.S. Appl. No. 13/105,696, dated Nov. 18, 2014, Examiner Arbes, 6 pages.

USPTO Notice of Allowance in U.S. Appl. No. 14/635,420, dated Feb. 17, 2016, Examiner Arbes, 6 pages.

USPTO Office Action in U.S. Appl. No. 13/105,696, dated Sep. 25, 2013, Examiner Arbes, 8 pages.

USPTO Office Action in U.S. Appl. No. 14/116,642, dated Feb. 9, 2016, Examiner Shrestha, 15 pages.

USPTO Office Action in U.S. Appl. No. 14/635,420, dated Oct. 22, 2015, Examiner Arbes, 6 pages.

USPTO Supplemental Notice of Allowance in U.S. Appl. No. 14/635,420, dated Apr. 27, 2016, Examiner Arbes, 6 pages.

* cited by examiner

METHOD OF FORMING AN ELECTRICAL CONNECTION TO AN ELECTRONIC MODULE

CROSS-REFERENCE TO RELATED APPLICATION

This application is related to U.S. patent application Ser. No. 14/596,836, now pending, titled "Isolator with Integral Transformer," and U.S. patent application Ser. No. 14/596,848, now pending, titled "Power Adapter Packaging," both filed on the same date as this application. The above applications are incorporated herein by reference.

FIELD OF THE INVENTION

This invention relates to the field of encapsulating electronic assemblies and more particularly to encapsulated power converters and other electronic assemblies that have components with edge connectors.

BACKGROUND

Contemporary electronic power systems require power converters capable of deployment at the point of load. Competing considerations require increasing power density, decreasing mounting area on customer motherboard, and lower cost.

An encapsulated electronic module, such as an electronic power converter module for example, may comprise a printed circuit assembly over-molded with an encapsulant to form some or all of the package and exterior structure or surfaces of the module. Encapsulation in this manner may aid in conducting heat out of the over-molded components, i.e., components that are mounted on the printed circuit assembly and covered with encapsulant. In the case of an electronic power converter module, the printed circuit assembly may include one or more inductive components, such as inductors and transformers. Encapsulated electronic power converters capable of being surface mount soldered to a customer motherboard are described in Vinciarelli et al., Power Converter Package and Thermal Management, U.S. Pat. No. 7,361,844, issued Apr. 22, 2008, (the "SAC Package Patent") (assigned to VLT, Inc. of Sunnyvale, Calif., the entire disclosure of which is incorporated herein by reference). Encapsulated electronic modules having at least one surface of a magnetic core structure exposed and methods for manufacturing the same are described in Vinciarelli et al., Encapsulation Method and Apparatus for Electronic Modules, U.S. patent application Ser. No. 12/493,773, filed Jun. 29, 2009, (the "Exposed Core Application") (assigned to VI Chip Inc. of Andover, Mass., the entire disclosure of which is incorporated herein by reference).

Methods of over-molding both sides of a printed circuit board assembly while leaving opposing regions on both sides of the printed circuit board free of encapsulant are described in Saxelby, et al., Circuit Encapsulation Process, U.S. Pat. No. 5,728,600, issued Mar. 17, 1998 and Saxelby, et al., Circuit Encapsulation, U.S. Pat. No. 6,403,009, issued Jun. 11, 2002 (collectively the "Molding Patents") (both assigned to VLT, Inc. of Sunnyvale, Calif. and incorporated by reference in their entirety).

Leads for connecting the encapsulated power converter substrate to the customer motherboard are described in Vinciarelli et al., Surface Mounting A Power Converter, U.S. Pat. No. 6,940,013, issued Sep. 6, 2005 (the "J-Lead Patent") (assigned to VLT, Inc. of Sunnyvale, Calif., the entire disclosure of which is incorporated herein by reference).

SUMMARY

In general, in one aspect, a method of electrically interconnecting circuit assemblies is provided. The method includes providing a circuit assembly having a top surface, a bottom surface, and a perimeter edge connecting the top and bottom surfaces, the perimeter edge being formed of insulative material and having a plurality of conductive features embedded in the surface of the perimeter edge, the conductive features each including an exposed edge, the exposed edges being arranged into one or more contact sets. Each contact set provides an electrical connection to a respective electrical node of the circuit assembly, including one or more of the conductive features, being separated from adjacent contact sets by a portion of the perimeter edge that is free of conductive features, and being located at an elevation in the perimeter surface between the bottom surface and the top surface. The method includes selectively removing portions of the insulative material from the surface of the perimeter edge adjacent to selected ones of the exposed edges of selected ones of the conductive features exposing additional surface area of the selected ones of the conductive features. The additional surface area is recessed from the perimeter edge and together with the adjacent exposed edge forms a three dimensional contact.

Implementations of the method may include one or more of the following features. The additional surface area can form an angle greater than 45 degrees to the perimeter edge. The method can include preparing the additional surface area of the conductive features for solder wetting. The method can include applying solder paste to the exposed portions of the conductive features. The method can include wetting the conductive features in the recesses and along the perimeter surface with solder. The method can include placing an external conductive terminal adjacent the conductive features and forming a solder connection between the external conductive terminal and the conductive features. The method can include forming a solder connection between each set of the conductive features and a respective conductive pad on a printed circuit board. The method can include forming a solder connection between each set of the conductive features and a respective terminal of a lead frame.

In general, in another aspect, a method of forming an electrical connection to an electronic module is provided. The method includes assembling a panel including a substrate and having one or more conductive features enclosed within the panel and unexposed to an exterior surface of the panel, the one or more conductive features each being electrically connected to a respective electrical node of the panel and being located along a cut line; cutting the panel along the cut line exposing a contact edge of each of the one or more conductive features, wherein each contact edge is embedded in and forms part of a perimeter surface of the electronic module after the cutting; and selectively removing portions of material from the perimeter surface adjacent to selected ones of the contact edges of selected ones of the conductive features exposing additional portions of the selected ones of the conductive features. The additional portions are recessed from the perimeter edge and together with the adjacent exposed edge forms a three dimensional contact.

Implementations of the method may include one or more of the following features. The method can include preparing the contact edges and the additional portions of the conductive feature for solder wetting. The method can include wetting the contact edges and the additional portions of the conductive features with solder. The method can include forming a metallic bond between the contact edges and the additional portions and an external conductive terminal. The method can include forming a metallic bond between the contact edges and the additional portions of the conductive features and a conductive pad on a printed circuit board. The method can include forming a solder connection between the contact edges and the additional portions of the conductive features and a terminal of a lead frame.

In general, in another aspect, an apparatus includes a circuit assembly having a modular package including a first surface, a second surface, and a perimeter edge connecting the first and second surfaces, the perimeter edge being formed of insulative material and having one or more conductive features embedded in the surface of the perimeter edge. The conductive features each has a contact edge generally coplanar with the perimeter edge and one or more additional surfaces extending from the contact edge into a respective recess in the insulative material, the recess being open to the perimeter edge wherein the contact edge and the additional surface together form a three dimensional contact.

Implementations of the apparatus may include one or more of the following features. The three dimensional contacts are arranged in a plurality of contact sets, each contact set having a plurality of three dimensional contacts, each contact set being separated from adjacent contact sets by a portion of the perimeter edge that is free of conductive features, the plurality of three dimensional contacts of each contact set together form a distributed electrical connection to a single electrical node in the circuit assembly. The perimeter edge can include an edge of a printed circuit board ("PCB"), the PCB having a plurality of conductive layers, and the conductive features comprise selected portions of the conductive layers and are located at an elevation in the perimeter surface between the first surface and the second surface. The recesses can be formed in insulation layers in the PCB. Each contact set can be separated from adjacent contact sets by a portion of the perimeter edge that is free of conductive features, in which a first distance between two adjacent contact sets is at least twice as large as a second distance between two adjacent conductive features, the first and second distances being measured along a direction substantially perpendicular to the top surface. Each contact set can be separated from adjacent contact sets by a portion of the perimeter edge that is free of conductive features, in which a first distance between two adjacent contact sets is at least five times as large as a second distance between two adjacent conductive features, the first and second distances being measured along a direction substantially perpendicular to the top surface. The apparatus can include an external conductive terminal electrically coupled to a selected contact set. The apparatus can include an external circuit board having a plurality of conductive pads, and a solder connection between each conductive pad and a respective contact set. The apparatus can include a lead frame having a plurality of terminals, and a solder connection between each terminal and a respective contact set.

In general, in another aspect, an apparatus includes a circuit board having a plurality of conductive layers embedded in an insulative material, in which two or more of the embedded conductive layers protrude from, an edge, or a recess in the edge, of the circuit board, each protruded portion of the conductive layer having an exposed surface contact area. Some of the protruded portions of the conductive layers are arranged in a contact set, each protruded portion of the conductive layer is separated from adjacent protruded portions of the conductive layers by a portion of the external edge that is free of conductive features, the protruded portions of the conductive layers of the contact set together form a distributed electrical connection to a single node.

Implementations of the apparatus may include one or more of the following features. The protruded portions of the conductive layers can be arranged in a plurality of contact sets, each contact set having a plurality of conductive protruded portions in which each conductive protruded portion is separated from adjacent conductive protruded portion by a portion of the external edge that is free of conductive features, the plurality of conductive protruded portions of each contact set together form a distributed electrical connection to a single node. Each contact set can be separated from adjacent contact sets by a portion of the perimeter edge that is free of conductive features, in which a first distance between two adjacent contact sets is at least twice as large as a second distance between two adjacent conductive features, the first and second distances being measured in a thickness direction of the circuit board. The apparatus can include two external conductive terminals that are electrically coupled to two respective contact sets that are aligned and spaced apart in the thickness direction. The apparatus can include an external circuit board having a plurality of conductive pads, and a solder connection between each conductive pad and a respective contact set. The apparatus can include a lead frame having a plurality of terminals, and a solder connection between each terminal and a respective contact set. The apparatus can include an external conductive terminal that is electrically coupled to the exposed conductive protruded portions of the contact set. The apparatus can include a second circuit board having a conductive pad that is electrically coupled to the exposed conductive protruded portions of the contact set.

In general, in another aspect, an apparatus includes a circuit assembly having a modular package including a multilayer printed circuit board that has an insulative material and one or more conductive layers embedded in the insulative material, in which the one or more conductive layers partially protrude from an edge surface of the insulative material to form one or more three-dimensional contacts, each three-dimensional contact has a thickness that is substantially the same as the thickness of the corresponding conducive layer and has a width that is greater than the thickness.

Implementations of the apparatus may include one or more of the following features. The three dimensional contacts can be arranged in a plurality of contact sets, each contact set having a plurality of three dimensional contacts, each contact set being separated from adjacent contact sets by a portion of the edge of insulative material that is free of conductive features, the plurality of three dimensional contacts of each contact set together form a distributed electrical connection to a single electrical node in the circuit assembly. Each contact set can be separated from adjacent contact sets by a portion of the edge of the insulative material that is free of conductive features, in which a first distance between two adjacent contact sets is at least twice as large as a second distance between two adjacent three dimensional contacts, the first and second distances being measured along a thickness direction of the printed circuit board. Each contact set can be separated from adjacent contact sets by a portion of the edge of the insulative material that is free of conductive features, in which a first distance between two adjacent contact sets is at least five times as large as a second distance between two adjacent three dimensional contacts, the first and second distances being measured along a thickness direction of the printed circuit board. The apparatus can include an external conductive terminal electrically coupled to a selected contact set. The apparatus can include an external circuit board having a plurality of conductive pads, and a solder connection between each conductive pad and a respective contact set. The apparatus can include a lead frame having a plurality of terminals, and a solder connection between each terminal and a respective contact set.

The details of one or more embodiments of the invention are set forth in the accompanying drawings and description below. Other features, objects, and advantages of the invention will be apparent from the description and drawings, and from the claims.

DESCRIPTION OF DRAWINGS

Like references symbols in the various drawings indicate like elements.

DETAILED DESCRIPTION

I. Vertical PCB Package.

Figure 1:
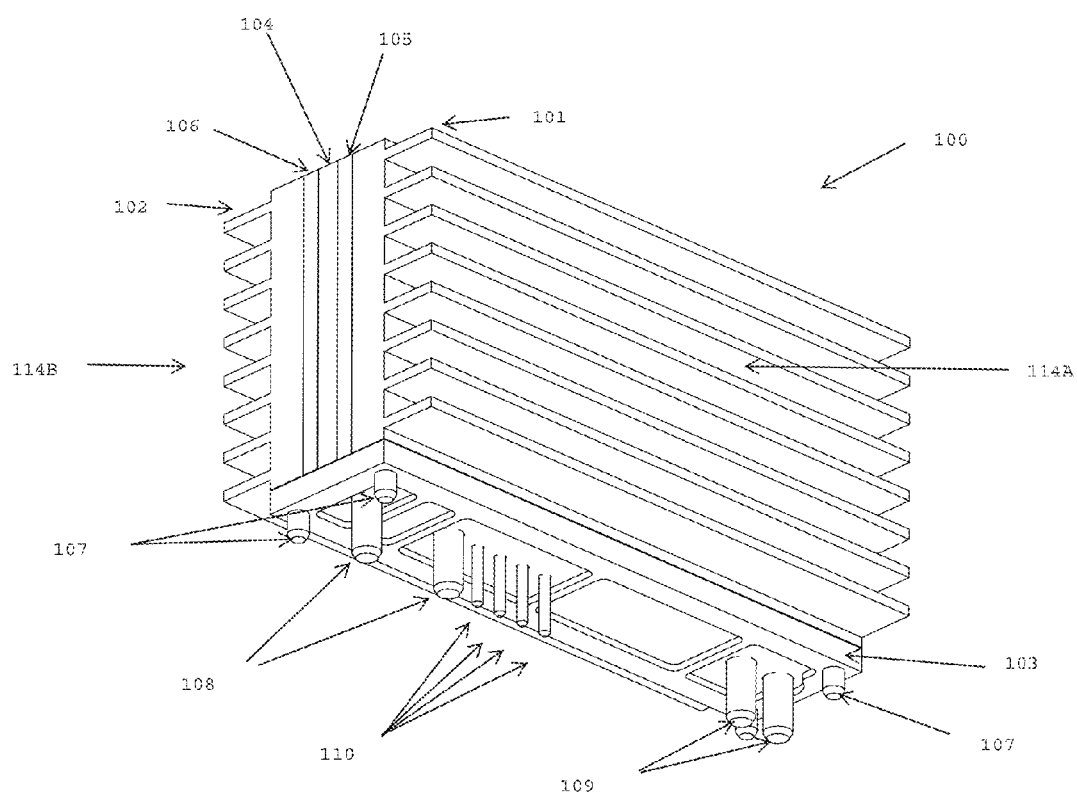
FIG. 1 shows an electronic module 100.

Referring to FIG. 1, an electronic module 100, e.g., a power converter, is shown having a generally rectangular form factor with two large faces 114A, 114B covered by heat sinks 101, 102. As shown between the heat sinks 101 and 102, the module 100 includes a printed circuit board ("PCB") 104 having its large faces arranged generally coplanar to the two large faces 114A, 114B of the electronic module 100. Electronic components (FIGS. 3, 5, 6) may be mounted to one or both sides of the PCB 104 and electrically interconnected, e.g. by conductive traces on or in the PCB 104 to form the module circuitry. Using a power converter as an example, the electronic components may include power transistors, control ICs, and discrete resistors and capacitors. One or more magnetic core structures may be provided, which in combination with conductive traces on PCB 104, may form planar magnetic components such as inductors and transformers.

The electronic components may protrude from one or both sides of the PCB 104 to varying degrees depending upon component size. Spaces between the faces of PCB 104 and the components on the PCB on one hand and the interior surfaces of the heat sinks on the other hand may be filled with molding compound, which when cured may form integral structural layers 105, 106 as shown in FIG. 1 and further provides a thermally conductive medium in which heat may be readily conducted away from the PCB and components to the heat sinks 101, 102. The interior surfaces of the heat sinks may be contoured to match the height of one or more of the components while maintaining an appropriate clearance for insulation and safety agency requirements. Contouring the heat sinks 101, 102 in this way: (1) to match the height of the magnetic core structure may be used as an alternate approach to the exposed core encapsulation method described in Vinciarelli, Encapsulation Method and Apparatus for Electronic Modules, U.S. patent application Ser. No. 12/493,773 filed Jun. 29, 2009 (assigned to VI Chip Corp. of Andover, Mass., the entire disclosure of which is incorporated herein by reference); (2) to match the height of lower profile components, such as power semiconductors, may (a) increase thermal performance in the case of heat dissipating components by replacing molding compound with heat sink metal; and (b) reduce cost generally by reducing the volume of molding compound required; and (c) further reduce cost by allowing less expensive molding compound to be used because of reduced thermal pathways through the encapsulant, easing the thermal conductivity requirements of the encapsulant (e.g., an encapsulant having a 1 degree Celsius per watt thermal resistance may be used with the contoured heat sink instead of an encapsulant having a 3 degrees Celsius per watt thermal resistance used without the contoured heat sink).

A connector 103, including terminals 108, 109, 110 and standoffs 107, may be provided as shown along an edge of the PCB 104 to make electrical connections between the electronic module 100 and external circuitry. As shown in FIG. 1 with the connector 103 situated along one edge of the module 100, preferably one of the longest edges, the module 100 may be mounted vertically, i.e. with its internal PCB 104 perpendicular to a chassis or another circuit board such as a motherboard. Using the vertical mount module construction illustrated in FIG. 1 for a power converter may provide advantages over the more conventional horizontal mounting technique. For example, using the vertical PCB arrangement may allow use of a magnetic core structure that is thicker than in a horizontal PCB configuration, e.g. because of height restrictions, enabling increased power throughput, as compared to a similar converter using a horizontal PCB orientation. The length of the magnetic path may be also reduced in the vertical PCB configuration further reducing losses in the magnetic components. Shorter windings may also be used further reducing transformer or inductor losses. Further details and variations of, and a process for making, the electronic module will be discussed below in connection with a panel molding process.

II. Panel Molding Process Integrated Mold

A. Overview

Figure 4:
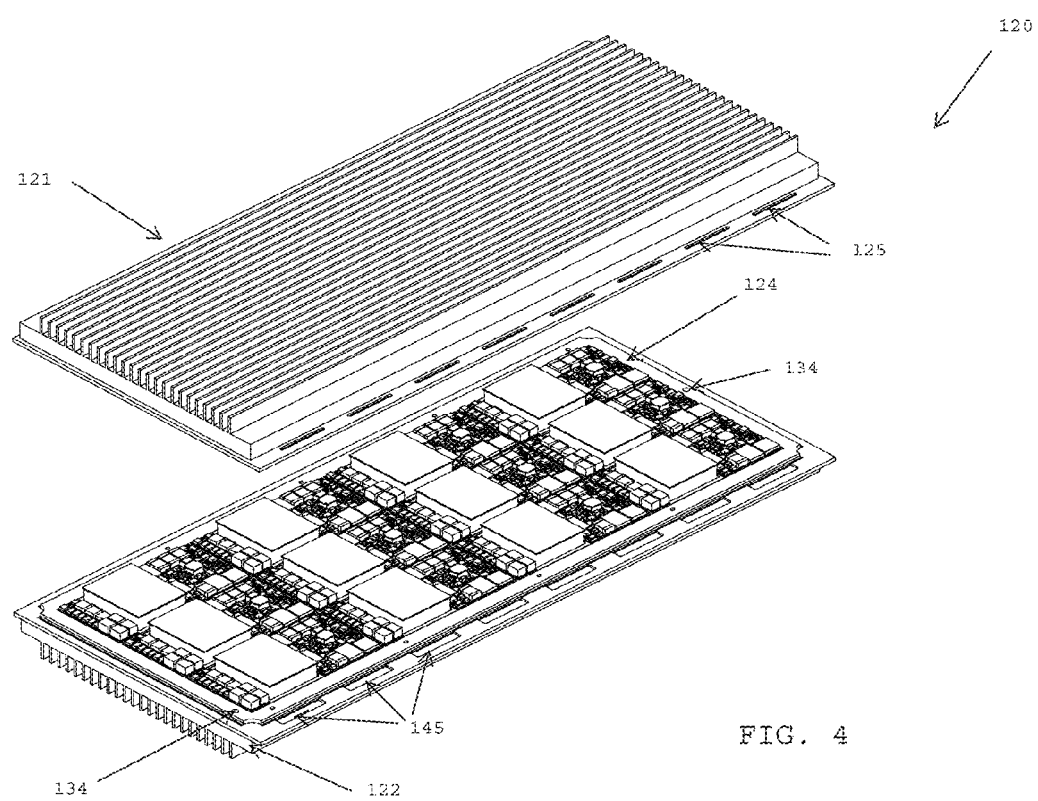
FIG. 4 shows the panel assembly 120 with the top heat sink panel 121 removed.
Figure 5:
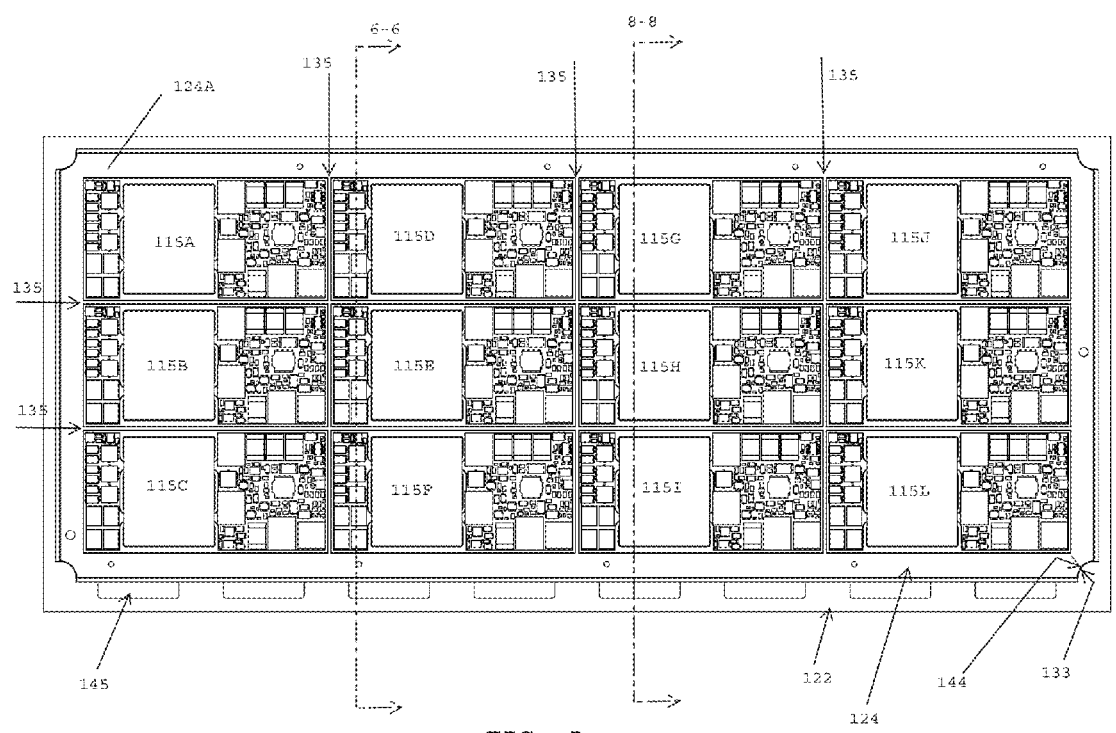
FIG. 5 shows a plan view of the PCB panel 124 assembled with the bottom heat sink panel 122.

The electronic module 100 shown in FIG. 1 may be fabricated using a panel molding process described with reference to FIGS. 2-9. The panel molding process may be used to produce a multiplicity of modules at a time. A PCB panel 124 may be provided with a plurality of individual circuits for building the electronic modules. FIGS. 3, 4, and 5 show the PCB panel 124 populated with electronic components revealing a 3-by-4 pattern of twelve circuits to make twelve individual modules 115 (labeled 115A through 115L in FIG. 5). The illustrative example of FIGS. 3-5, being for power converters, includes magnetic core structures 131 (FIG. 3) in addition to electronic components 132. As shown in FIG. 5, the pattern of individual circuits 115A-115L are arranged close together and separated by small spaces 135 preferably sufficient to allow the PCB panel to be cut during the singulation process without necessitating two cuts between modules or unnecessary waste of PCB material. The spacing may be adjusted based upon the cut dimensions produced by the equipment used to make the cuts.

Figure 2:
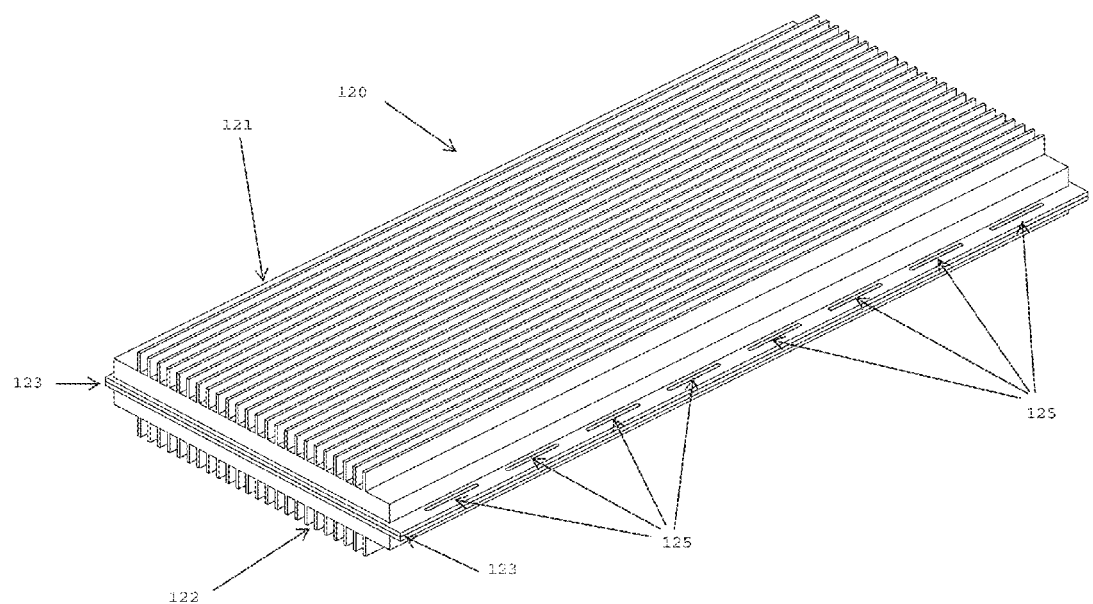
FIG. 2 shows a panel assembly 120 comprising a plurality of electronic modules before singulation.
Figure 3:
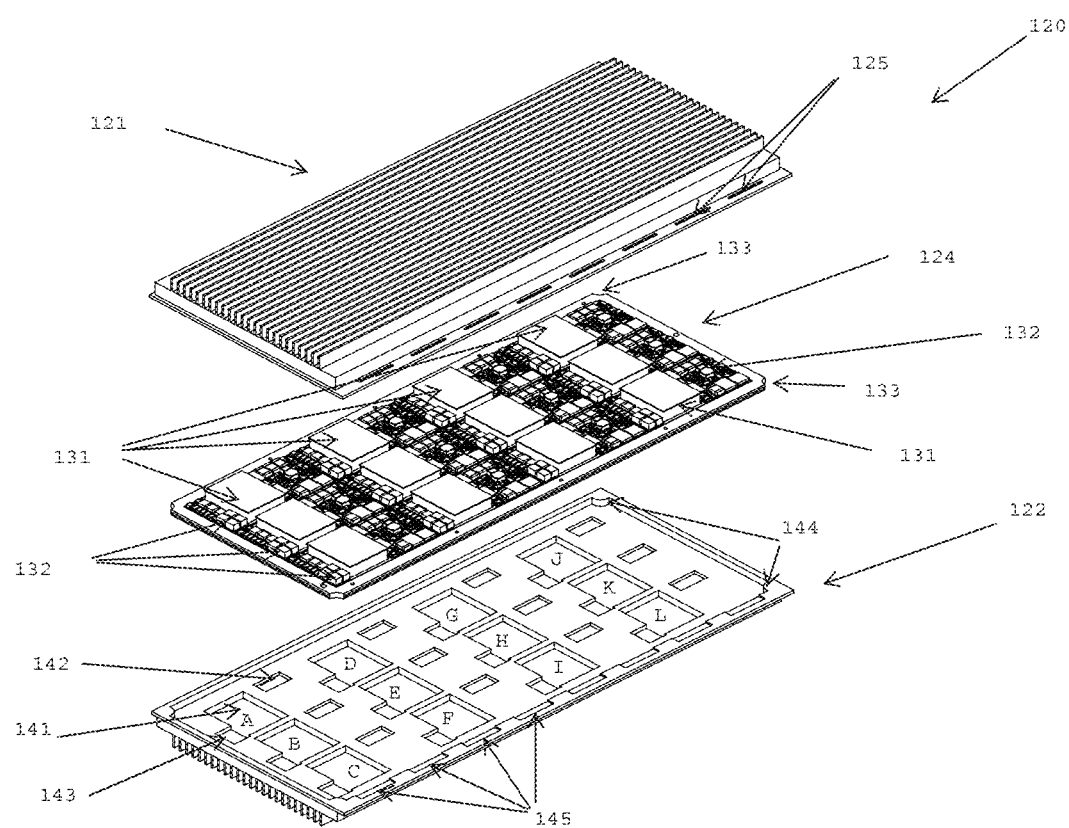
FIG. 3 shows an exploded view of the panel assembly revealing the heat sink panels 121 and 122 and internal PCB panel 124.
Figure 6:
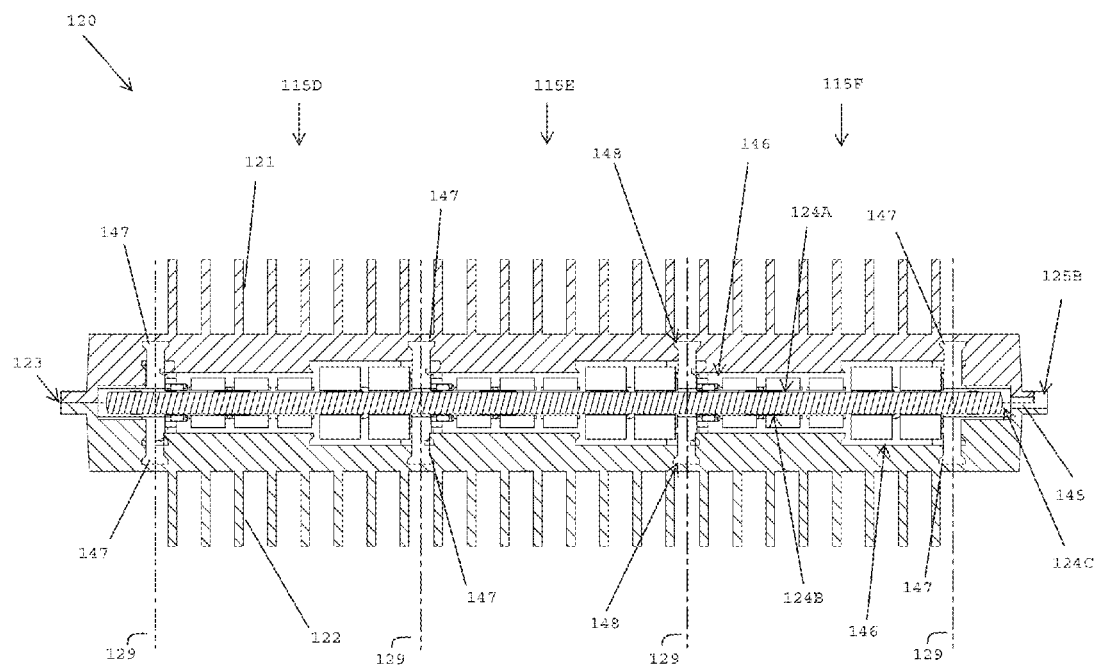
FIG. 6 shows a cross-section of the panel assembly 120.
Figure 7:
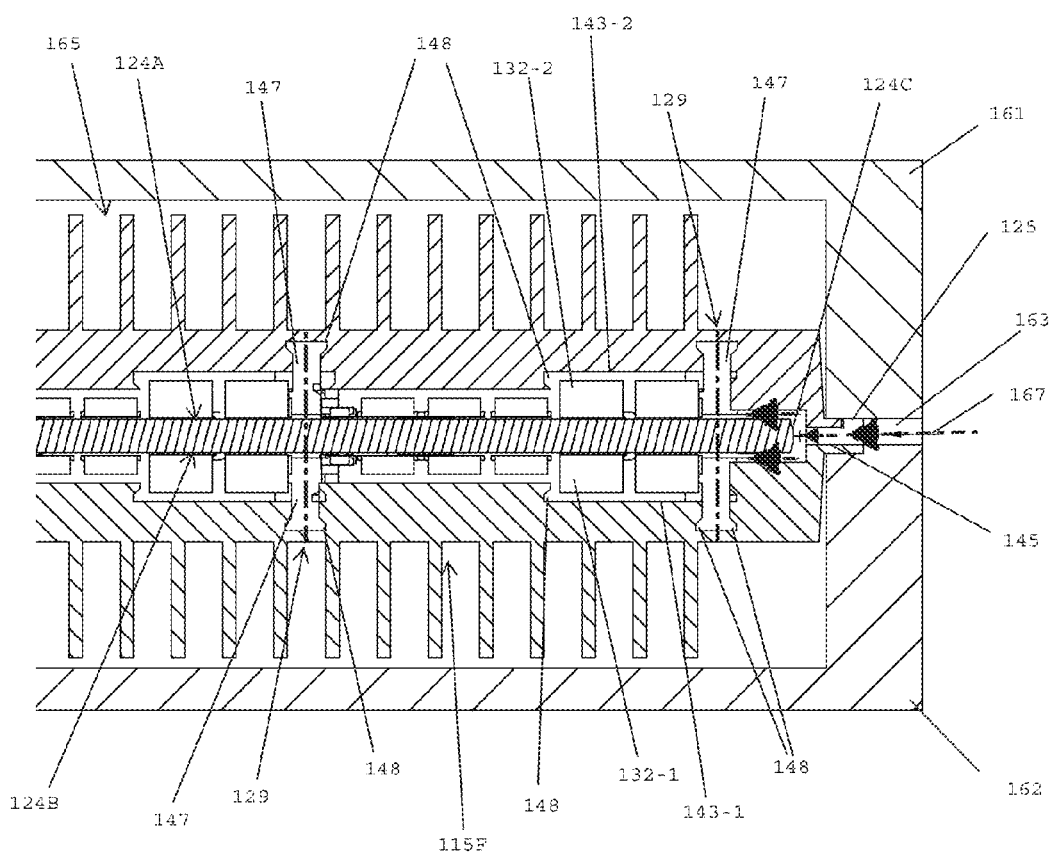
FIG. 7 shows a partial cross section of the panel assembly closed in a mold.

The PCB panel 124 containing the multiplicity of the electronic circuits (115A-115L in FIG. 5) may be assembled with matching heat sink panels 121, 122 as shown in FIG. 3 to form a panel assembly 120 (FIG. 2). As shown in FIGS. 3 and 6, the two heat sink panels 121 and 122 when assembled together may form an internal cavity 146, which completely encloses the populated PCB panel 124. FIGS. 2 and 6 show that the heat sink panels 121 and 122 may be pressed together (e.g. by a mold press 161, 162 as shown in FIG. 7) to form a seal 123 (FIGS. 2, 6-8) around the perimeter of the internal cavity 146. In this example, the heat sink panels 121 and 122 also function as mold panels by forming a mold cavity (e.g., the internal cavity 146) that may be filled at least in part by an encapsulant encapsulating the surfaces of the PCB panel 124 and the electronic components on the PCB panel 124.

B. Heat Sink Panels

Figure 17:
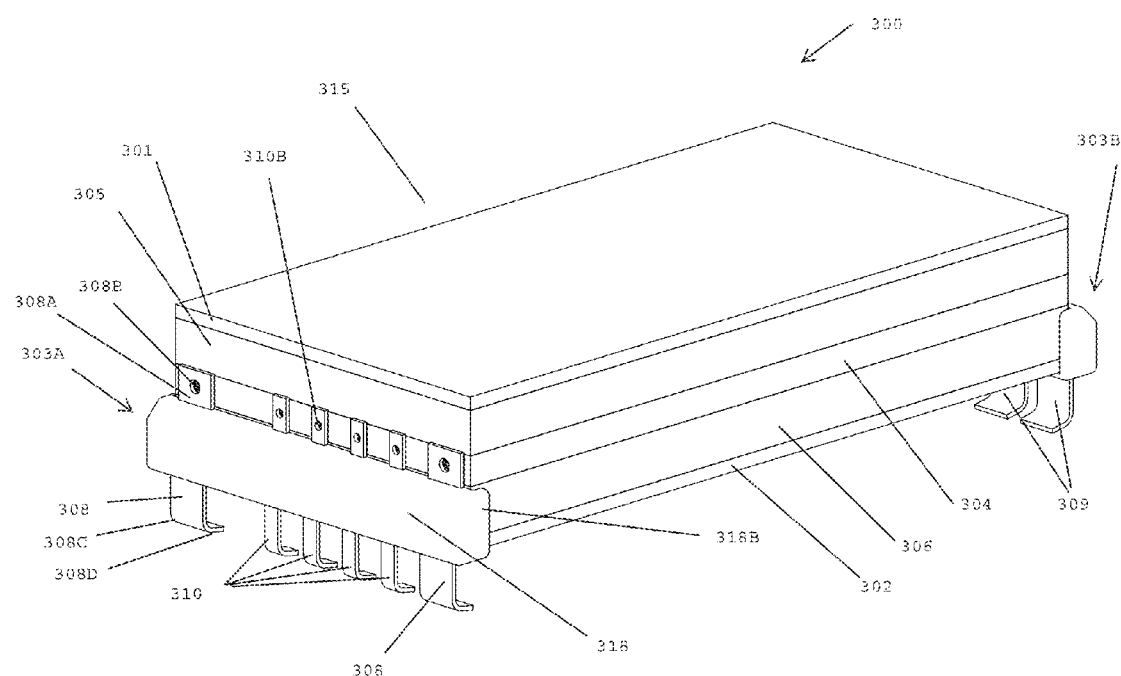
FIG. 17 shows a horizontal surface-mount module 300.
Figure 25:
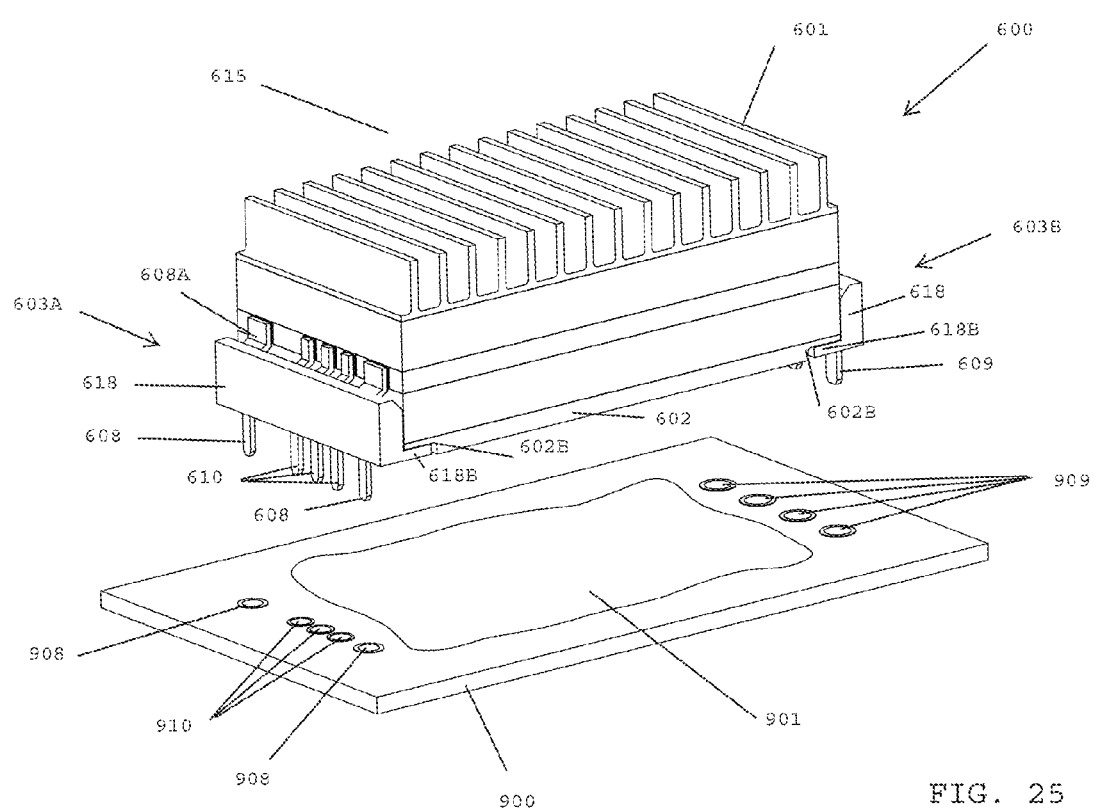
FIG. 25 shows an alternative horizontal through-hole flush-mount module 600 exploded from a customer PCB.

Referring to FIG. 2, the heat sink panels 121, 122 may include fins on the exterior surfaces as shown. The fins may be arranged in any direction relative to the panel or in any pattern and may vary in height, thickness, and spacing as required for the particular application. For example, modules 115 and 115B shown in FIGS. 10A and 10B respectively illustrate longitudinal and transverse fin orientations. Alternatively, one or both of the heat sink panels may have a generally flat exterior surface omitting the fins altogether. For example, FIGS. 17 and 25 show modules 315 and 615 produced when both heat sink panel exterior surfaces are flat and one is flat and one is finned, respectively. The thickness of the panels between the internal cavity and the external surface may be varied to suit the particular requirements of the application.

C. Heat Sink Internal Contours

Referring to FIG. 3, the contoured interior surface of the bottom heat sink panel 122 is shown including a 3-by-4 repeating pattern of twelve (A through L) prominent recesses 141 and shallower recesses 142 and 143. Recesses 141 may be matched to the downward protruding portion of magnetic core structures 131. Similarly, recesses 142 and 143 may be matched to other downwardly protruding components on the PCB panel 124. Note that in the example of FIG. 3, because the core structure 131 protrudes from the PCB 124 more than the other components, the recesses 141 are deeper than recesses 142, 143. Although not visible in FIG. 3, the interior surface of heat sink panel 121 may similarly include contour features to match the components and core structure on the upward facing side of the PCB panel 124 (e.g. as shown in the cross-section of FIGS. 6, 7). Although the interior contour of panel 122 in FIG. 3 is shown including three recesses 141, 142, 143 repeated for each circuit (A through L in the 3-by-4 pattern), the interior contours of the heat sink panels 121 and 122 may range from simple flat surfaces (accommodating the height of the tallest component) to a complex arrangement of a multiplicity of recessed and protruding features (accommodating a multiplicity of component heights) which at the extreme could match every component individually.

Figure 12:
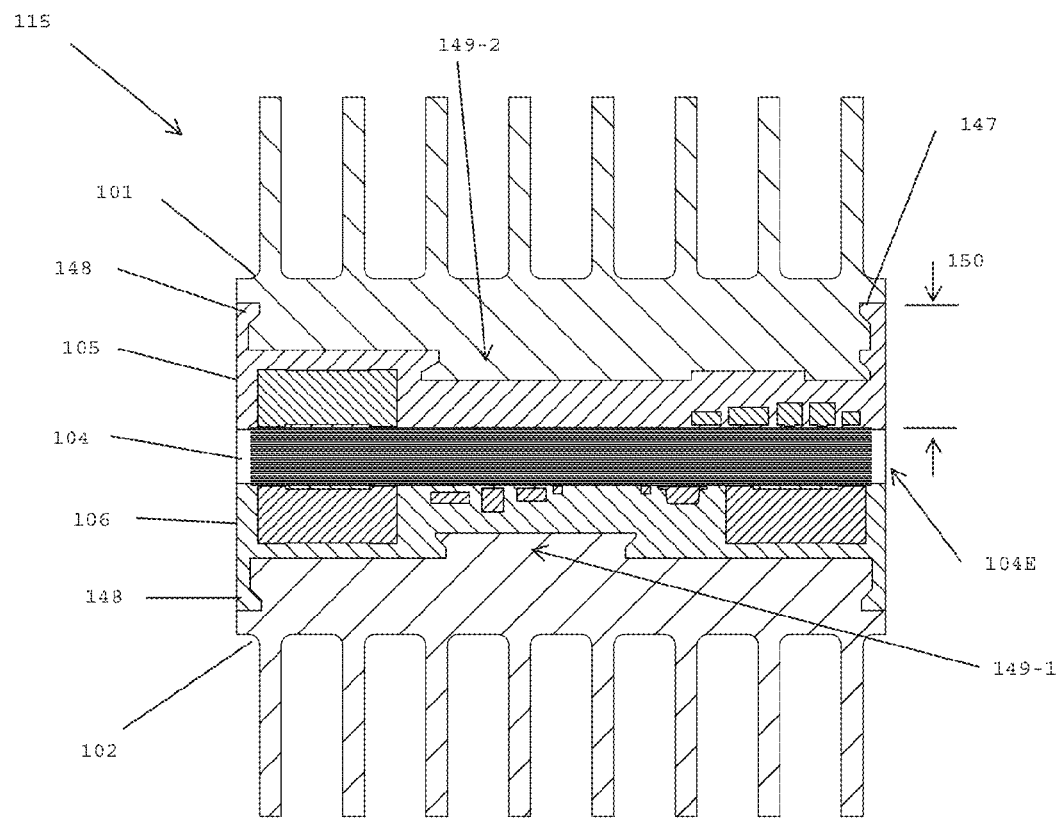
FIG. 12 shows a cross section of the singulated module 115 of FIG. 10A.

Additional features may be provided in the heat sink panels to facilitate the panel molding process, to enhance the mechanical integrity or performance of the finished module 100, or to satisfy safety agency clearance requirements for the finished product. By way of example undercut features, such as undercuts 148 shown in FIGS. 6, 7, and 12 may be provided at each circuit site (i.e. within each individual module location) in the heat sink panels 121, 122. As shown the undercuts 148 may be provided in selected recesses, such as recesses 143-1 and 143-2, and may be dispersed along one or more of the boundary lines of each circuit 115. During encapsulation, molding compound fills the recesses and trenches and their respective undercuts 148. When cured, the hardened molding compound in the undercuts forms a dovetail-like joint securing the heat sinks to the encapsulated PCB 124. When provided at each circuit site, the undercuts secure the heat sinks 101, 102 to the PCB 104 in the individual module 115 providing mechanical integrity after singulation. Referring to the cross-section of a singulated module 115 in FIG. 12, dovetail interfaces 149-2 and 149-1 are shown securing the top and bottom heat sinks 101, 102 to the encapsulated PCB assembly.

Additionally, clearance features may be provided in the heat sink panels to satisfy minimum safety agency clearances between electrical contacts on the PCB 124 and the metal heat sinks 121, 122. As shown in FIGS. 6 and 7, trenches 147 may be provided in heat sink panels 121 and 122 along the side of each module 115 (the long side as shown in FIGS. 6 and 7) where electrical contacts (discussed in more detail below) are exposed in or on the PCB 124. The trenches 147 may also include the undercut features 148 discussed above. For example, cut trench 147 in FIG. 12 results in a recess 150 of the heat sink 101 away from the edge 104E of the PCB 104 after singulation.

D. PCB-Heat Sink Registration

Registration features may be provided in one or both of the heat sink panels 121, 122 helping to correctly position the PCB panel 124 in the cavity 146 relative to the heat sink panels 121, 122 (which is particularly important when the panel is cut during the singulation process) and to correctly position the heat sink panels relative to each other during assembly and during subsequent molding processes. Referring to FIGS. 3 and 4, beveled corners 144 may be provided in heat sink panel 122 to interface with matching indentations 133 which may be provided in PCB panel 124 for registration when assembled together (FIGS. 4 and 5). FIG. 5, which is a top plan view of the PCB panel 124 assembled with the bottom heat sink 122, shows the beveled corners 144 interfacing with the indentations 133.

Figure 4A:
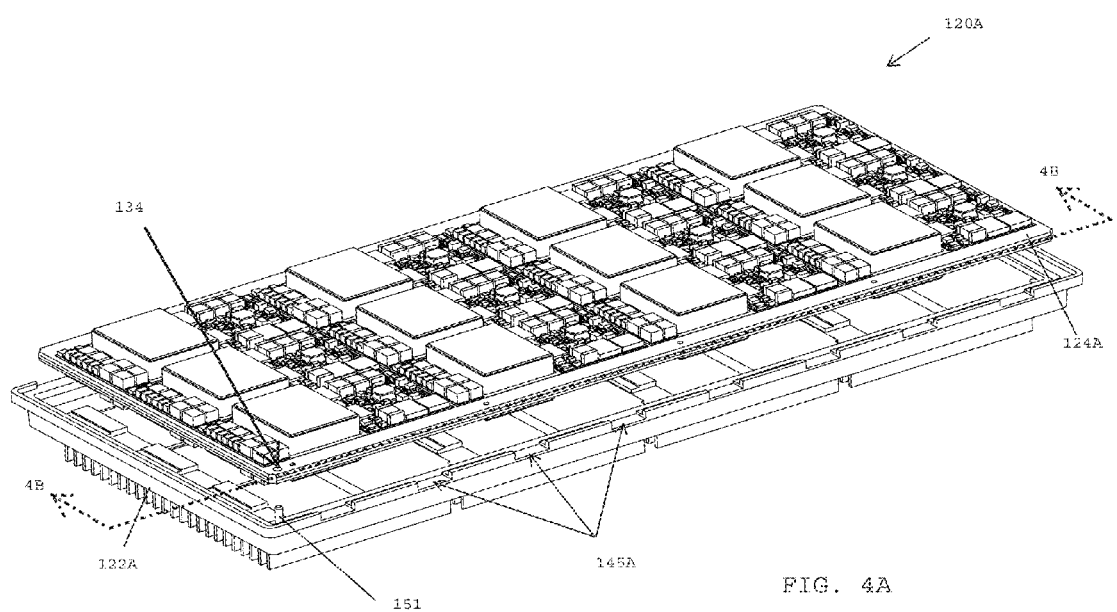
FIG. 4A shows an exploded view of the PCB panel and lower heat sink panel in a modified panel assembly 120.
Figure 4B:
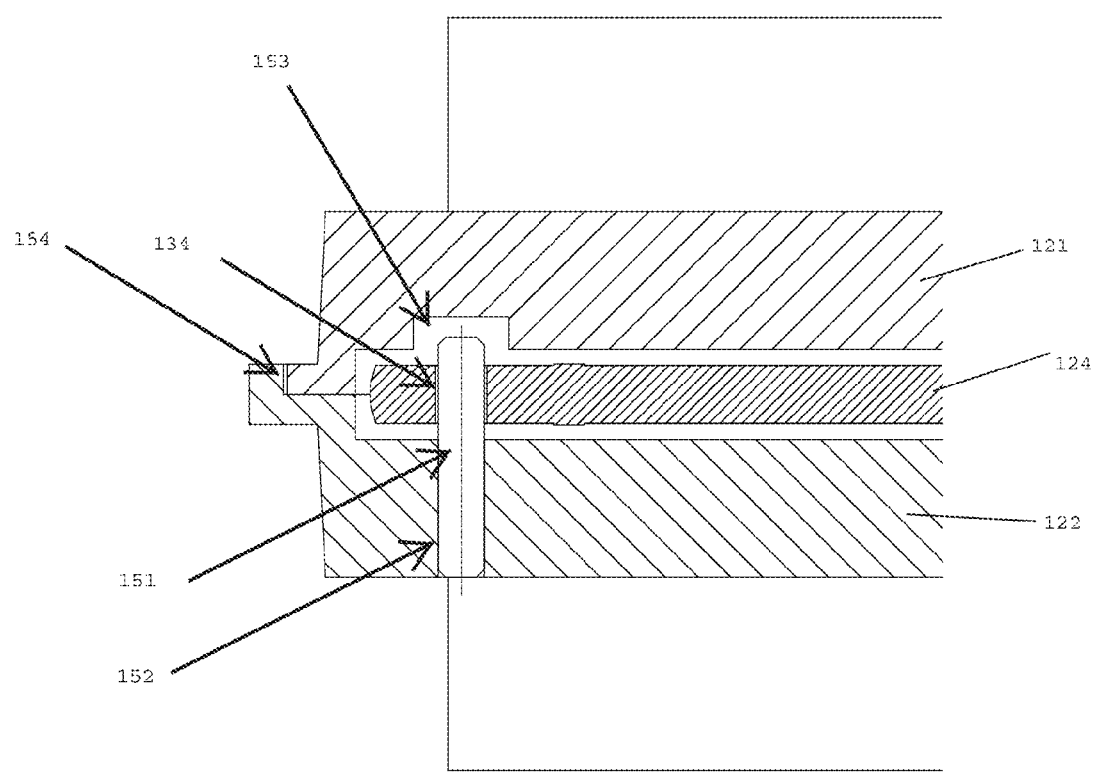
FIG. 4B shows a cross-section of the panel assembly 120A along lines 4B-4B in FIG. 4A.

Referring to FIG. 4A, a modified version of the assembly is shown. As shown, a registration pin 151 is press fit into a registration hole 152 in the lower heat sink panel 122 and a matching registration hole 134 is provided in the PCB panel 124. The completed panel assembly, including the lower heat sink panel 122, PCB panel 124, and upper heat sink panel 121, is shown in FIG. 4B in cross-section taken along the broken lines 4B-4B in FIG. 4A. As shown in FIG. 4B, the registration pin 151, which fits snugly in registration holes 152 and 134, provides registration for the PCB panel 124 relative to the lower heat sink panel 122. An indentation 153 may be provided in the opposite heat sink panel (121) to accommodate protrusion of the pin 151 past the PCB 124. As shown generally at 154 in FIG. 4B, the heat sink panels may include additional features to provide registration between the top and bottom heat sink panels. Although a registration pin is shown at one corner of the panel 122 in FIG. 4A, it will be appreciated that additional pins may be used at other locations. For example, FIG. 4 shows two registration holes 134, one on a corner and another in the middle of the opposite side of the PCB panel 124.

E. Encapsulation

FIG. 6 shows a cross-sectional view (through lines 6-6 in FIG. 5) of the panel 120 through an opening 125 and a conduit 145 in the heat sink panels. The openings 125, which may be slot shaped as shown (FIGS. 2, 3, 4, 5, 9), may be connected to the interior cavity 146 of the panel assembly 120 by conduits 145 for conveying molding compound or venting during the panel molding process. The openings may be formed in one of the heat sink panels, e.g. openings 125 in the top heat sink panel 121 as shown in FIGS. 2, 3, 4, 5, and 9, or in both heat sink panels, e.g. openings 125B in the top and bottom heat sink panels 121, 122 as shown in FIGS. 6 and 7. Referring to FIG. 6, the conduits 145 may be formed by recesses in the interior surfaces of heat sink panels 121 and 122, connecting the openings 125 to the interior cavity 146. The recesses forming the conduit 145 may be situated near the edge 124C of PCB panel 124 to allow the molding compound to flow over both top 124A and bottom 124B surfaces of the PCB 124.

Figure 8:
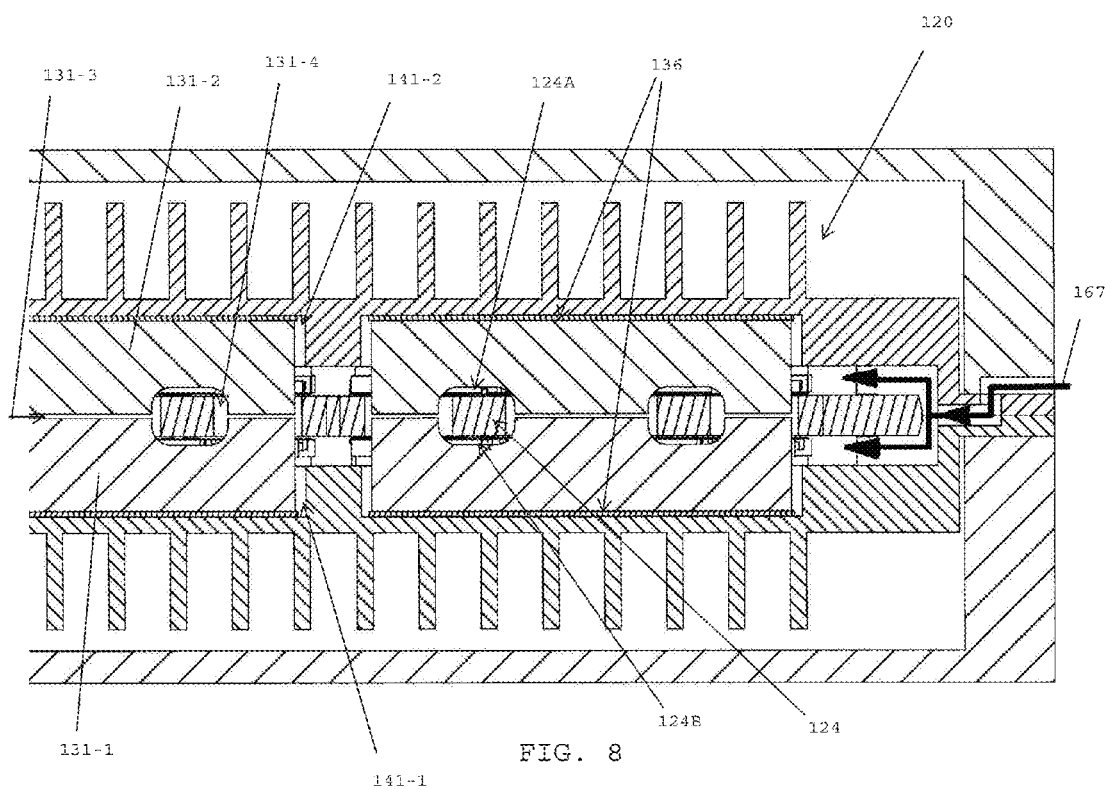
FIG. 8 shows another partial cross section of the panel assembly closed in a mold.

FIG. 7 shows an enlarged cross-section of one end of the panel assembly 120 closed between an upper mold press 161 and lower mold press 162 taken through some of the smaller components, e.g. components 132-1, 132-2, i.e. through lines 6-6 in FIG. 5. A channel 163 may be provided, e.g. between the upper mold press 161 and lower mold press 162 as shown, to interface with openings 125. Molding compound may be forced through the channel 163 under pressure after the panel assembly 120 is closed in the mold presses 161, 162. The dashed line 167 with directional arrows in FIGS. 7 and 8 illustrates the flow of molding compound through the channel 163 into openings 125 through conduits 145 over the top 124A and bottom 124B surfaces of the PCB panel 124 during encapsulation. The molding compound may be forced into the internal cavity 146 to fill all of the unoccupied spaces between the heat sinks 121, 122 and the PCB panel 124.

FIG. 8 shows an enlarged cross-section of one end of the panel assembly 120 closed between an upper mold press 161 and lower mold press 162 taken through the magnetic core structures, i.e. through lines 8-8 in FIG. 5. Each magnetic core 131 is shown having an upper E-core 131-2 and a lower E-core 131-1 separated by a gap 131-3. The cores have openings 131-4 to accommodate windings formed on the PCB 124. As shown, the lower core 131-1 and upper core 131-2 are accommodated by recesses 141-1 and 141-2 in the lower heat sink 122 and upper heat sink 121, respectively. As shown, compliant pads 136 may be provided on the surfaces of the cores 131-1 and 131-2 or in recesses 141-1, 141-2 to accommodate dimensional differences in the components. The compliant pads may be chosen for good thermal conduction and optionally adhesive properties facilitating heat removal from the cores into the heat sink while optionally providing structural integrity to the assembly. Gap Pad A2000 available from the Bergquist Company, 18930 West 78th St, Chanhassen, Minn. 55317 is one example of the type of compliant pad that may be used. Alternatively and perhaps depending upon the tolerances involved, a phase change material may accommodate the dimensional difference during assembly and when cured afterward provide structural integrity between the heat sinks and the cores.

Molding compound may be deposited in one or more of the recesses, e.g. recesses 141-1 or 141-2, in the internal cavity prior to assembly of the PCB panel 124 into one or both of the heat sink panels 121, 122 to ensure that the molding compound fills narrow spaces between the heat sink and the components, e.g. the cores 131-1, 131-2. One or more vent openings (not shown) may be provided in the heat sink panels, preferably at an end opposite the fill openings 125, to allow the molding compound to flow completely through the internal cavity 146. The cavity may be filled with encapsulant either (1) by transfer through one or more conduits, (2) by measured deposition of encapsulant during assembly of the panels, or (3) by both measured deposition during assembly and transfer through conduits.

As shown in FIGS. 4, 5, and 6, the border areas between the modules and around the periphery of the PCB panel 124 may be minimized to avoid wasted PCB material. Because the heat sink panels 121 and 122 close against each other rather than the PCB panel 124, areas on the PCB normally reserved for closing the mold may be eliminated further reducing PCB waste and thus overall cost.

After the panels are assembled together and the interior cavities are filled with molding compound, the panel assembly 120 may be cured, e.g. by elevating the temperature.

F. Singulation

Figure 9A:
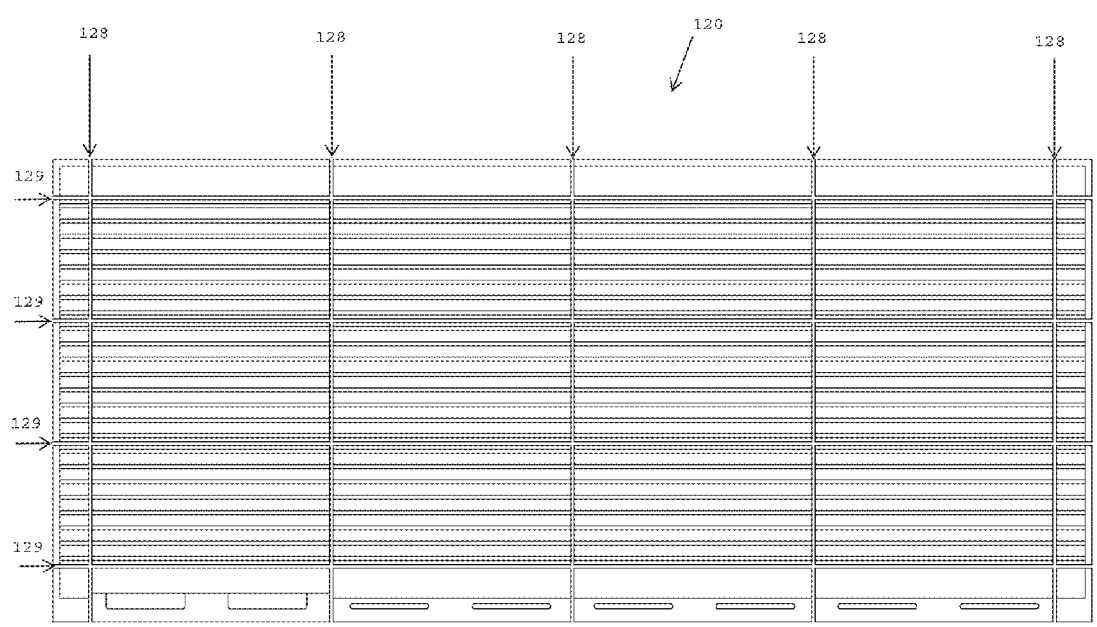
FIG. 9A shows a plan view of the panel assembly 120 following singulation.
Figure 10A:
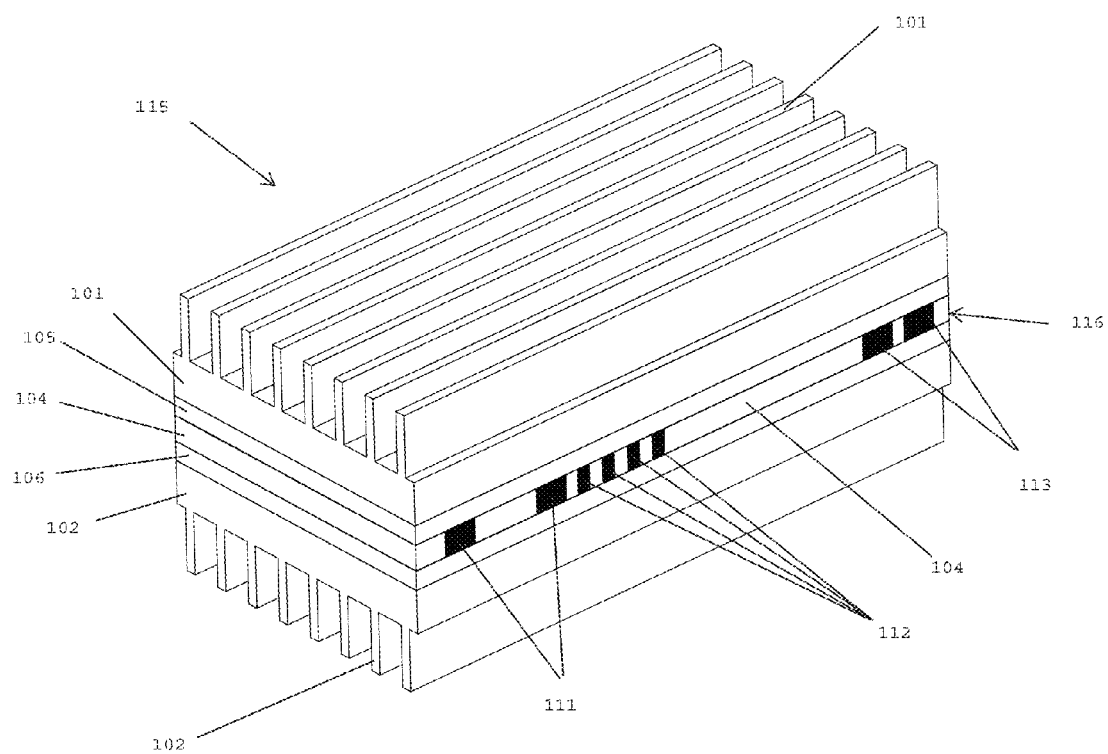
FIGS. 10A, 10B show single modules 115, 115B after singulation.

Singulation is the process by which individual modules, e.g. singulated module 115 in FIG. 10A, are separated from the panel assembly 120, e.g. by cutting. The panel assembly 120 may be singulated after the molding compound is cured. The panel assembly 120 is separated from the upper and lower mold presses 161, 162 and may be cut, e.g. along lines 128, 129 as shown in FIG. 9A, to singulate the modules 115A-115L. For example, a narrow saw may be used to cut through the layers (e.g. as shown in FIGS. 1, 10A, 10B, 12) of panel 120, which may include heat sink 101, cured molding compound 105, PCB 104, cured molding compound 106, and heat sink panel 102. For example, a 0.025 inch thick saw such as model number EAD-3350 available from Disco Corp., Ota-ku, Tokyo, Japan may be used. Referring to the cross-sectional views of FIGS. 6 and 7, dashed lines 129 illustrate the lines along which the panel 120 may be cut to singulate modules 115D, 115E, and 115F. As shown, the cuts 129 (along the long side of the individual modules 115) go through the middle of the trenches 147. The trenches 147 may be made wide enough and the cuts 129 may be made at an appropriate distance from the edges of the trench 147 to ensure that a minimum thickness of cured molding compound remains in the trench after singulation to be mechanically robust. The trenches 147 may also be used to reduce the thickness of metal through which the saw must cut during singulation, e.g. by optionally providing trenches along the perimeter of each module.

G. Electrical Connections

Interconnection features may be embedded in the PCB panel 124, preferably along the boundaries of the individual circuits, so that electrical contacts are at least in part formed by or exposed during singulation. To maximize the area on a PCB panel 124 available for circuitry, the interconnection features may preferably be buried in the PCB panel 124 below the top and bottom surface layers. For example, the interconnection features may be formed in the inner conductive layers but not occupying valuable area on the surface conductive layers, potentially reducing setback and other spacing requirements. The interconnect features therefore are preferably formed in the PCB panel 124 before the panel 120 is assembled and exposed when the panels are cut, e.g. during singulation. The interconnection features may comprise a pattern of conductive layers or buried vias (frequently used to form connections between internal conductive layers) or both in the PCB situated along the circuit boundary, i.e. lying in the cut line, e.g. cut line 129 (FIG. 9A).

Figure 11:
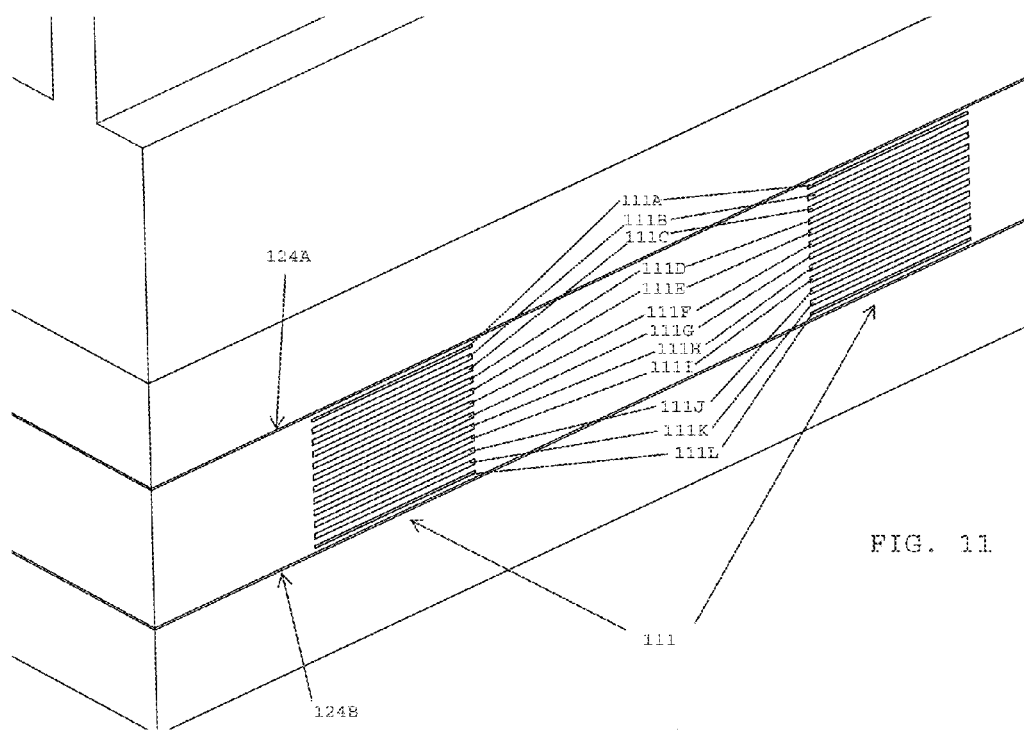
FIG. 11 shows an enlarged portion of the module 115 revealing details of exposed buried-embedded interconnects.

Referring to FIG. 10A, a module 115 is shown after singulation. Exposed interconnects 111, 112, and 113 are shown embedded in the edge of the PCB 104 along one of the edges 116 of the module 115. As shown in FIG. 10A, longer connections 111 and 113 provide greater interconnect surface area and higher current carrying capacity, making them amenable for use as power connections, than shorter connections 112 which have less interconnect area and lower current carrying capacity, making them useful for control signal connections. FIG. 11 shows an enlarged view of a portion of the module 115 along edge 116 revealing detail of the two interconnections 111 after singulation. The width along the boundary and number of the conductive features arranged vertically through the PCB layers may be adjusted to provide the requisite contact area for each connection. In the example of FIG. 11, conductive features, e.g. conductive lands 111A through 111L, formed along the cut line on a plurality of the conductive layers of the PCB form a stack of conductive strips resembling a bar code after singulation. The stack of conductive lands may provide more contact area than possible with a single buried via. In FIG. 11, each interconnect 111 is made up of twelve lands, each land being formed on a respective one of twelve inner conductive layers. Note that FIG. 11 shows the twelve lands (111A through 111L) buried below the top 124A and bottom 124B surfaces of the PCB, i.e. not occupying surface area on those layers. During singulation, the saw cuts through the buried embedded lands, exposing the edges of the remaining conductive material forming the interconnects 111A through 111L shown in FIG. 11. Note that the buried embedded lands may be shared between two adjacent modules 115 on the panel 120, e.g. where the PCB patterns are laid out in mirror image to each other, allowing the modules to be laid out on the PCB panel close to a singulation cut width apart. Also, the interconnect features may be aligned along a single module boundary as shown or may occupy two or more boundaries of each individual module in the panel. The exposed edges may then be used to form electrical connections immediately after singulation, i.e. before the cut interconnects oxidize or may be protected against oxidation, e.g. with a conformal coating, such as an organic solderability preservative ("OSP"), applied after singulation, to ensure subsequent ability to form electrical connections to the edges. For example, Entek Plus HT available from Enthone, Inc., a Division of Cookson Electronics, West Haven, Conn. 06516 may be used as an OSP to protect the interconnects.

The number of lands, i.e. conductive layers, used to form each interconnect may be increased for better electrical connections or reduced for less critical connections. Although embedded conductive lands are shown in the example of FIGS. 10A, 11, additional or alternative conductive features may be used to form the interconnects. For example, buried conductive vias located along the cut line may be used, either alone or in combination with the lands. The buried vias may be located so that the singulation cut leaves the walls of the conductive vias exposed resulting in vertical conductive strips, i.e. generally perpendicular to the PCB top and bottom surfaces 124A, 124B, in the PCB edge. Buried conductive vias may tend to fill with adhesive during fabrication of the PCB panel 124. Empty conductive vias, i.e. free of non-conductive adhesives, may be preferable for the resulting concave conductive features, i.e. embedded conductive half cylinders. Similarly, solid buried conductive vias or conductive vias filled with conductive material during the PCB manufacturing process may be preferable for the resulting continuous flat conductive surface.

In the alternative to buried conductive features, conductive through-holes, which are generally free of adhesives following fabrication of the PCB panel 124 may be used along the cut line to form interconnects extending through the thickness of the PCB from top surface to bottom surface providing generally half-cylindrical interconnects. A penalty of using through-holes for the interconnects is the loss of surface area on the top and bottom of the PCB which may otherwise be used for setback or other safety and agency approval requirements. Preferably, the through-holes may be filled, for example with a conductive material such as solder or silver paste, or conductive pins may be inserted into through holes and soldered to the through holes, to prevent molding compound from filling the through hole during the encapsulation process and to provide a greater contact surface area yielding generally flat conductive interconnects following singulation.

The exposed interconnect features, e.g. 111A through 111L may be used to make a variety of electrical connections. For example, the exposed interconnects may be solder plated and then subsequently soldered to a motherboard, e.g. using surface mount soldering techniques. The interconnects may be soldered to a connector, such as connector 103 shown in FIGS. 1, 13, 14. Alternatively, a lead frame or PCB may be soldered to the exposed interconnects 111, 112, 113 of the module quickly after singulation. Yet another alternative includes a precious metal such as gold or silver or other suitable conductive material deposited to the exposed contacts, e.g. by plating, to build up the contacts into a larger area, e.g. continuous conductive contacts, well suited to connectorized modules described in more detail below.

In the example shown in FIG. 11, the module 115 has interconnections 111 along the edge 116 in which each interconnection 111 includes conductive features, e.g., conductive lands 111A through 111L, formed along a cut line on a plurality of the conductive layers of the printed circuit board to form a stack of conductive strips resembling a bar code after singulation. As used herein, a bar code or bar code terminal is a set of one or more conductive features embedded in an edge of a PCB or other substrate that together form an electrical terminal for establishing a connection to the PCB or substrate. For example, two bar codes 111, are shown in the close-up of FIG. 11. As shown, each bar code 111 includes a set of twelve conductive features, exposed conductive lands 111A-111L, which together form a single terminal of the module. In FIG. 10A, eight bar code terminals are shown formed in the edge 116 of PCB 104 providing a total of two power input (bar codes 113), two power output (bar codes 111), and four signal (bar codes 112) connections for the module 115.

Figure 45:
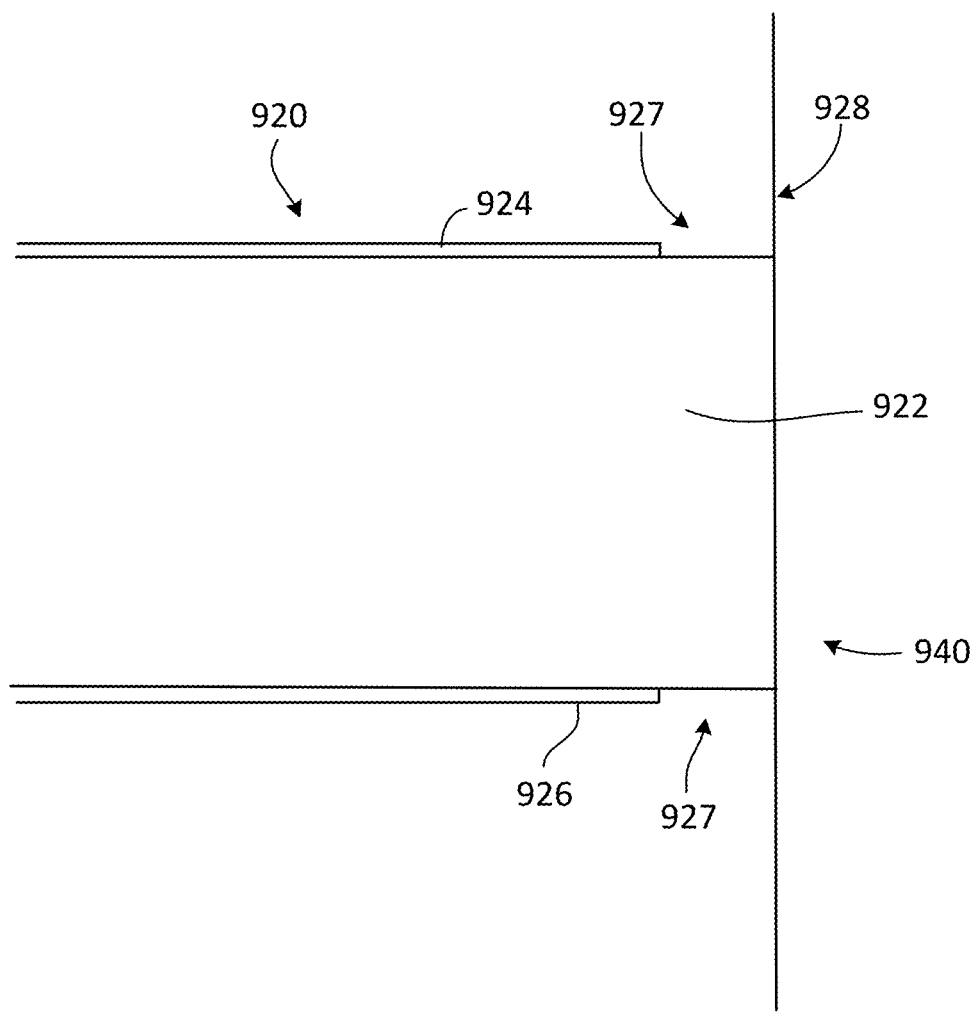
FIG. 45 shows a side view of a PCB panel.

As described above, each conductive layer embedded in the PCB panel may be patterned to ensure that a portion of it extends to the edge (e.g., edge 116 in FIG. 10A) at first locations, i.e., in the regions (e.g., regions 111, 112, 113 in FIG. 10A) in which the bar code terminals will be formed, e.g., where it is intended to form a portion of the exposed interconnect and be used to form an electrical connection to an external terminal; and to ensure that no portion of the conductive layer extends near the edge at second locations where only insulative material is desired, e.g., in areas free of electrical connections such as between the terminals (e.g., between regions 111, 112, and 113 in FIG. 10A). Such setback requirements may be established to ensure that internal conductors do not inadvertently become exposed after the panels are singulated or after further processing, allowing for manufacturing tolerances, e.g., maintaining a minimum distance, L, from the edges. For example, referring to FIG. 45, a portion of a PCB 920, e.g., internal to a panel molded and singulated module 940, is shown having a top 924 conductive layer and a bottom 926 conductive layer, both of which are set back from the edge 928 (which is representative of the edge of the encapsulated module 940 after singulation) by a respective setback distance 927 to avoid exposure during module singulation and other manufacturing processes.

In some implementations, it may be desirable to remove portions of the insulation material around the conductive features making up a bar code, e.g., between and/or around the conductive lands (which may be PCB layers or other suitable conductive features) of a bar code or other embedded terminal to further increase the surface area of the conductive features, e.g., for creating more robust electromechanical connections. For example the insulative material between or around the exposed conductive features may be removed, e.g., by etching, to expose additional surface areas of the portions of the conductive layers or conductive features at the first locations. The setback distance, L, discussed above may be chosen, with a suitable margin for safety, to be greater than the depth of etching of the insulative material to prevent inadvertent exposure of unwanted portions of the conductive layers.

Figure 46:
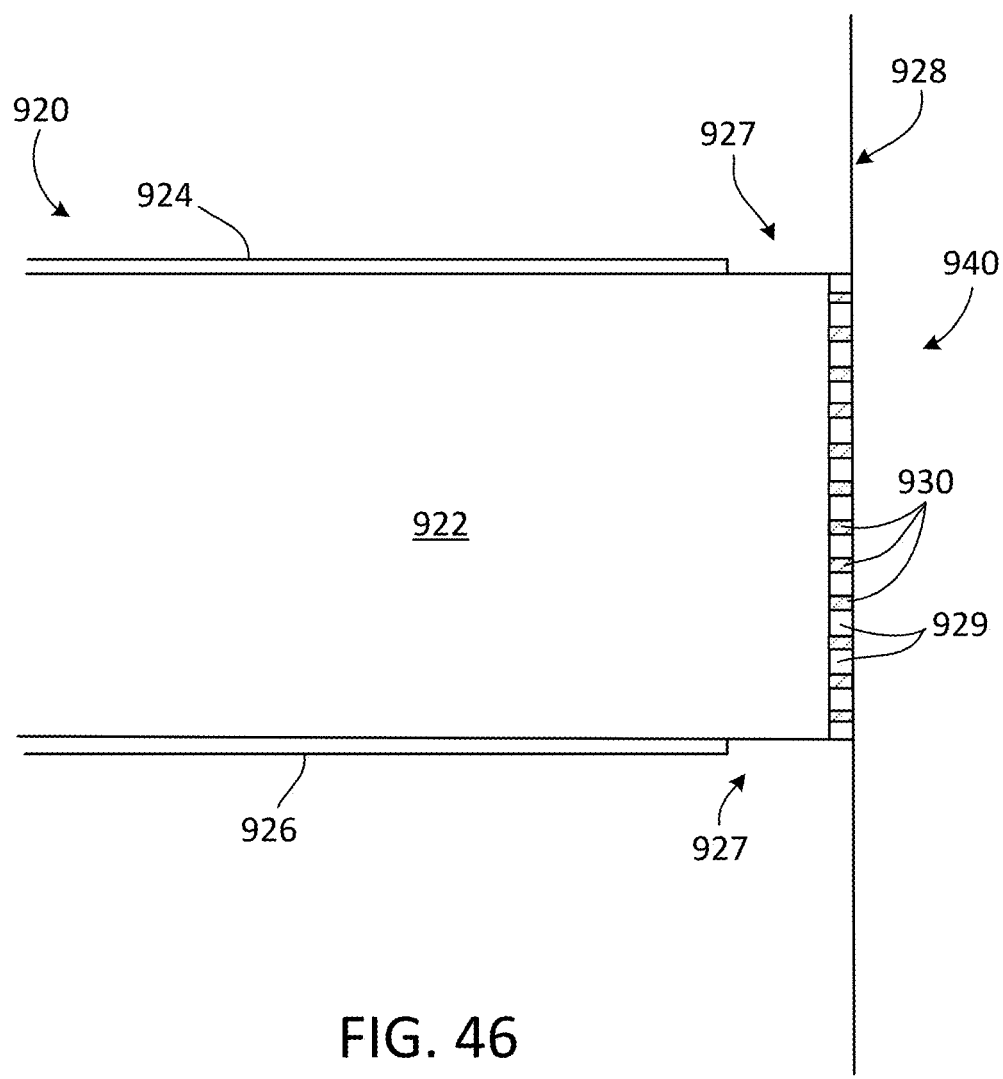
FIG. 46 shows a side view of the PCB panel of FIG. 45 with exposed edge connectors.

As shown in FIG. 46 the insulation material 922 adjacent to one or more conductive layers at the edge 928 of the PCB 920 may be selectively removed to form recesses 929 adjacent to the conductive features 930, exposing additional surface area of the exposed conductive features, e.g., along lateral portions of the conductive layers in the recesses 929. The exposed portions 930 of the conductive layers may be referred to as exposed conductive features or 3D conductive features. A three-dimensional (3D) conductive feature or terminal, as used herein refers to a conductive feature (such as an exposed conductive layer 930 in FIG. 46) protruding from an edge of, or a recess in, a PCB or other substrate, e.g., having a contact surface area occupying more than two dimensions. Like the bar code terminals discussed above, the set of exposed conductive features 930 also appear as a bar code terminal but with an additional depth dimension. Note that in the example of FIGS. 45 and 46, the ends of the exposed conductive features 930 remain flush with the edge 928 of the module 940. In some examples, the etching of the insulation material 922 is selective so that only the insulation material 922 around the conductive features 930 is etched. A three-dimensional (3D) bar code or 3D bar code terminal, as used herein is a set of 3D conductive features (such as exposed conductive layers 930 in FIG. 46) protruding from an edge of, or a recess in, a PCB or other substrate that together form an electrical terminal for establishing a connection to the PCB or substrate.

To make 3D bar codes from the conductive layers of a PCB as described above, the recesses in the PCB insulation should be formed using a process that selectively removes portions of the insulation layer without compromising other portions of the PCB or module. One method may employ a plasma etching process using for example, a Magna PCB Etching System, available from Plasma Etch, Inc., Carson City, Nev., and/or etching equipment from other manufactures, such as Nordson March, Westlake, Ohio and PVA Tepla America, Corona, Calif. Such etching equipment previously has been used in the PCB manufacturing industry for de-smear and etch back processing In some implementations, surfaces of the module 940, including other portions of the PCB 920, that are not to be etched, may be masked for protection before the plasma etch is performed. Edges that have the existing sawn 2D bar codes on them may be left exposed so the edges will be etched. For the edge 928 that has the conductive features 930, portions of the edge 928 that have the conductive features 930 may be left exposed, while portions of the edge 928 that do not have the conductive features 930 may be masked. This way, at the edge 928, portions of the insulation material 922 surrounding the conductive features 930 will be etched, while portions of the insulation material 922 away from the conductive features 930 will remain intact. Methods of protecting the PCB panel 920 can include aluminum tooling, polymer based tooling, metalized tape systems, or other materials resistant to plasma etching.

In some implementations, the etching process is performed under a vacuum of, e.g., approximately 100 mTorr. The Magna system may use an $O_2$ gas while other systems may use a mixture of $CF_4$ and $O_2$ gases. Using the Plasma Etch Magna System, parts are loaded into the system, oxygen gas is pumped into the system, the parts are presented into a uniform plasma etching energy area, and the plasma gas is used to etch back the PCB laminate. Spacing between the laminate layers such as 2 mils or 3 mils is controlled by the PCB design. The plasma breaks down the resin on the exposed edge. The duration of exposures determines the distance or depth of the etching process. For example, on a 3 mil copper layer to layer spacing, an etch into the laminate of 2.5 to 3.2 mils may be provided. For example, etch time may be in a range from 60 to 90 minutes. The plasma does not significantly affect the dimensions of the exposed copper, and in fact the effect on the dimensions may not be immediately measurable.

Alternative methods of removing the insulation may include the use of a laser system with controlled focus to excavate or remove laminate between the conductive features. The incident angle of the laser beam with respect to the work piece may be varied off the perpendicular, and may be selected to etch the insulation without concern for shadowing by the conductive layers. For example the incident angle may be set for plus and minus 45 degrees from the large planar surface of the conductive layers in the PCB to allow consistent etching of the insulation between the conductive layers. Alternatively, the incident angle of the laser may be varied continuously over a range, or may be moved to predetermined set points during the etching process. The laser beam may be moved in various patterns, e.g., a raster, across the surface to achieve uniform excavation.

After etching, a media blasting system may be used to remove any remnants of the etched insulation and also clean the exposed surfaces of the conductive features. For example, a system such as a Cold Jet I3 MICROCLEAN, available from Cold Jet New Zealand Ltd, Auckland, New Zealand, can be used to clean out the ash and remaining fiberglass fibers in the etched recesses generated between the exposed conductive features, e.g., between the conductive layers forming the 3D bar code. Dry ice $CO_2$ can be used as the blast media to remove the ash and fibers in the etch areas between the conductive layers. The particles need to be able to fit in the spaces generated between the conductive layers so the laminate residue is cleanly and evenly removed. The system may also remove any oxide present on the surfaces of the conductive layer. Dry ice is advantageous for its low residue forming quality, but other mechanical media blast particulates can also be used as alternatives. Alternatively, a fine bristle brush can be used to remove the laminate residue.

The 3D bar codes produced by the above described methods have exposed conductive surfaces that are solderable and may be protected after the etch, or etch and ablation, process with a solder coating by a tinning or wave solder process, or using an organic solder preservative, or electroless nickel-immersion gold (ENIG), or application of other suitable coatings. Solder paste may be applied with some force to fill the recesses and then re-flowed. Alternatively, the exposed conductive features may be wetted with solder.

G1. Vertical Mount Connector

Figure 13:
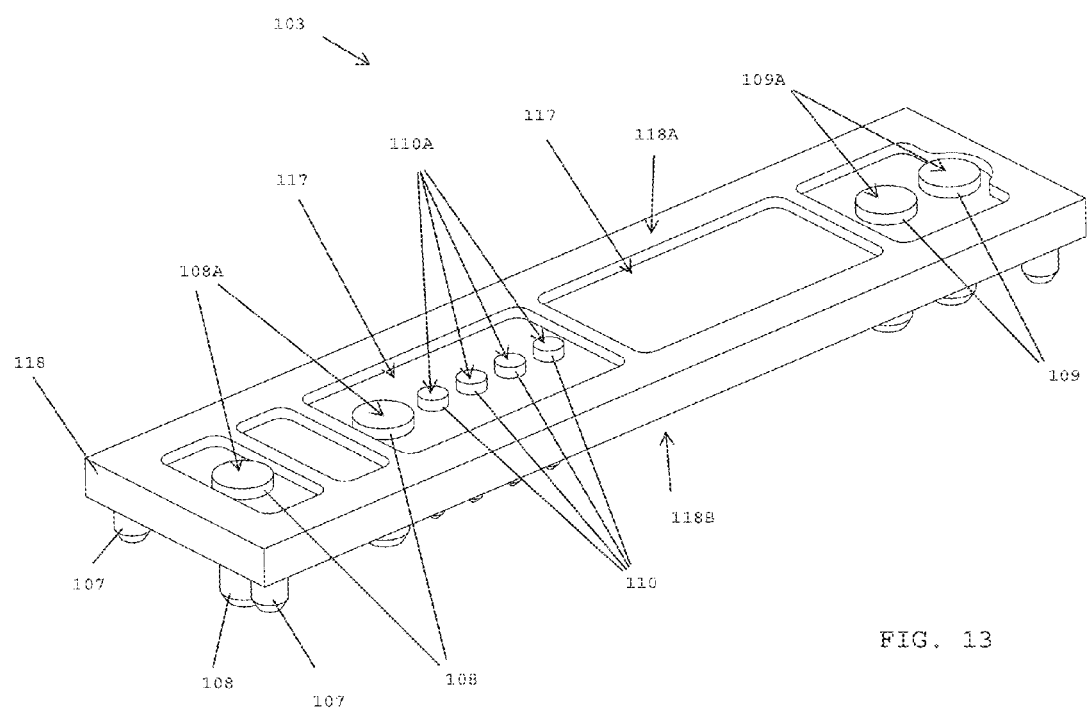
FIG. 13 shows a connector assembly.
Figure 14:
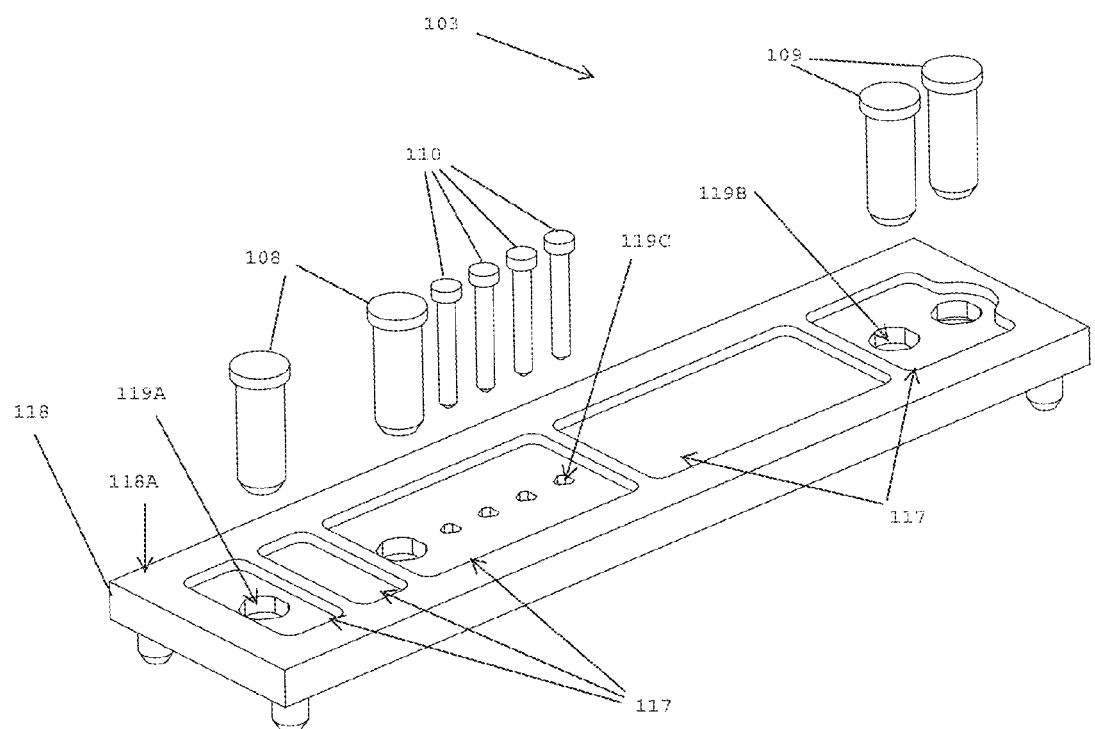
FIG. 14 shows an exploded view of the connector assembly.

Referring to FIGS. 1, 13 and 14, a connector 103 suitable for attachment to the edge 116 of the module 115 is shown having a connector body 118 with a plurality of recesses 117 and a plurality of holes 119A, 119B, and 119C. A plurality of connector pins 108, 109, 110 may be inserted into holes 119A, 119B, 119C, respectively, from the top 118A. As shown, the holes may be contoured to provide a pressure fit having a gripping force suitable for retaining the pins. The broad top surfaces 108A, 109A, 110A of the pins are suitable for making solder connections to the exposed interconnects 111, 113, 112, respectively on the edge 116 of the PCB 104 of module 115. As shown, the recesses 117 provide countersinking for the top portions of the pins allowing the connector body to mount flush to the edge 116 of module 115 and allowing space for a solder joint between the pin and the respective interconnect. The interconnection features may preferably be provided along a long edge of the module 115 yielding a more stable vertical mount module 100 such as shown in FIG. 1. However, the interconnection features may be deployed along any or all of the edges of the module 115 for different mounting configurations as discussed more fully below.

G2. Horizontal Through-Hole Mount

Figure 15:
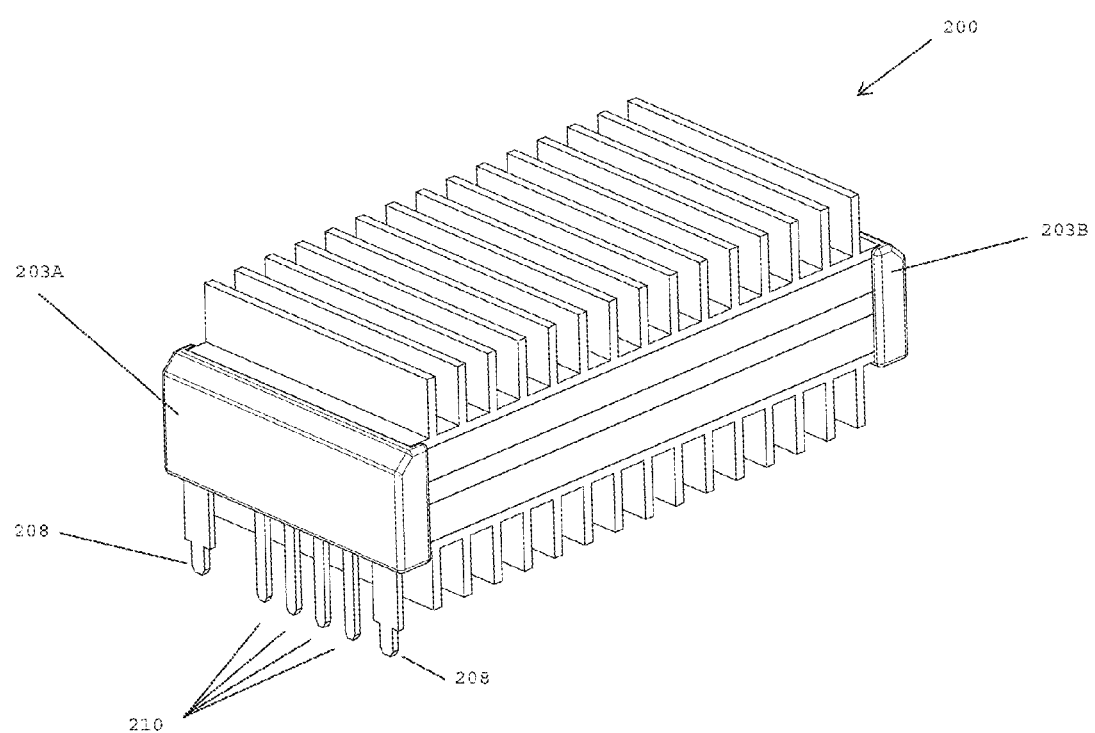
FIG. 15 shows a horizontal through-hole mount module 200.
Figure 16:
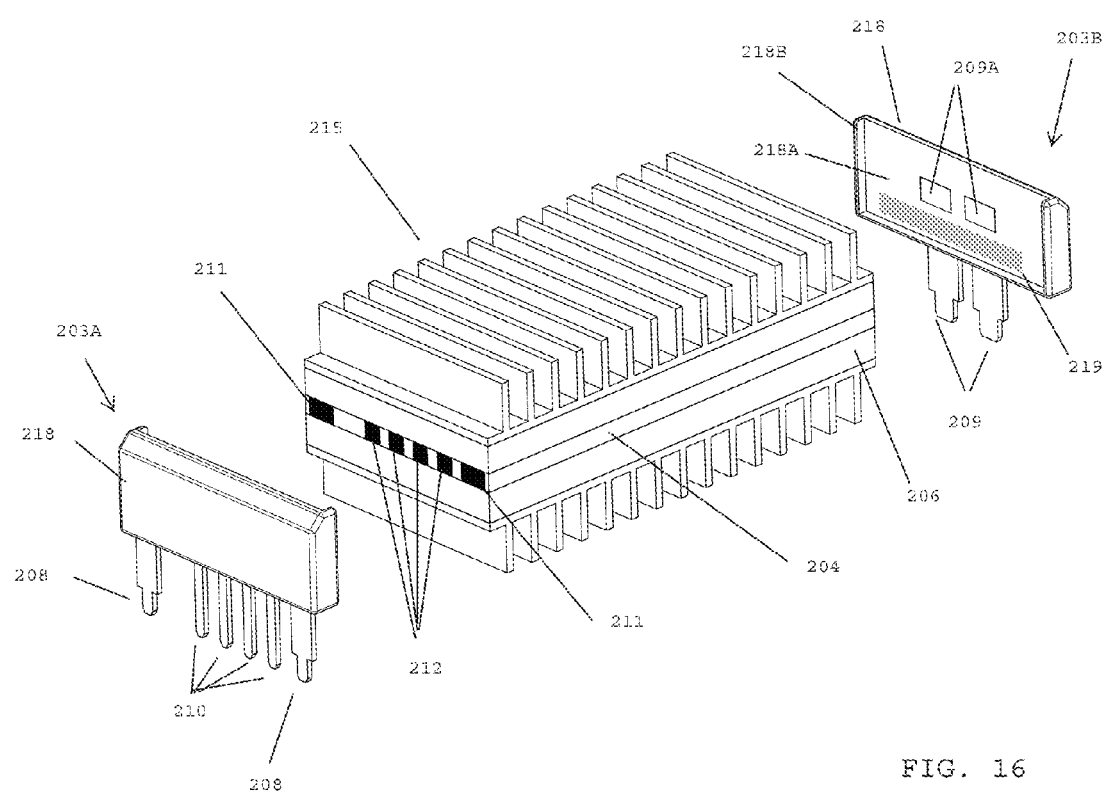
FIG. 16 shows an exploded view of the through-hole mount module 200.

Referring to FIGS. 15 and 16, a horizontal mount component 200 suitable for through hole mounting in a motherboard is shown including a singulated module 215 and through-hole adapters 203A, 203B. The horizontal mount module 200 may be constructed in the same manner as described above for the module 100, except that the interconnects are preferably disposed along two edges of the module PCB and connectors adapted for horizontal mounting may be used. As shown in FIG. 16, the interconnects are disposed along the two shorter edges of the PCB 204 in module 215. However, the longer edges may be used instead of, or in addition to, the shorter edges for the interconnects. Although only one set of the interconnects 211, 212 is visible in the perspective view of FIG. 16, it will be understood that a second set, including two additional power interconnects, is disposed along the opposite hidden edge of the PCB.

Through-hole adapters 203A and 203B, suitable for attachment to the edges of the singulated module 215 are shown having adapter bodies 218 supporting conductive terminals 208, 210 and 209, respectively. A portion of each terminal may be exposed on an internal surface via an opening in the adapter body optionally providing a small recess. In FIG. 16 for example, adapter 203B is shown having two power terminals 209, each having an exposed areas 209A recessed in openings in surface 218A of the adapter body 218. The exposed areas 209A align with their respective interconnects when the adapters 203A, 203B are assembled onto the module 215. The recesses provide countersinking for the exposed terminals allowing the internal surface 218A of the adapter body 218 to mount flush to the edge of module 215 and allowing space for a solder joint between the terminal and the respective interconnect. The adapter body 218 may include a flange 218B which may form a pressure fit with the adjacent edges of the modules 25. Additional features may be provided for maintaining the structural integrity of the module and connectors.

As shown in FIG. 16, epoxy may be deposited along an internal edge of the connector body, e.g. in the shaded area 219 preferably aligned with the encapsulant layer 206 to secure the adapters 203A, 203B to the module 215. The horizontal mount module 200 may be readily adapted to match industry standard brick footprints for power converters, in particular the module 200 may fit within the standard ⅛$^{th}$ brick footprint.

G3. Horizontal Surface-Mount

Figure 18:
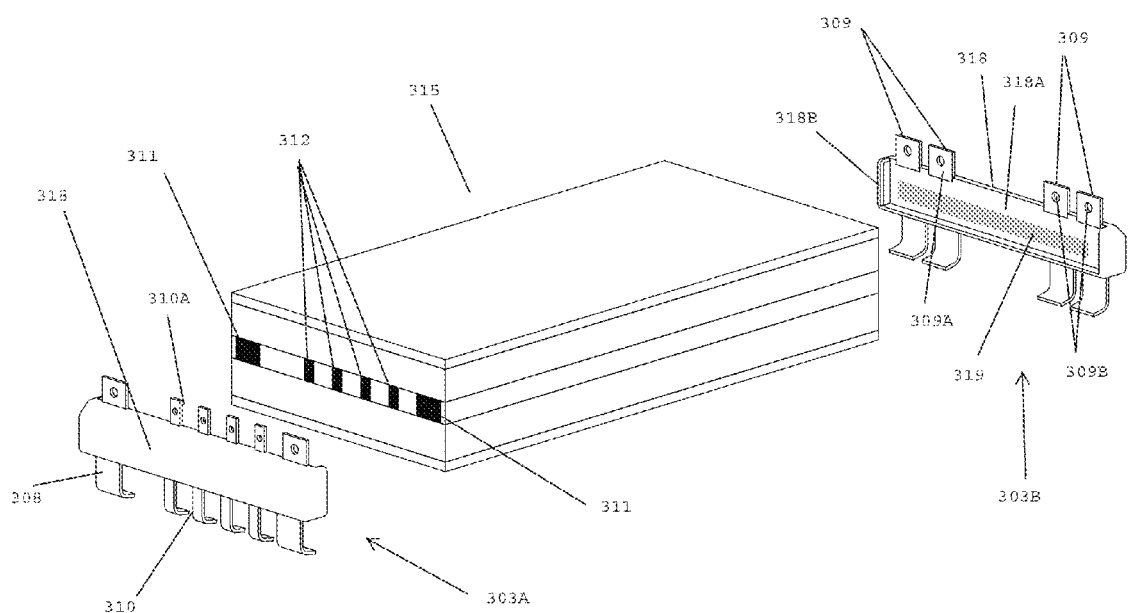
FIG. 18 shows an exploded view of the surface-mount module 300.

Referring to FIGS. 17 and 18, a horizontal-mount component 300 suitable for surface-mount soldering to a motherboard is shown including a singulated module 315 and surface-mount adapters 303A and 303B. The horizontal-mount module 300 may be constructed in the same manner as described above for the module 200 (FIGS. 15, 16) substituting surface mount adapters 303A, 303B for through-hole adapters 203A, 203B. As shown in FIG. 17, the singulated module 315 may have flat heat sinks 301, 302 instead of the finned heat sinks (shown in FIGS. 1-4, 6-12, 15-16). Although shown disposed along the two shorter edges in FIGS. 17 and 18, the interconnects may be deployed along the longer edges of the PCB 304 in the singulated module 315 instead of, or in addition to, the longer edges.

In FIGS. 17 and 18, the surface-mount adapters are shown with smaller bodies 318 than the through-hole adapters (218: FIG. 15, 16) exposing the connections between the terminals and their respective interconnects during assembly and for post assembly inspection. The terminals 308, 309, 310 each may include a portion, e.g. solder pads 308A, 310A, 309A, adapted for connection, such as a solder joint, to a respective interconnect on the module, e.g. interconnect 311, 312, and 313 (not visible in FIGS. 17 and 18). Holes 308B, 309B, 310B may be provided in solder pads 308A, 309A, 310A for better solder joints. Each terminal 308, 309, 310 may include a bend (e.g. 308C) to produce a surface-mount pad (e.g. 308D) for attachment, e.g. by surface-mount soldering, to a customer motherboard.

The adapter bodies 318 may include flanges 318B, preferably along two or more sides to form a pressure fit with the adjacent edges of the modules 315. Additional features may be provided for maintaining the structural integrity of the module and adapters. As shown in FIG. 18, epoxy may be deposited along an internal edge of the connector body, e.g. in the shaded area 319 preferably aligned with the encapsulant layer 306 to secure the adapters 303A, 303B to the module 315.

G4. Surface-Mount Lead Frame

Figure 19:
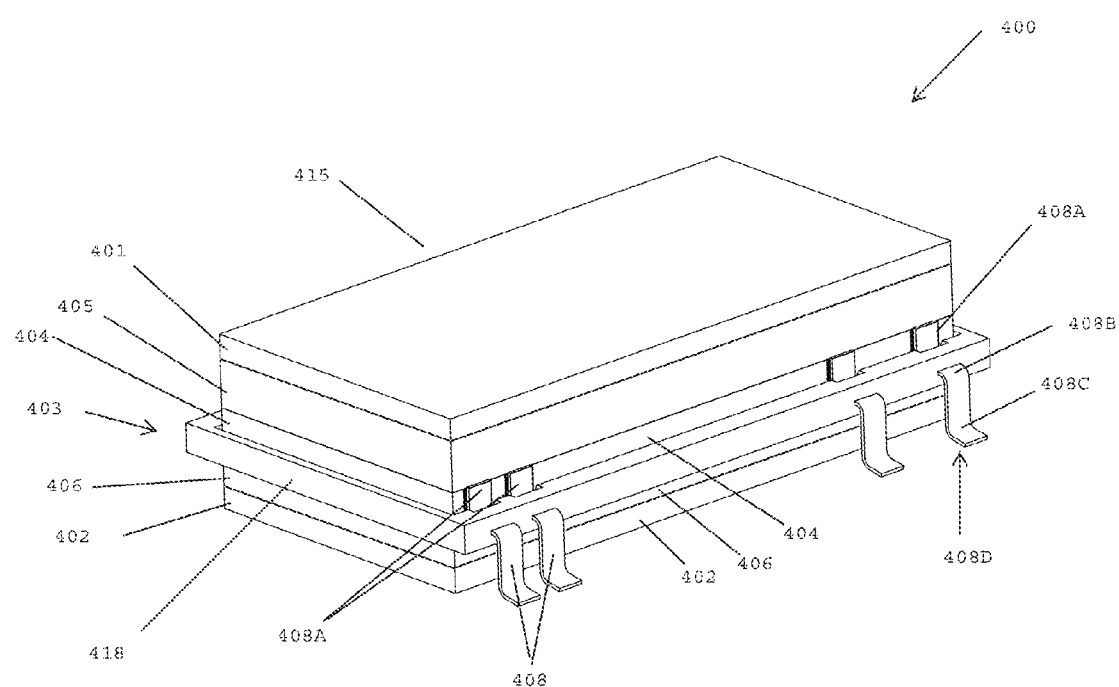
FIG. 19 shows an alternative horizontal surface-mount module 400.
Figure 20:
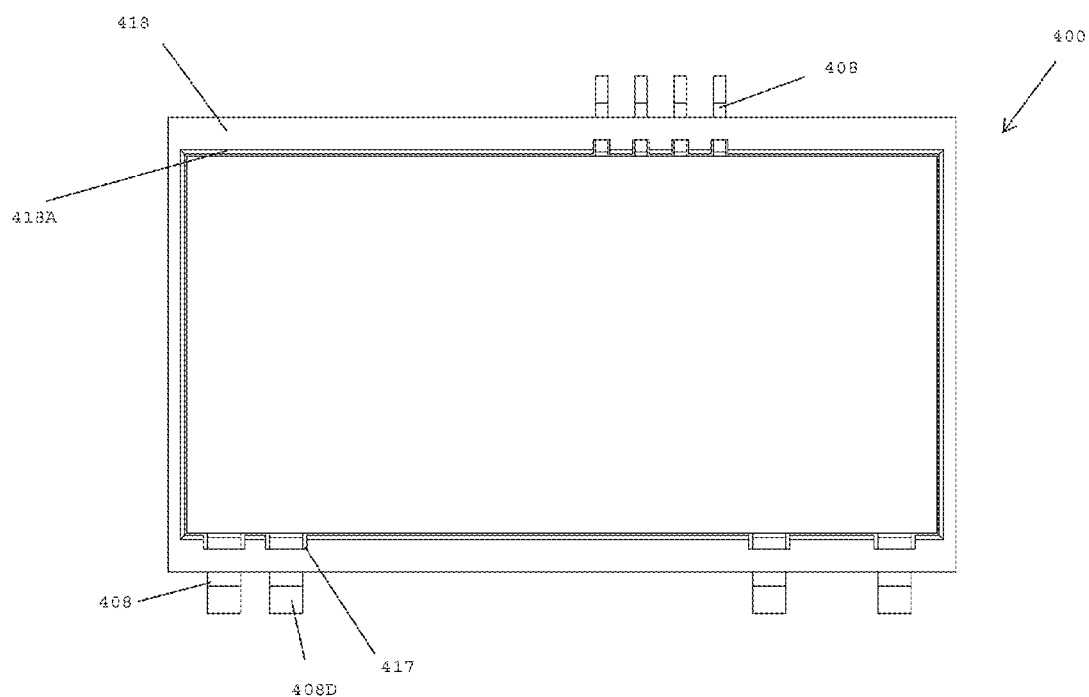
FIG. 20 shows a top view of the surface-mount module 400.

An alternate embodiment of a horizontal-mount component 400 suitable for surface-mount soldering to a motherboard is shown in FIGS. 19 and 20 including a singulated module 415. The horizontal-mount module 400 may be constructed in the same manner as described above for the module 300 (FIGS. 17, 18) substituting lead frame adapter 403 for the surface-mount adapters 303A, 303B. Like module 315 (FIG. 17), the singulated module 415 may have flat heat sinks 301, 302 instead of the finned heat sinks of the previous examples. However, in the example of FIGS. 19 and 20, the interconnects are shown deployed along the longer sides of the singulated module 415. However, as noted above the interconnects may be deployed along any edges of the PCB 404 as desired in the singulated module 415.

The surface-mount adapter is shown in FIGS. 19 and 20 having a unitary rectangular frame-like body 418 supporting a plurality of terminals 408. The profile of the frame body 418 may as shown leave a portion of the terminals exposed for making connections to their respective interconnects during assembly and for post assembly inspection. The terminals 408 each may include a portion, e.g. solder pad 408A, adapted for connection, such as a solder joint, to a respective interconnect on the module (not visible in FIGS. 19, 20). Although shown without holes in FIG. 19, the solder pads may optionally include holes such as those shown in FIGS. 17 and 18. Each terminal 408 may include a bend (e.g. 408C) to produce a surface-mount pad (e.g. 408D) for attachment, e.g. by surface-mount soldering, to a customer motherboard.

The opening in the frame body 418 may be sized to accommodate the perimeter edges of the singulated module 415 and optionally form a pressure fit. The frame body 418 may include recesses 417 for accommodating the terminals 408, allowing the interior surface 418A of the frame body 418 to rest flush against the module 415 surface. Additional features may be provided for maintaining the structural integrity of the module and adapters. Gaps may be provided in the interior surface 418A to allow the application of epoxy to secure the frame body 418 to the module 415.

G5. Connectorized Module

Figure 21:
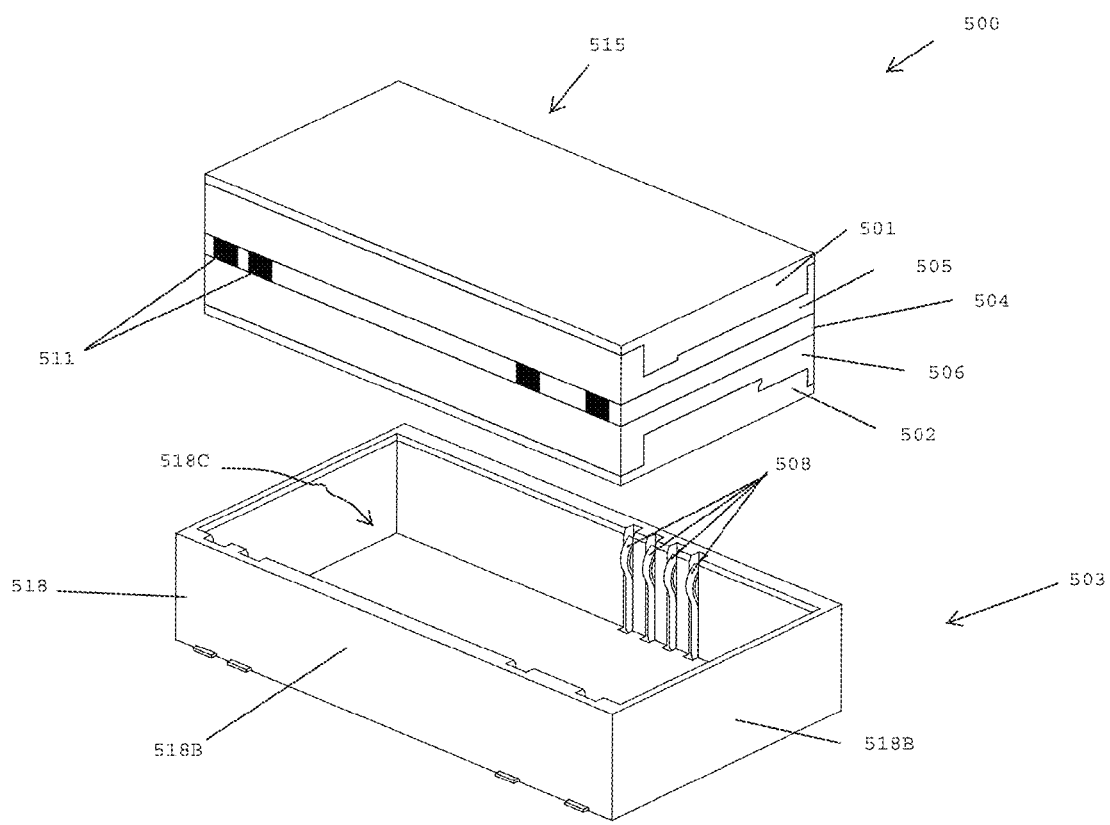
FIG. 21 shows an exploded top view of module-connector set 500.
Figure 22:
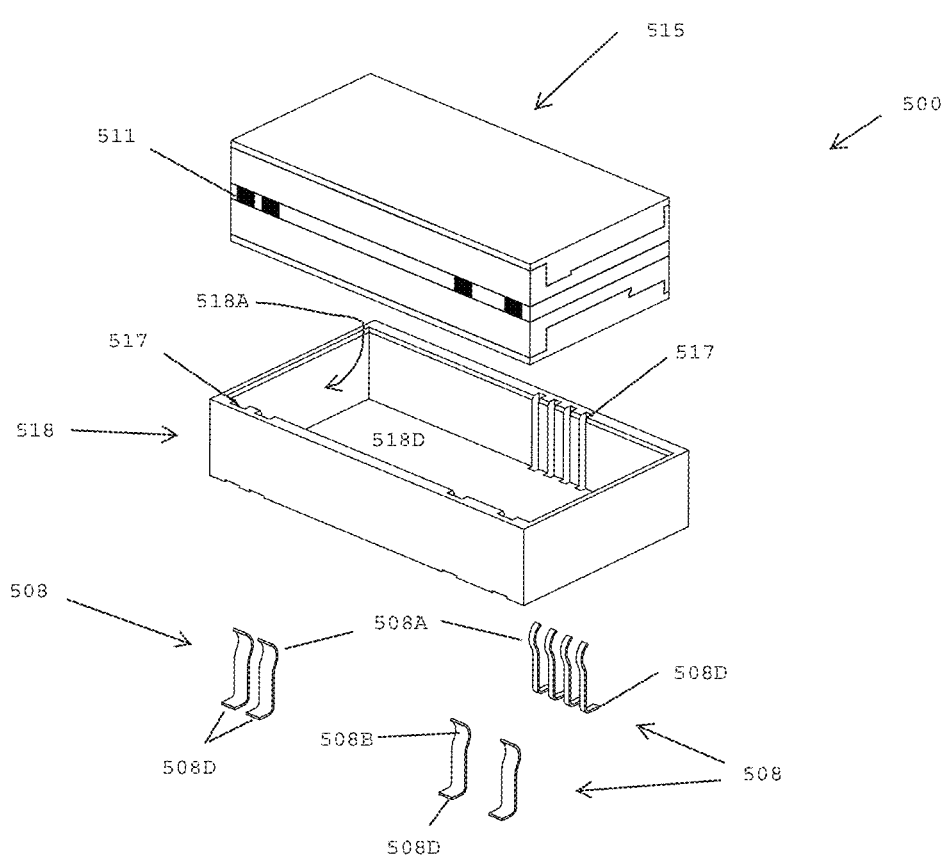
FIG. 22 shows an exploded view of the connector set 503.

The modules 100, 200, 300, and 400 discussed above in connection with FIGS. 1, and 15-20 are all examples in which connectors or adapters are mechanically and electrically connected to the interconnects on the singulated modules forming an integral modular component. Yet another option is to adapt the module to be removably mated with a connector that may be mounted on a customer circuit board. For example, the module interconnects may be plated up with an appropriate conductive material, such as silver or gold, to form contacts that may be reliably engaged with connector contacts, i.e. "connectorized." Referring to FIGS. 21 and 22, a module-connector set 500 is shown including a connectorized module 515 in exploded view with a mating connector 503 into which the module 515 may be removably inserted.

The connector 503 as shown includes a body 518 having side walls 518B creating an opening 518C adapted to receive the connectorized module 515. Terminals 508 formed, e.g. bends 508B (FIG. 22), to provide a pressure fit between a contact area 508A of each terminal 508 and a respective interconnect 511. The terminals as shown may be retained in recesses 517 in the interior surface 518A of the side walls 518B. The recesses 517 may provide support to keep the terminals 508 in place and allow the interior surfaces to engage the surfaces of the module 515. The terminals 508 may include a flat portion 508D (FIGS. 22, 23) adapted for making a solder connection to surface contacts on a customer circuit board (not shown). The connector body may include a bottom surface 518D enhancing the structural integrity of the connector walls 518B which are subjected to the forces exerted by the terminals

Figure 23:
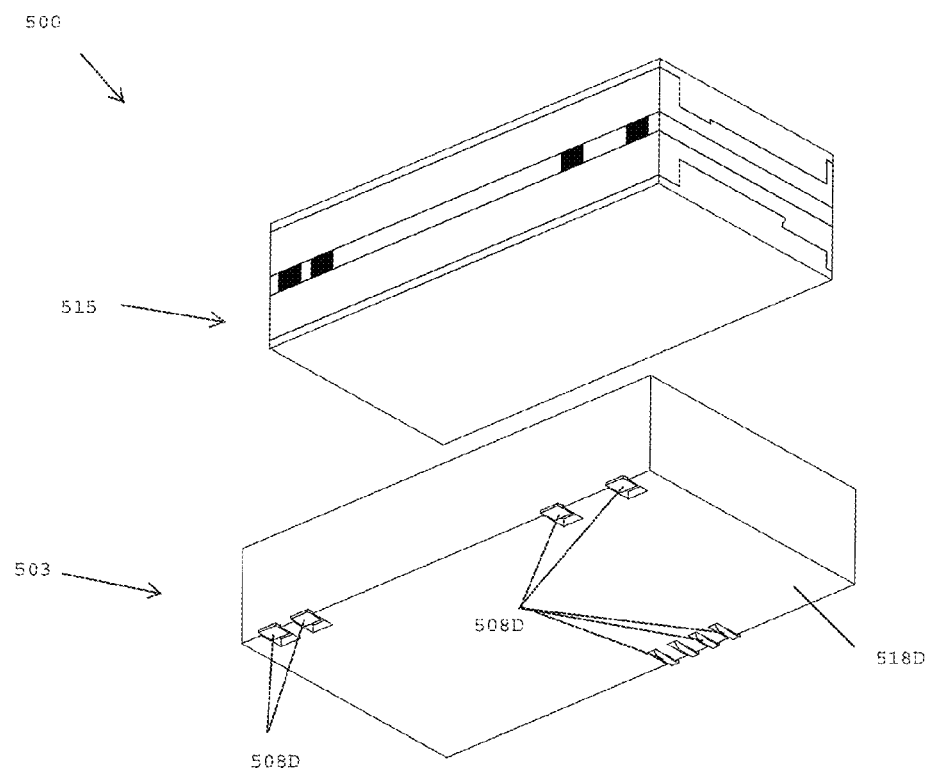
FIG. 23 shows an exploded bottom view of module-connector set 500.
Figure 24:
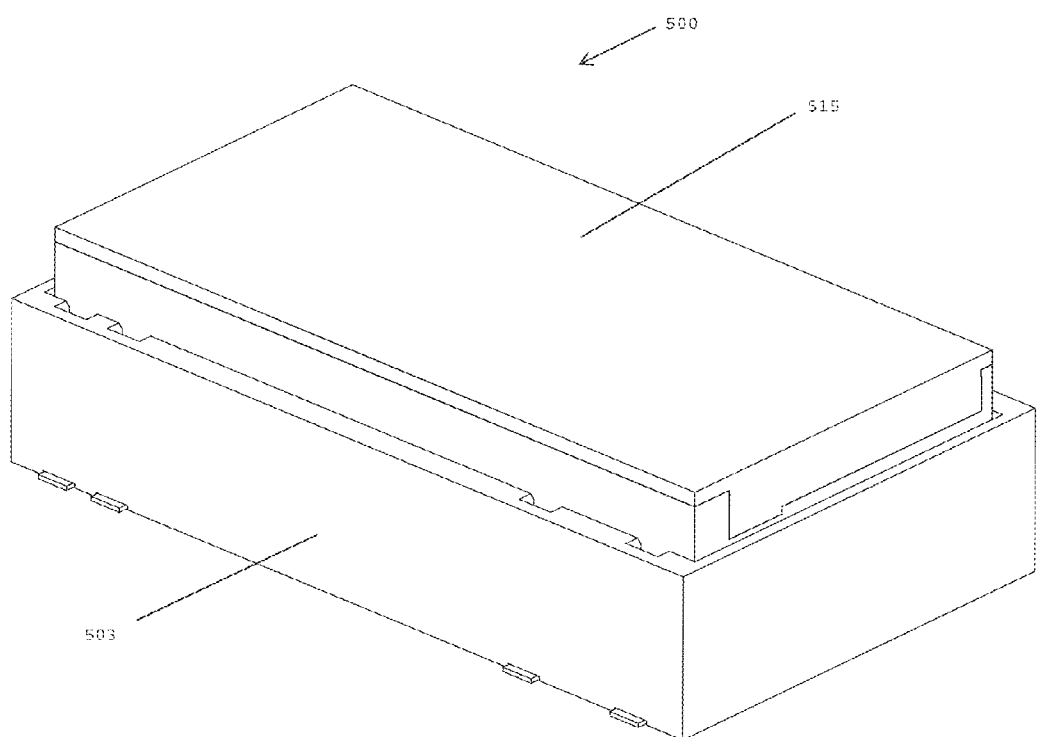
FIG. 24 shows an isometric view of the module-connector set 500 assembled.

508 against the interconnects 511. The bottom 518D may include openings as shown in FIG. 23 through which the terminals may be inserted during assembly of the connector 503. The bottom 518D may provide electrical insulation between the metal heat sink 502 and the customer circuit board (not shown) on which the connector 503 may be mounted. Alternatively, the bottom may be partially or completely removed to allow better conduction of heat from the module 515 out through the customer circuit board. Yet another alternative is to use a thermally conductive material in the bottom 518D of the connector 503. FIG. 24 shows the connectorized module 515 inserted into the connector 503.

As shown, the connector terminals 508 exert inward pressure from opposing ends of the module, however, the contacts may be arranged along a single side of the module with the connector body providing the necessary resistive force for the pressure fit. Although the connectorized module is shown having plated interconnects 511 forming contacts for engagement with the connector terminals, it should be appreciated by those of skill in the art that many variations are possible. For example, adapters of the type illustrated in connection with FIGS. 15-20 may be used to provide contacts for a hybrid connectorized module allowing other orientations of the module relative to the connector and to the customer circuit board.

G6. Flush Mount

Figure 26:
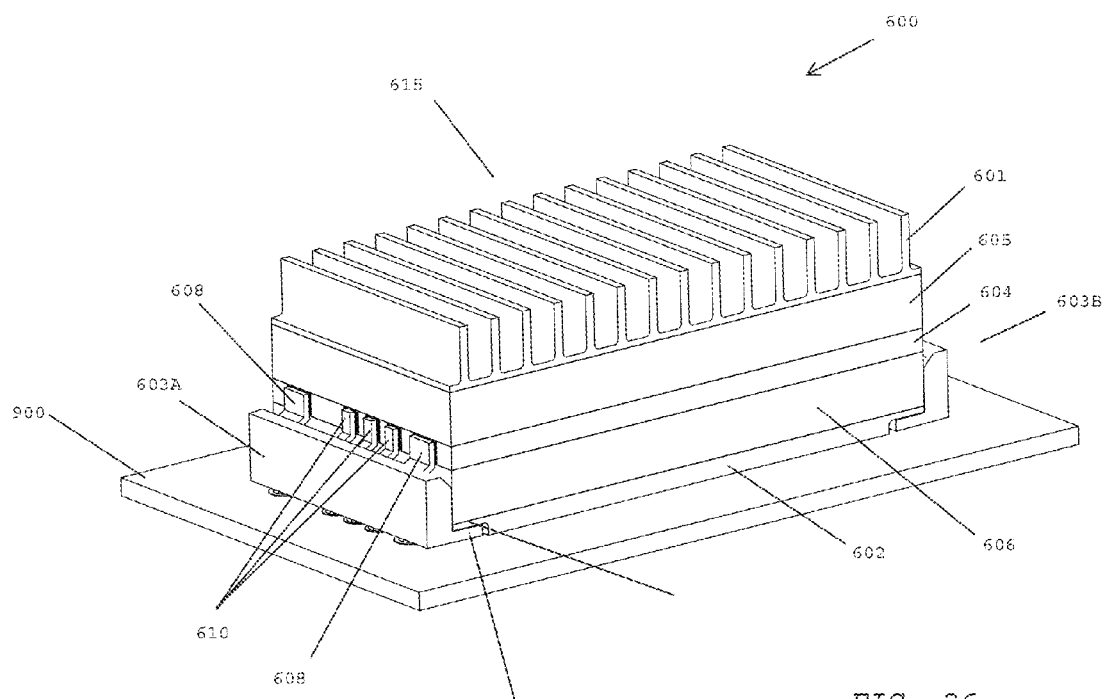
FIG. 26 shows the horizontal through-hole flush-mount module 600 assembled onto a customer PCB.

A flush-mount technique may be used with the horizontal PCB-mounting techniques discussed above in connection with FIGS. 15-24 to allow the bottom heat sink to come into contact with the customer PCB, e.g. for heat removal. As shown in FIGS. 25 and 26, a through-hole mount module 600 is shown adapted for flush-mounting to a customer PCB 900. The module 600 as shown includes two through-hole adapters 603A, 603B attached to the singulated module 615. The singulated module 615 may, as shown, have a finned top heat sink 601 and a generally flat bottom heat sink 602 for flush mounting against the PCB 900. Similar to the adapters discussed above in connections with FIGS. 16-20, through-hole adapters 603A, 603B have terminals, 608, 609, 610 which include features, such as solder pad 608A, adapted to be attached, e.g. by solder, to respective interconnects on the module 615. The terminals 608, 609, 610 may be adapted to be soldered into through holes 908, 909, 910, respectively, in the customer PCB 900. As shown in FIGS. 25 and 26, the generally flat heat sink 602 may include recesses 602B to accommodate flanges 618B of the adapter bodies 618 allowing most of the surface of heat sink 602 to rest flush against the surface of the PCB 900. Epoxy or other adhesive may be used in the recess to secure the adapter body to the module. The recesses may be an integral feature of the heat sink panel or may be added at an appropriate point during the manufacturing process, preferably before singulation.

A thermally conductive material 901, e.g. thermal adhesive, may be applied between the PCB 900 and the module heat sink 602 to facilitate removal of heat through the PCB 900. Additionally, the PCB surface may include thermally conductive features to conduct heat away from the module 615. For some applications particularly involving smaller module sizes, it may be desirable to solder the bottom heat sink 602 to one or more pads on the PCB 900, in which case the heat sink may include a solderable finish, applied for example by plating. Threaded holes may be provided, preferably in the flush mount heat sink panel, allowing the module to be secured using screws to a customer board or cold plate. The flush-mount modification may allow taller heat sink fins to be used on the top of the module without increasing the module profile above the customer PCB which may provide better thermal management in some environments. Additionally, the flush-mount may provide a more robust shock and vibration resistant mechanical solution.

Figure 25A:
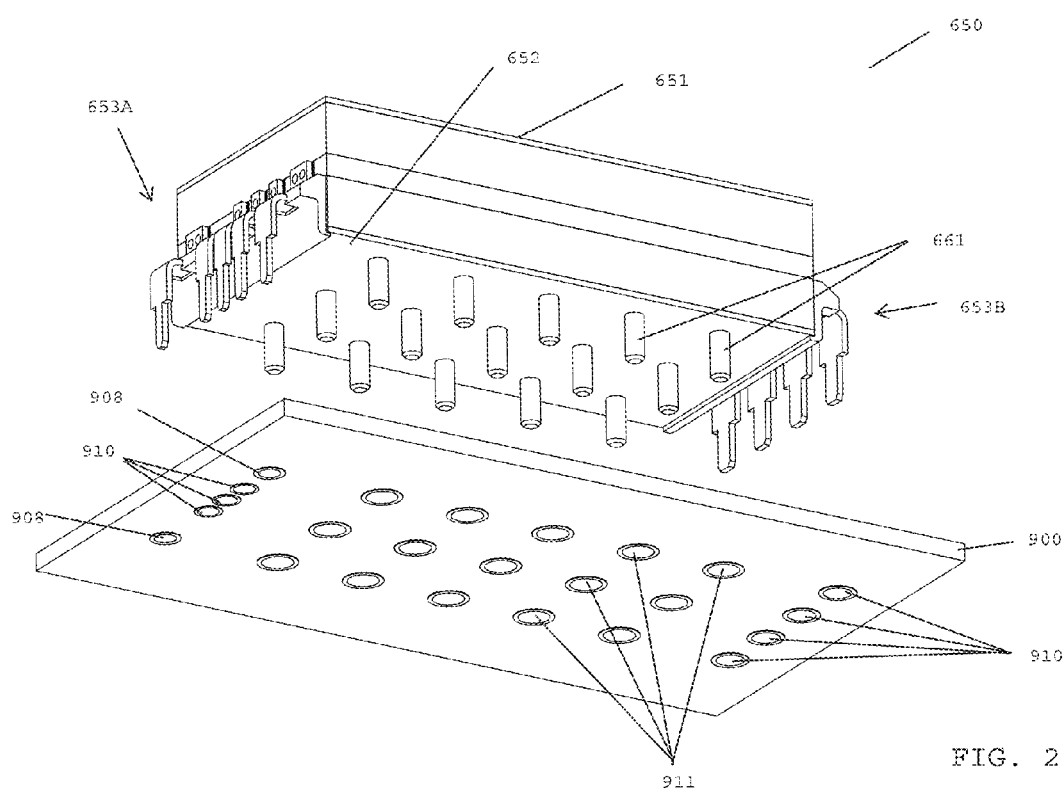
FIG. 25A shows an alternative horizontal through-hole flush-mount module 650 exploded from a customer PCB.

Another flush mount module 650 may include a plurality of pins 661 protruding from the bottom heat sink 652 for engagement in through holes 911 in the customer mother board 900 as shown in FIG. 25A. Similar to the flush mount module 600 of FIGS. 25 and 26, the flush mount module 650 may include adapters 653A and 653B adapted for making electrical connections with through holes on the customer mother board 900. Instead of fins, the top heat sink 651 may include a flat surface to create a low-profile package as shown in FIG. 25A. The pins 661 may be formed as an integral part of the bottom heat sink panel instead of fins. Alternatively, blind holes may be provided in the heat sink panel into which the pins may be press fit at any suitable stage of the fabrication process. The pins 661 may be used to electrically connect the bottom heat sink 652 to the customer board, e.g. to ground, conduct heat out of the module into the customer board 900, and provide mechanical support. The through holes 908, 909, 910, 911 in the customer board may be sized to provide clearance between the hole and the respective pin to compensate for any dimensional variations. The pins 661 may optionally protrude beyond the bottom surface of the customer board 900 into forced air along the bottom surface of the board for additional heat removal. Additionally, a heat sink component (not shown) may be fitted onto the protruding pins to help dissipate heat.

H. Heat Sink Setback

Figure 9B:
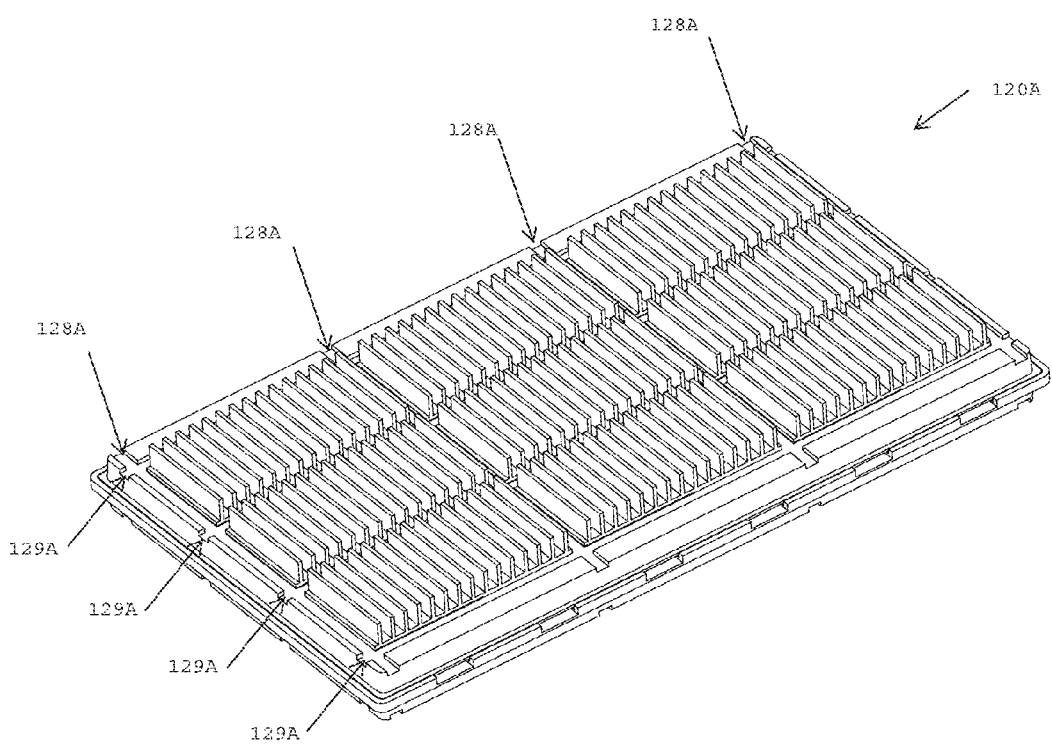
FIGS. 9B, 9C show optional channels formed in the panel before singulation.
Figure 9C:
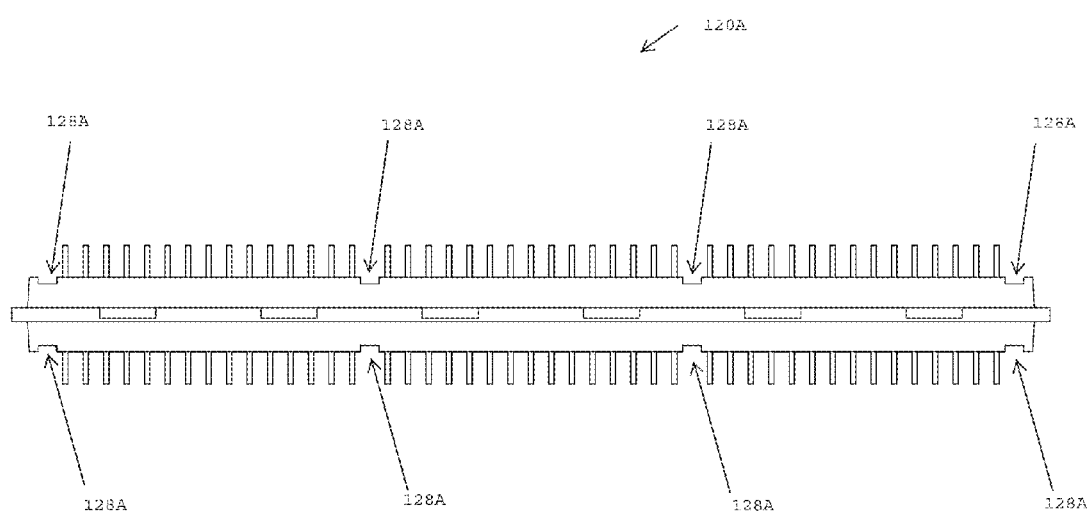
Figure 10B:
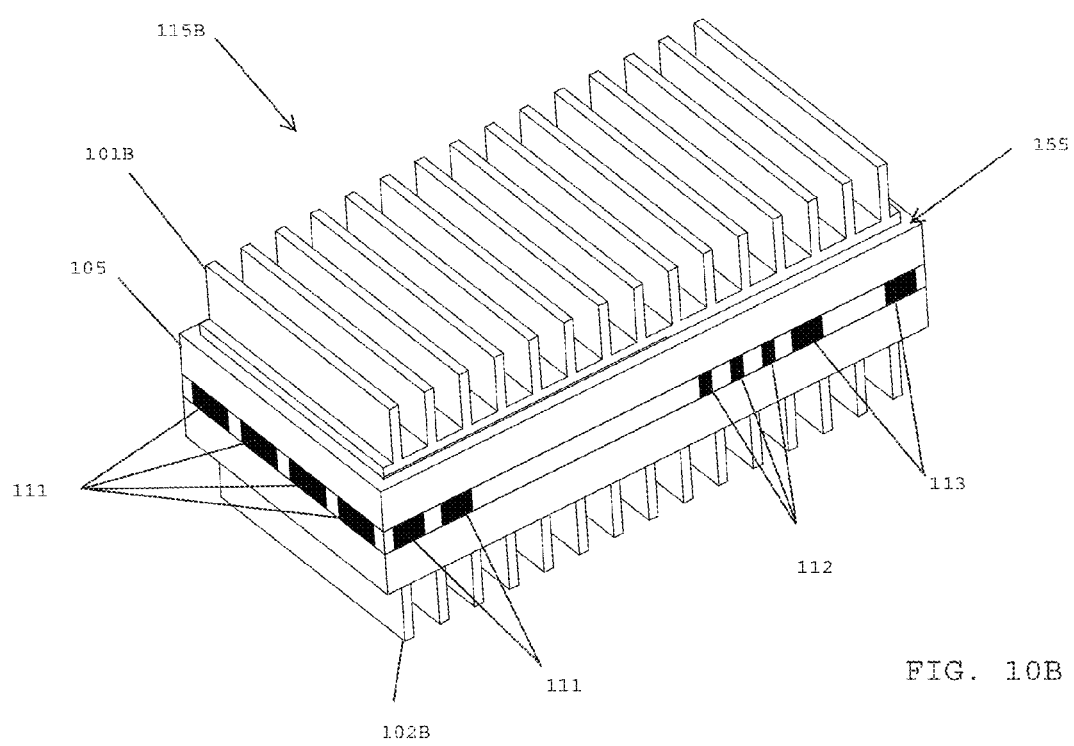

As internal components are reduced in height, e.g. reducing the thickness of the magnetic core, the depth of the interior cavity may be decreased bringing the heat sink panels closer together, reducing the encapsulant thickness and the resulting module thickness. However, reduction of the encapsulant thickness has the potentially undesirable effect of reducing the spacing between the electrical interconnects and the edges of the heat sink panels in the finished module. When desirable, e.g. to satisfy safety agency requirements, the separation between the exposed interconnects, e.g. interconnects 111, 112, 113, and the edge of the heat sink, e.g. heat sink 101B, may be increased using a setback, e.g. setback 155, between the edges of the heat sink panels and the edges of the module 115B as shown in FIG. 10B. The setback 155 may be created by making wide cuts through the heat sink panels 121, 122 along the singulation lines prior to singulation. The wide cuts preferably extend through the heat sink material, e.g. aluminum, and partially into the encapsulation material to form channels 128A and 129A in the panel assembly 120A as shown in FIGS. 9B and 9C. If machined while the assembly is still hot from the encapsulation process, the channels 128A and 129A may be used to divide the heat sink panels into singulated module dimensions reducing stresses due to differential contraction between the heat sink and the encapsulant due to differences in thermal coefficients of expansion while the panel assembly cools. Stresses on the narrow saw may also be reduced by eliminating the heat sink metal through which the saw must cut during singulation as a result of the channels 128A, 129A.

I. Process Efficiencies

Using interconnection features that may be exposed during singulation allows the PCB panel 124, containing a plurality of modules, to be molded as a single unit. Providing embedded interconnects along the perimeter of the circuit that occupy little or no PCB surface area help reduce wasted PCB area that would otherwise be cut away, allowing close to full utilization of the PCB for product which may save on cost. Encapsulating the PCB panel with the heat sink panels simplifies the structural aspects of the modules. Using interior contours in the heat sink to match component heights helps reduce the amount of molding compound required for encapsulation. Furthermore, controlling the distance between the magnetic cores and the internal surface of the heat sink can be used as an alternative to and eliminating the complications of the exposed core molding process described in the Exposed Core Application.

Furthermore, using the mold panels to form the mold cavity for encapsulating the PCB panel helps free the molding equipment from product specific requirements that may otherwise require customized molds, allowing a single piece of molding equipment to be used for a wide variety of product mixes. The finished products, e.g. modules 115 made using a standard panel size, may have diverse dimensions not only in the lateral (length and width) directions, but also in the vertical (thickness) direction (e.g. due to heat sink fin height or component thickness). However, because the lateral panel dimensions remain the same, and variations in thickness from panel to panel may be accommodated by the molding press, the same general purpose molding equipment may be used for a wide variety of products of diverse dimensions. Using power converters as an example, the same mold press may be used to encapsulate panels of power converters ranging in (1) footprint size from full size, to half, to quarter, to eighth size (or any other size), and in (2) thickness (height), and in (3) topology, e.g. isolated DC-DC regulating converter, non-isolated buck regulator, DC transformer, etc. to produce a large mix of products.

A panel molding manufacturing process for a mix of products may include some or all of the following steps. Select a specific product to build. Select the requisite blank heat sink panels, e.g. based upon fin orientation, spacing, and height for the specific product. Alternatively, machine the exterior of the heat sink blank panels to produce the requisite external surface (heat sink surface, mounting features such as threaded holes, fin orientation, thickness, and spacing). Machine the interior surfaces of the heat sink blanks to form the recesses and other features (i.e. the contours of interior cavity to match some or all component locations, size, and height), of the finished heat sink panels required for the specific product, preferably under computer control. Select the appropriate PCB panel for the specific product. Select and assemble the magnetic cores and other components onto the PCB panel, e.g. by surface mount soldering, etc. Dispense a measured quantity of molding compound into the bottom heat sink panel. Press the bottom side of PCB panel up against bottom heat sink panel. Dispense a measured quantity of molding compound on the top side of the PCB panel. Press top heat sink panel into place on the PCB panel. Place the panel assembly on a rotary table away from the axis of rotation, preferably a large distance from the axis, and spin the rotary table and panel assembly to evacuate air bubbles in the interior cavity to achieve essentially void free fill of panel assembly with molding compound. Cure the molding compound. Cut the panel along the cut lines for singulation. Apply a conformal coating to protect the interconnects, or plate the interconnects, or attach a lead frame, motherboard, or connector to the exposed interconnects.

J. PCB Symmetries

Figure 27:
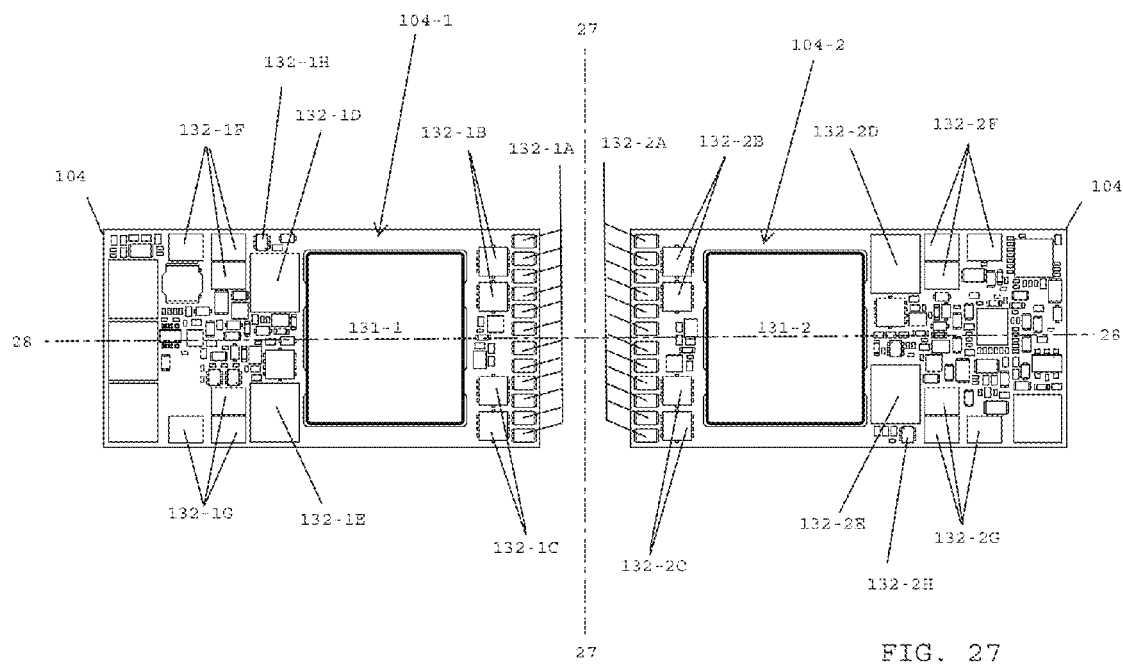
FIG. 27 shows top and bottom plan views of a section of a PCB illustrating symmetry of component layouts.

The components may be symmetrically arranged on the PCB such as shown in the power converter example of FIG. 27. The top 104-2 and bottom 104-1 faces of a populated PCB 104 from an individual power converter module are shown in plan view in FIG. 27. The populated PCB 104 is shown rotated along the vertical axis 27 in FIG. 27 to show the symmetry of the components.

J1. Symmetrical Distribution Between PCB Surfaces

Many of the larger components may be distributed equally between both faces of PCB 104 as shown in FIG. 27. For example, the four input field effect transistors (FETs) 132-2D, 132-2E, 132-1D, 132-1E are shown equally distributed between the top 104-2 and bottom 104-1 surfaces with two FETs on each surface. Similar equal distribution between the top 104-2 and bottom 104-1 surfaces of the PCB 104 are shown for the eight output FETs 132-2B, 132-2C, 132-1B, 132-1C with four output FETs on each surface; the twelve input capacitors, 132-2F, 132-2G, 132-1F, 132-1G, with six input capacitors on each surface; and twenty four output capacitors 132-2A, 132-1A with twelve output capacitors on each surface. Some of the FETs can function as switches. Distributing larger components between the two surfaces of the PCB may decrease stresses on the PCB, e.g. due to differences in the coefficient of expansion of the encapsulant, e.g. while curing, which may improve the co-planarity and mechanical integrity of the device.

J2. Symmetrical Distribution on a PCB Surface

On each surface of the PCB, components having similar characteristics, such as size or in-circuit power dissipation, may be arranged symmetrically for example as shown in FIG. 27 with respect to horizontal axis 28. It can be seem that relative to the horizontal axis 28, which is drawn longitudinally through the midline of the top and bottom surfaces of PCB 104, many of the components are arranged symmetrically. For example, the six input capacitors 132-1F and 132-1G on the bottom surface 104-1 are symmetrically distributed in a mirror-image relationship to each other relative to longitudinal midline axis 28. The same basic mirror image relationship is true for the six input capacitors 132-2F and 132-2G on the top 104-2 surface of the PCB. Similarly, the mirror image relationship is shown for the following pairs of components: bottom-side input FETs 132-1D and 132-1E, topside input FETs 132-2D and 132-2E, bottom-side output FETs 132-1B and 132-1C, topside output FETs 132-2B and 132-2C and also within the bottom-side and top-side banks of output capacitors 132-1A and 132-2A.

Distributing larger components symmetrically on a surface especially with respect to the longitudinal axis of the PCB may also decrease stresses on the PCB, e.g. due to differences in the coefficient of expansion of the encapsulant, e.g. while curing, which may also improve the mechanical integrity of the device. Additionally, spreading the components out symmetrically on each surface helps to spread the heat produced by power dissipating devices using a greater surface area for heat extraction improving the thermal performance.

J3. Symmetrical Footprints Between PCB Surfaces

In addition to being equally distributed between the top and bottom surfaces and being symmetrically distributed on each PCB surface, the components may also be situated such that pairs of components (wherein each component on one surface has a respective counterpart on the other surface) may be arranged to occupy essentially the same space on the PCB, i.e. a component may occupy a space on one surface that substantially overlaps with the footprint of a component on the other surface. For example, input capacitors 132-1F on the bottom surface are in the same position as their counterparts 132-2F on the top surface, i.e. they share the same footprint on the PCB. The same relationship is generally true for: input capacitors 132-1G and 132-2G; output capacitors 132-1A and 132-2A; input FETs 132-1D and 132-2D; input FETs 132-1E and 132-2E; output FETs 132-1B and 132-2B; output FETs 132-1C and 132-2C; in which the pairs of components occupy the same basic footprint, albeit on opposite surfaces, of the PCB. One benefit of sharing footprints allows the pair of components to share a common set of conductive vias used to electrically connect the components on the PCB surfaces to internal conductive layers, e.g. used to form the windings of the transformer. Because each via is used for both components in the pair, the total number of vias for making connections to the pair of components may be reduced (by as much as a factor of two) increasing the area of conductive layers useable for making connections and thus reducing resistance. For example, assuming 6 vias are required for each output FET (a total of 12 vias for two FETs), using symmetrical footprint approach, the pair of FETs can share the same 6 vias (without increasing the via resistance) and because the number has been reduced the useable area for conductors may be increased. Alternatively, while reducing the total number of vias from 12 to some intermediate number, e.g. 8, the resistance of the vias may be decreased because of the increase in effective vias per FET while still increasing the area useable for conductors.

J4. Symmetrical Power Dissipation Between PCB Surfaces

The components may be arranged between the PCB surfaces according to heat dissipated during operation. For example, the heat dissipative components may be arranged in a manner that distributes the heat evenly between the two PCB surfaces allowing heat produced by power dissipating devices to be extracted from both surfaces of the PCB improving the thermal performance. This type of heat dissipation symmetry is also factored into the component layout shown in the power converter of FIG. 27. For example, two input cells each using the same basic circuit topology are shown, one above and another below axis 28. As shown, the components of each input cell occupy both sides of the PCB in observance of other factors influencing component layout such as winding locations, etc. In this example, the upper input cell includes the two input FETs 132-1D and 132-2D, and the six input capacitors 132-1F and 132-2F. The lower input cell includes the two input FETs 132-1E and 132-2E, and the six input capacitors 132-1G and 132-2G. To ensure heat dissipation symmetry between the two surfaces, the cells may be arranged in mirror image layouts as shown. In FIG. 27, input FET 132-2E (top surface) in the lower cell corresponds to input FET 132-1D (bottom surface) in the upper cell. Similarly, lower cell input FET 132-1E (bottom surface) corresponds to upper cell input FET 132-2D (top surface). As can be seen, the significant power dissipative components of the input cells are arranged to have one component of one cell mounted on one surface with the respective component from the other cell mounted on the other surface. This type of symmetry may be seen in FIG. 27 with lower cell component 132-2H mounted on the top surface and the respective upper cell component 132-1H mounted on the bottom surface. In some examples, the FETs are arranged such that during operation, the power FETs on the top surface dissipate power at a level that is comparable to the level of power dissipated by the power FETs on the bottom surface. Also, the level of power dissipated by the power FETs in the upper input cell is comparable to the level of power dissipated by the power FETs in the lower input cell. For example, the level of power dissipated by the power FETs on one surface is less than 150% of the level of power dissipated by the power FETs on the other surface. The level of power dissipated by the power FETs in the upper cell is less than 150% of the level of power dissipated by the power FETs in the lower cell, and vice versa.

Laying out the components using any or all of the above symmetries produces several key benefits including, enhanced thermal performance, reducing top to bottom and side to side imbalances during encapsulation caused by asymmetrical distribution of components may enhance the co-planarity and structural integrity, and shared component footprints on top and bottom PCB surfaces may help reduce conduction losses and increase efficiency.

K. Center Plate Panel Assembly

In an alternate embodiment, an optional center plate 727 may be used between the top 721 and bottom 722 heat sink panels as illustrated in FIG. 28 through FIG. 32. The center plate 727, which may be made from aluminum, a molded high temperature plastic or any other material suitable for the molding process, includes an opening 729 in which the populated PCB panel 724 may sit during the panel molding process. As shown in the side view of FIG. 29 and the cross-sectional view of FIG. 32, the PCB panel 724 may sit entirely within the opening 729 and may have some high profile components, such as magnetic cores 131 and capacitors 132 (continuing with the power converter example), extending beyond the planar surfaces of the center plate. Alternatively, the center plate may be made thick enough, or include a ridge around the periphery tall enough, such that the PCB panel and all components sit entirely within the opening allowing a flat surface (heatsink panel or mold panel) to close against the center plate. The recesses formed in the interior surfaces of the heat sink panels 721, 722 (described above) may accommodate portions of the components extending beyond the center plate surface. Conversely, protrusions from the interior surface of the heat sink panels may be used to reduce the distance between the heat sink and lower profile components. However, it may be preferable for ease of fabrication and tolerance control to avoid protrusions of the heat sink beyond the surface of the center plate which may put an upper limit on the thickness of the center plate in some embodiments.

Figure 28:
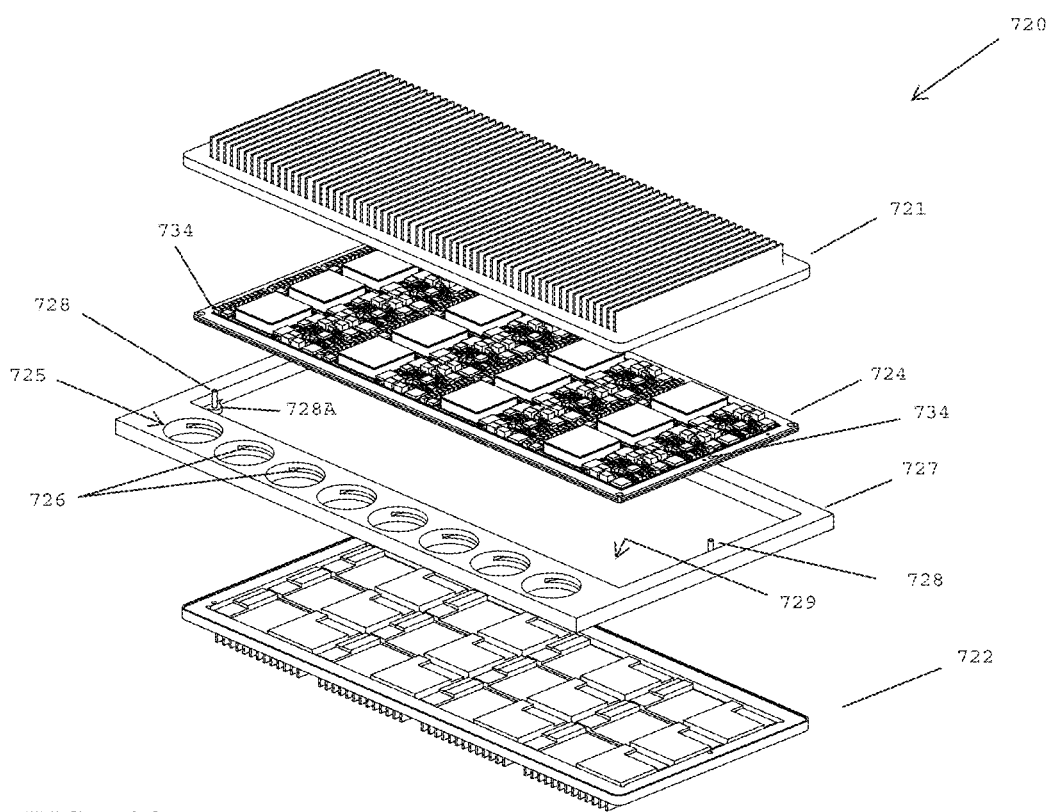
FIG. 28 shows an exploded perspective view of a panel assembly 720 including a manifold plate.
Figure 29:
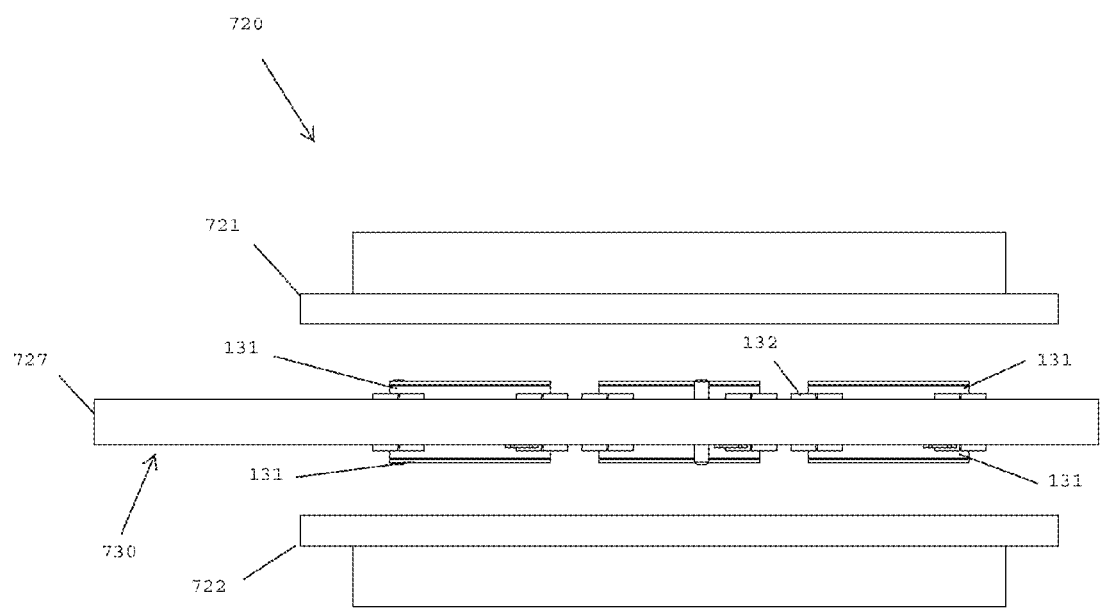
FIG. 29 is an exploded side view of the panel assembly 720 showing the PCB mated with the manifold plate.
Figure 31:
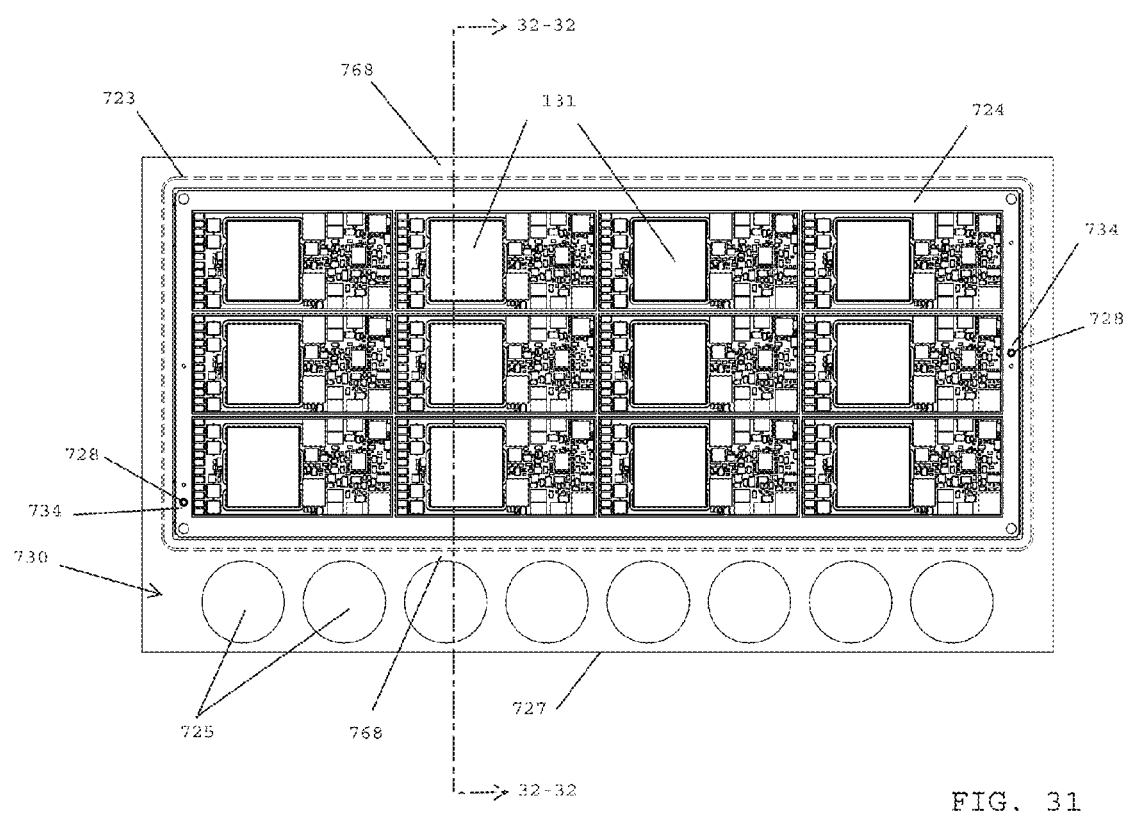
FIG. 31 shows a top plan view of the panel assembly 720 with the top heat sink panel removed.

As shown in the exploded perspective view of FIG. 28 and the top plan view of FIG. 31, registration features may be provided in the center plate 727. For example, registration pins 728 may mate with corresponding holes 734 in the PCB 724 to establish the horizontal position, i.e. in the X and Y directions, of the PCB relative to the center plate 727. Additional registration features such as the illustrated horizontal shelf 728A (FIG. 28), may be provided to establish the vertical position, i.e. in the Z direction, of the PCB relative to the center plate. The registration pins 728 may be long enough to extend beyond the upper surface of the PCB panel 724 in the upward direction and beyond the horizontal shelf in the downward direction to mate with holes (analogous to holes 152 and 153 in FIG. 4B) which may be provided in the top and bottom heat sink panels 721, 722 establishing the horizontal positions of the mold panels relative to the center plate 727. Provision of the registration features in the center plate may help relax certain precision requirements, the complexity, and thus the cost of the heat sink panels.

Figure 30:
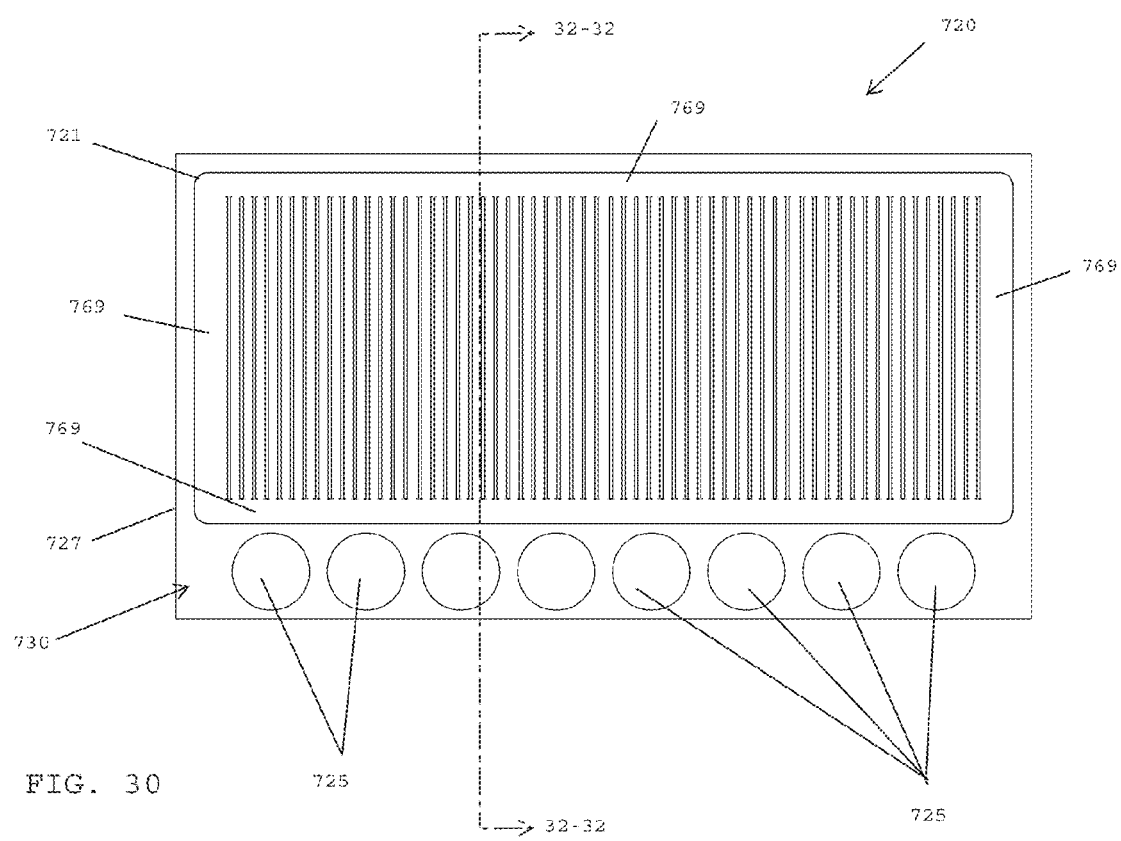
FIG. 30 shows a top plan view of the panel assembly 720.
Figure 32:
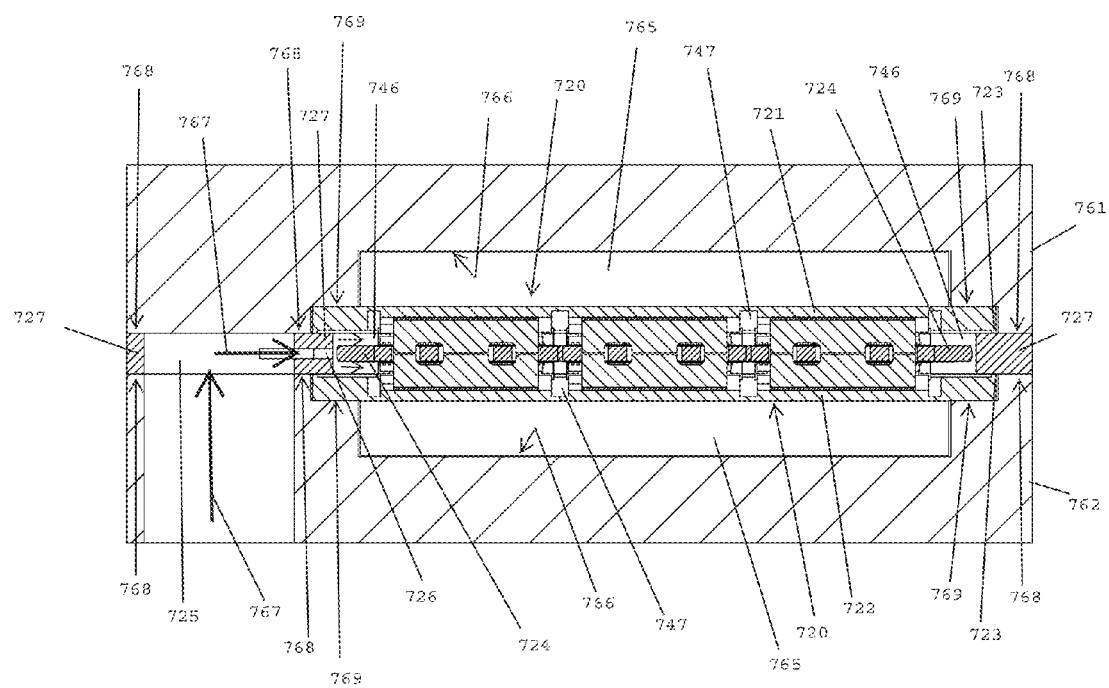
FIG. 32 shows a side view of the panel assembly 720 closed in a mold.

A cross-section of the panel assembly 720 closed in a mold press taken through line 32-32 in FIGS. 30 and 31 is shown in FIG. 32. As shown, the upper mold press 761 engages the center plate 727 directly along its perimeter in regions 768 and engages the heat sink panels directly along their perimeters in regions 769. Preferably the mold press includes recessed surfaces 766 providing cavities 765 large enough to accommodate a full range of fin heights (or other heat sink panel features) supporting a diverse range of products. To compensate for dimensional differences between the thickness of the heat sink panels in regions 769 and the difference in elevation between interface regions 768 and 769 in the mold press, one or more compressible features may be provided at the interface between the heat sink panels 721, 722 and the center plate 727. For example, a small crushable feature 723 may be formed along the perimeter of and as an integral part of the heat sink panels as illustrated in FIG. 32. Alternatively a gasket may be used between the center plate and one or both of the heat sink panels. As the press closes on the panel assembly 720 the crushable features 723 are compressed until the press is closed securely against both the center plate 727 and the heat sink panels 721, 722. As shown in FIG. 31, the crushable features may extend along the perimeter of the interior cavity forming a seal between each heat sink panel and the center plate.

The center plate may preferably include an extension, e.g. extension 730, to at least one side of opening 729 providing space for one or more chambers 725 as shown in FIGS. 30, 31, and 32. During the transfer molding process, encapsulation material may be forced from the chambers through one or more channels 726 (as shown in FIGS. 28 and 32) in the center plate into opening 729 and thus the cavity in which the populated PCB panel 724 is enclosed. An example of encapsulant flow through a chamber 725, channel 726, and into the interior cavity 746 is illustrated by the arrows 767 shown in FIG. 32.

In the center plate panel mold assembly, the top and bottom mold panels (i.e., heat sink panels 721, 722) close against the center plate instead of each other, reducing the thickness of the top and bottom mold panels, increasing the symmetry between, and reducing the complexity of, the top and bottom heat sink panels 721, 722, potentially simplifying the molding press, eliminating critical tolerance accumulations in the assembly, simplifying the process and reducing cost. For example, provision of the chambers 725 and conduits 726 in the center plate 727 eliminates the need for sealing along a second axis, e.g. in a horizontal direction and allows for use of a simpler cull-on-plate molding press. Critical tolerances are reduced to the one vertical dimension of the heat sink panels which can be relaxed using a crushable feature or a compliant material on the surface that interfaces with the center plate. Additionally, the center plate 727 may be standardized allowing a single configuration to be used with a large variety of heat sink panels such that the center plate may be cost-effectively molded.

III. Molding Process Non-Integrated Re-Useable Mold

A. Components without Heatsinks

Figure 33:
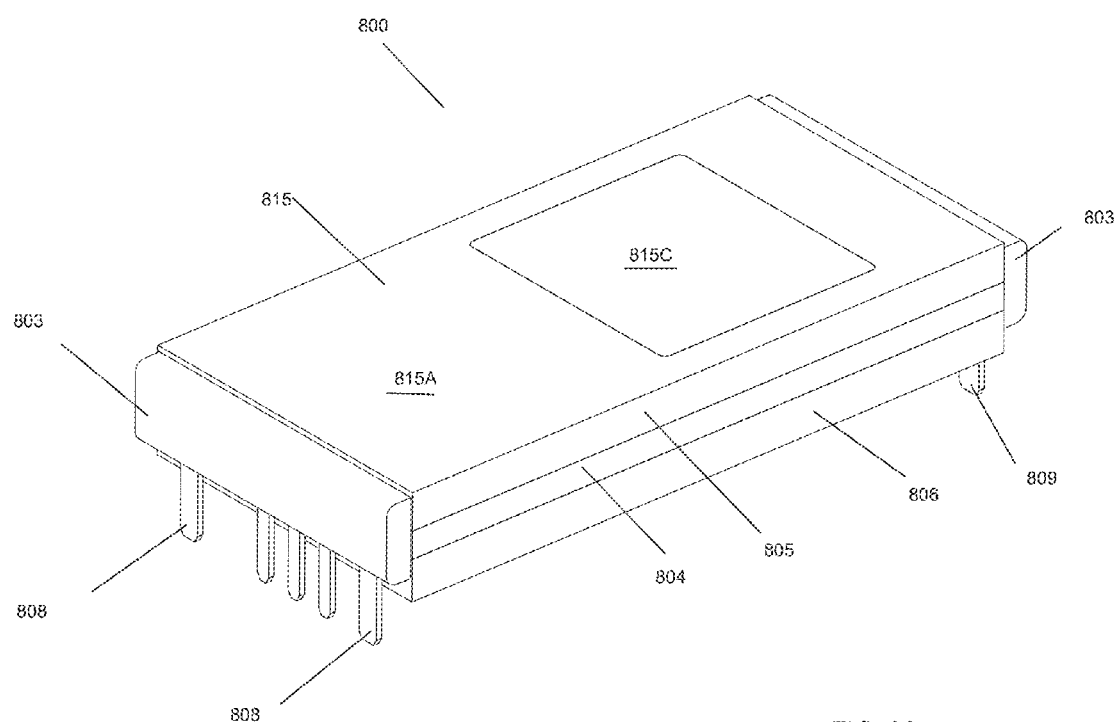
FIG. 33 shows a top perspective view of a singulated module.
Figure 34:
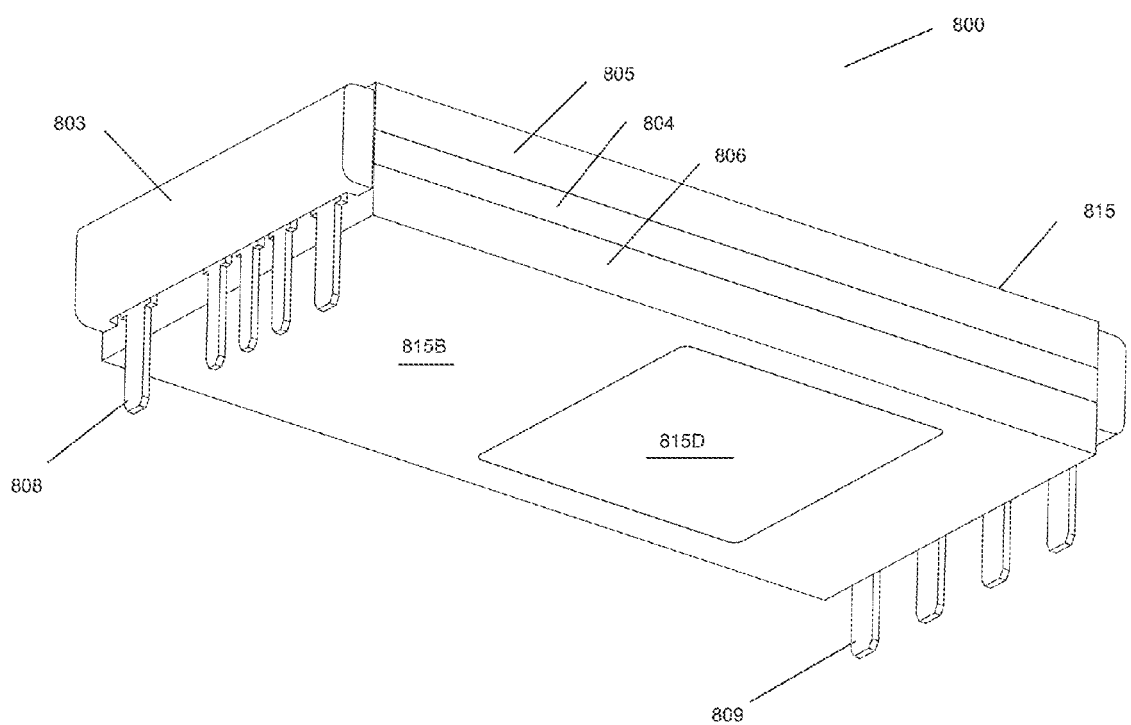
FIG. 34 shows a bottom perspective view of a singulated module.

In some applications it may be desirable to use the panel-molding process to produce components, such as power converters, without the flat heat sink surfaces (FIGS. 17-24, 25, 26), finned heat sinks (FIGS. 1, 10, 12, 15-16, 25, 26), or pinned heat sink (FIG. 25A) features described in the above embodiments. Referring to FIGS. 33 and 34, a horizontal-mount component 800 is shown including a singulated module 815 and two adapters 803A, 803B, suitable for through-hole mounting to a motherboard. Comparing the singulated module 815 (FIG. 33) with the singulated modules 215 (FIG. 16) and 315 (FIG. 17) reveals that the integral heat sink surfaces of the previous examples are omitted in the singulated module 815. As shown in FIGS. 33 and 34 and described in greater detail below, the top 815A and bottom 815B surfaces of the singulated module 815 are defined by the cured encapsulant 805, 806 in which the magnetic core surfaces 815C, 815D are exposed.

Figure 35:
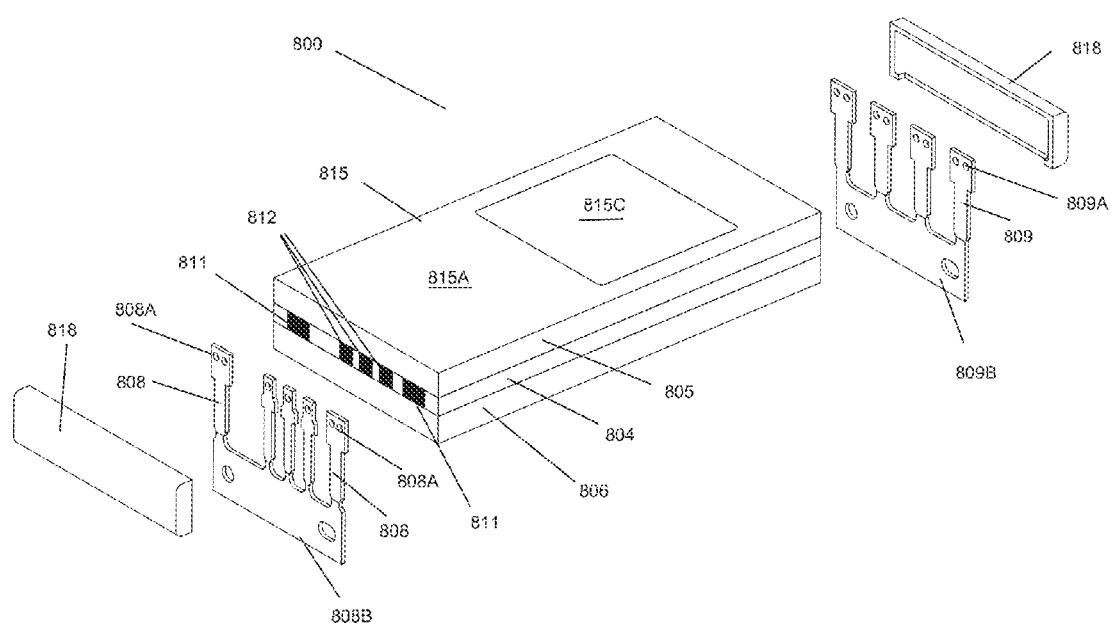
FIG. 35 shows a top exploded perspective view of a singulated module and connectors.
Figure 36:
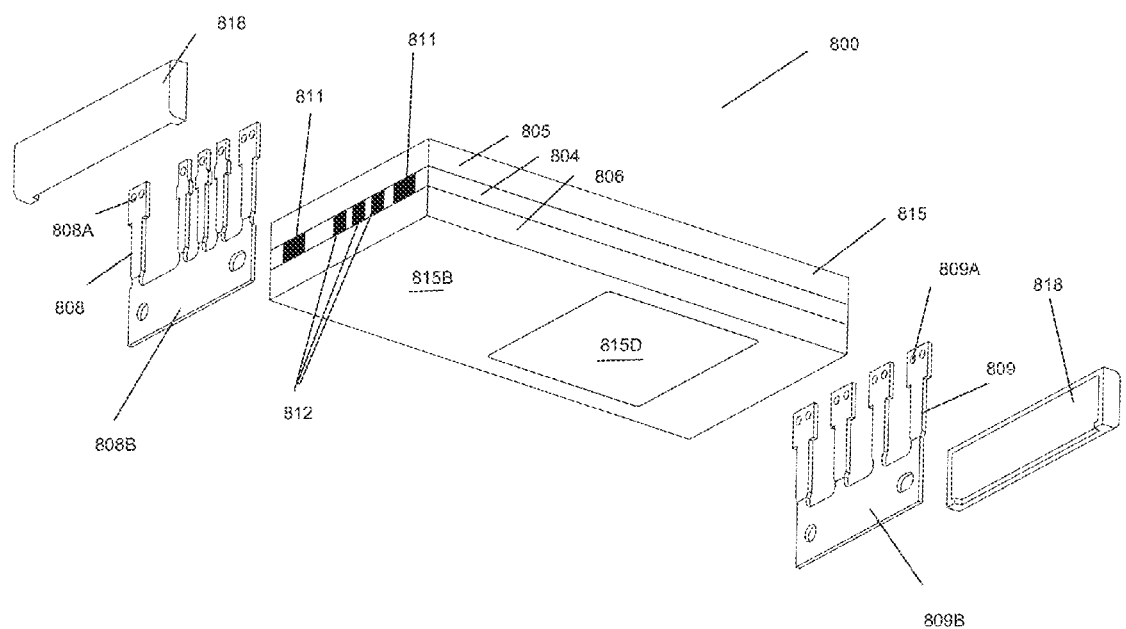
FIG. 36 shows a bottom exploded perspective view of a singulated module and connectors.

Like the singulated modules with heat sinks, various types of connectors or adapters may be coupled to the exposed interconnects 811, 812 at the edges of the singulated module 815. All of the variations described above in connection with the heat-sink versions may be adapted for use with the singulated module 815. As shown in FIGS. 33 and 34, adapters 803 having terminal portions 808 and interconnect portions 808A may be formed for example by a precision metal stamping process. Initially, the terminal portions 808 may be coupled to a lead frame 808B as shown in FIGS. 35 and 36 forming a unitary unit for ease of assembly. The interconnect portions 808A may be soldered to the exposed interconnects 811, 812 in the manner described above, and protective caps 818 may be attached, e.g. with epoxy, covering the interconnect portions 808A, to provide structural integrity, and exposing only the terminals 808. The lead frame 808B may be separated from the terminals 808 after the terminals are attached to the exposed contacts.

B. Center Plate Molding

The above-described panel molding process may be adapted to produce the heat-sinkless modules 815 shown in FIGS. 33 through 36. Referring to the exploded view of FIG. 37, re-useable flat top and bottom plates 834 may be used in place of the top and bottom heat sink panels of the previous examples. The center plate 827, which like the center plate 727 in FIG. 28 may be made from aluminum, a molded high temperature plastic or any other material suitable for the molding process, includes an opening 829 in which the populated PCB panel 824 may sit during the molding process. Like the example of FIG. 28, the center plate 827 may include an extension, e.g. extension 830 in FIG. 38, to at least one side of opening 829 providing space for one or more chambers 825 (shown in FIGS. 37, 39, and 40).

Figure 38:
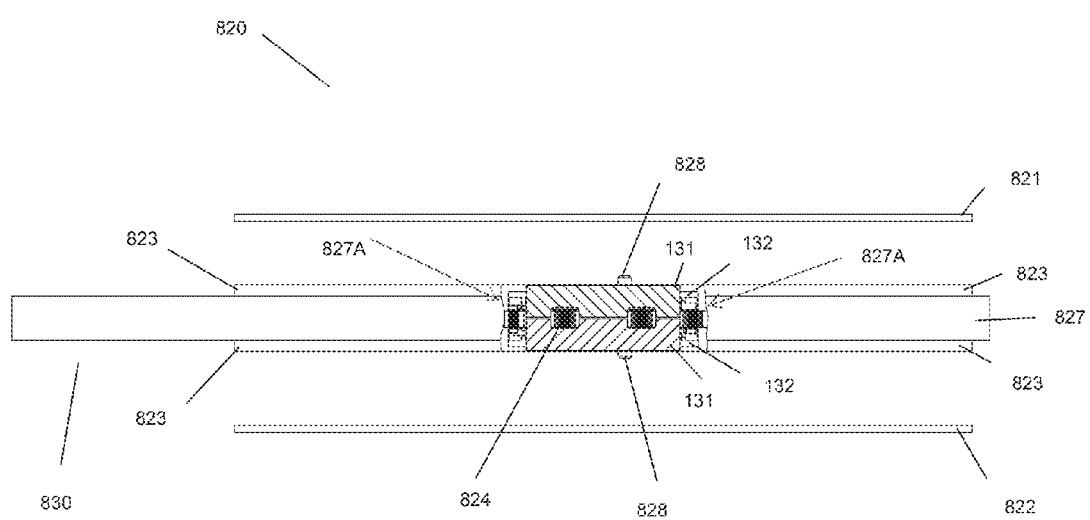
FIG. 38 is an exploded side view of the PCB panel assembly with the PCB mated with the manifold plate.

The center plate 827 may include a sealing ridge 823 along the periphery of the opening 829 to provide a total thickness of the center plate 827 sufficient to accommodate the PCB panel 824 and all of the components, including for example the magnetic cores 131, while minimizing waste material in the center plate. Referring to the side view of FIG. 38, the thickness of the manifold provides adequate clearance for all of the components on the PCB panel 824. As shown in the cut away section 827A-827A in FIG. 38, the space between the cores and the plates 821, 822 may preferably be minimized, reducing the volume of encapsulant required. The plate registration pins 828 are shown in FIG. 38 protruding above and below the centerplate sufficiently to engage mating openings 834 provided in the top and bottom plates, 821, 822.

Figure 37:
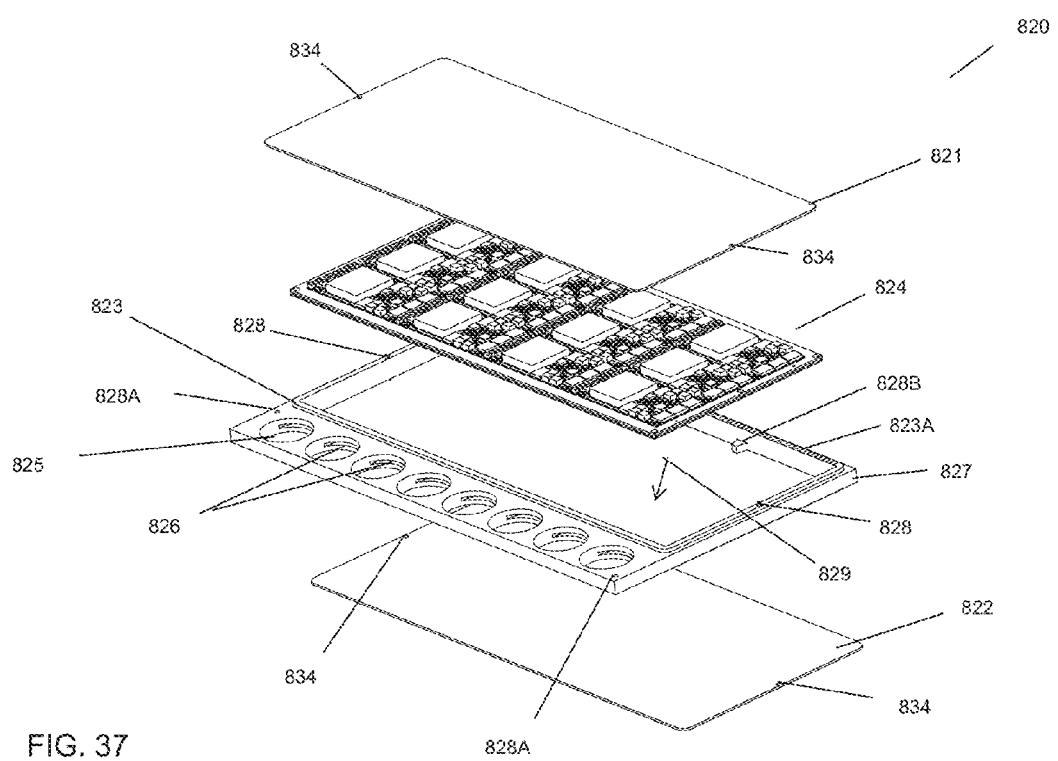
FIG. 37 shows an exploded perspective view of a PCB panel assembly including a manifold plate.
Figure 39:
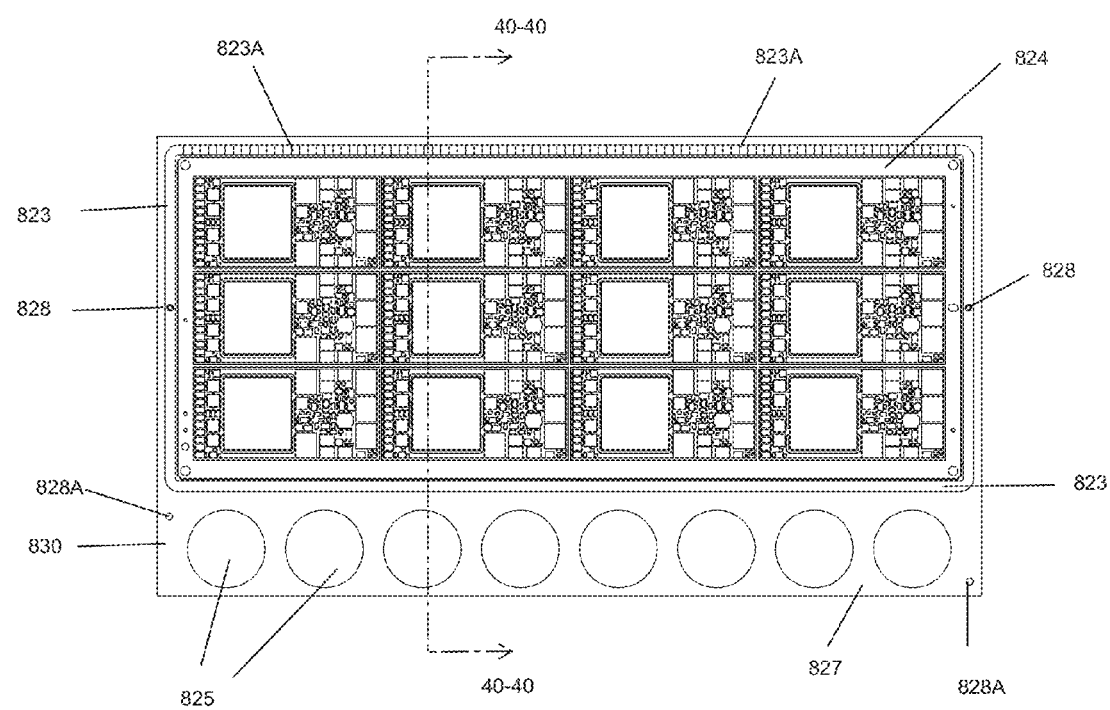
FIG. 39 shows a top plan view of the PCB panel assembly.

The PCB panel 824 may be seated on registration shelves 828B (FIG. 37) for establishing the correct vertical positioning of the PCB panel with respect to the manifold 827. The horizontal position of the PCB panel may be established using the registration pins shown in the previous example (e.g. pins 728 in FIG. 28), or may be accurately placed in the opening, e.g. using pick and place equipment or a fixture, and affixed to the center plate, e.g. using epoxy, e.g. deposited on the registration shelves 828B prior to placement of the PCB panel. The use of an adhesive such as epoxy helps to prevent bowing of the PCB panel as mold compound is forced into the cavity during the molding process. Venting features 823A may be provided in the sealing ridges 823 along the side opposite where the mold compound is injected into the cavity as shown in FIGS. 37 and 39.

Figure 40:
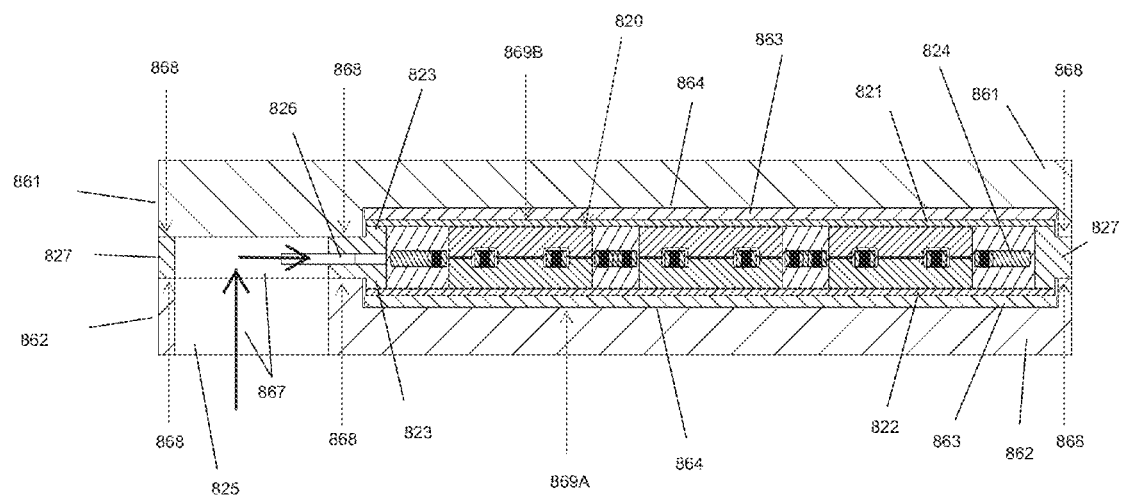
FIG. 40 shows a side view of the PCB panel assembly closed in a mold.

Referring to the FIG. 40, a section of the panel assembly 820 (taken along lines 40-40 shown in FIG. 39) is shown closed in a mold press. The mold press includes an upper press 861 and a lower press 862 which close directly against the center plate 827 along its perimeter forming seals 868 as shown. The mold presses 861, 862 may include recessed surfaces 864 creating cavities 865 large enough to accommodate a full range of PCB panel heights, supporting a diverse range of products. Shim plates 863 may be used between the recessed surfaces 864 of the mold presses 861, 862 and the top and bottom plates 821, 822 to force the plates against and form a seal with the center plate 827, e.g. along sealing ridges 823. For example, mold-to-shim-plate interface 869A and shim-plate-to-plate interface 869B are shown in FIG. 40. Variations in thickness of the center plates 827 are accommodated by the mold press closing directly against the center plate 827. Variations in the height of the top or bottom plate from the respective center plate surface may be accommodated by varying the thickness of the respective shim plate. In this way, components of varying thicknesses may be produced using an center plate 827 having the appropriate thickness for the desired component height and using thicker or thinner shim plates 863 as necessary to adjust for any difference in height between the center plate 827 and the top and bottom plates 821, 822. Alternatively, one or both of the shim plates may be omitted completely allowing the mold presses to press directly against the respective top and/or bottom plates.

During the transfer molding process, encapsulation material may be forced from the chambers 825 through one or more channels 826 (FIG. 40) in the center plate into opening 829 (FIG. 37) and thus the cavity in which the populated PCB panel 824 is enclosed. An example of encapsulant flow through a chamber 825, channel 826, and into the cavity is illustrated by the arrows 867 shown in FIG. 40. After the encapsulant is cured, e.g., by heating, the manifold plate 827 and the encapsulated PCB panel may be separated from the upper and lower mold presses 861, 862. During or after the cooling process, the top and bottom plates may be removed from the panel assembly. The surfaces of the top and bottom plates 821, 822 are relatively smooth and separate easily from the encapsulant as the panel assembly cools due to differences in thermal expansion coefficients of the materials.

Figure 41:
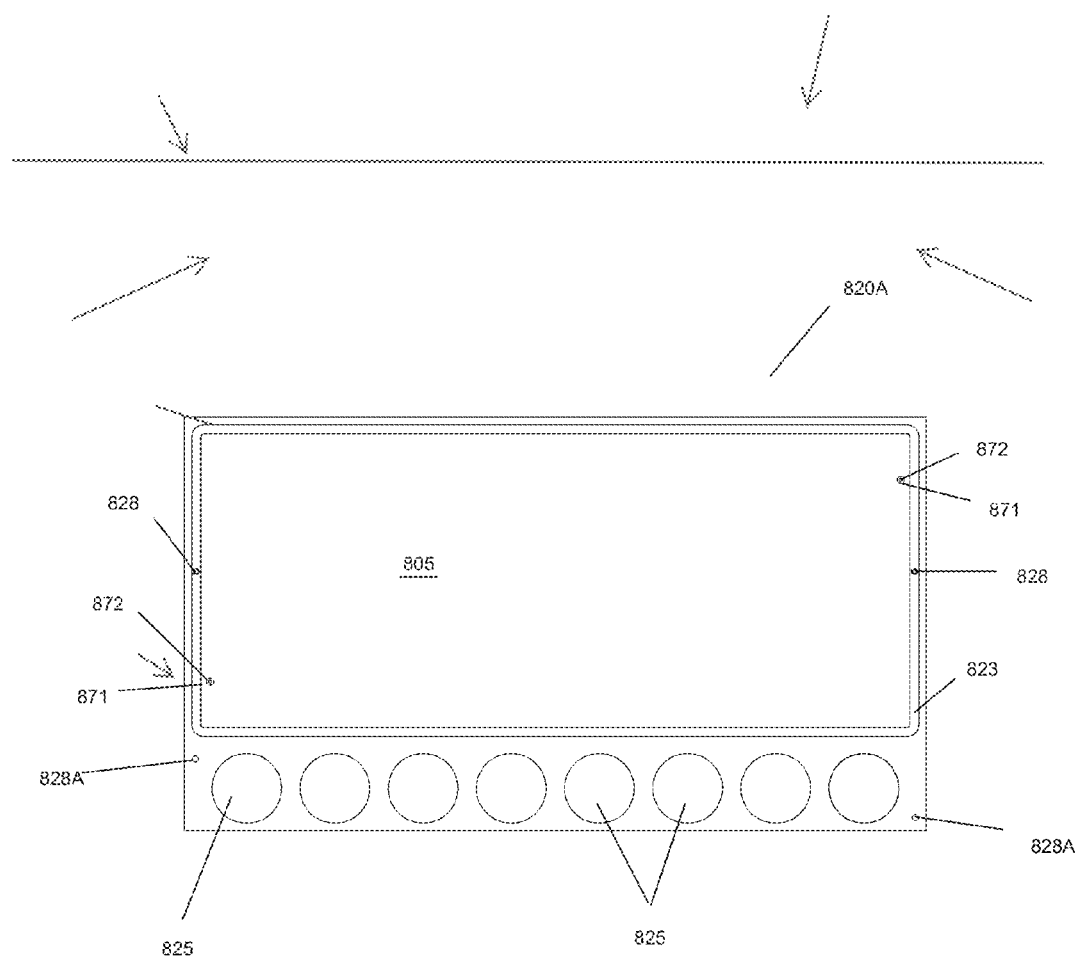
FIG. 41 shows a top plan view of the encapsulated PCB panel assembly and manifold plate.
Figure 42:
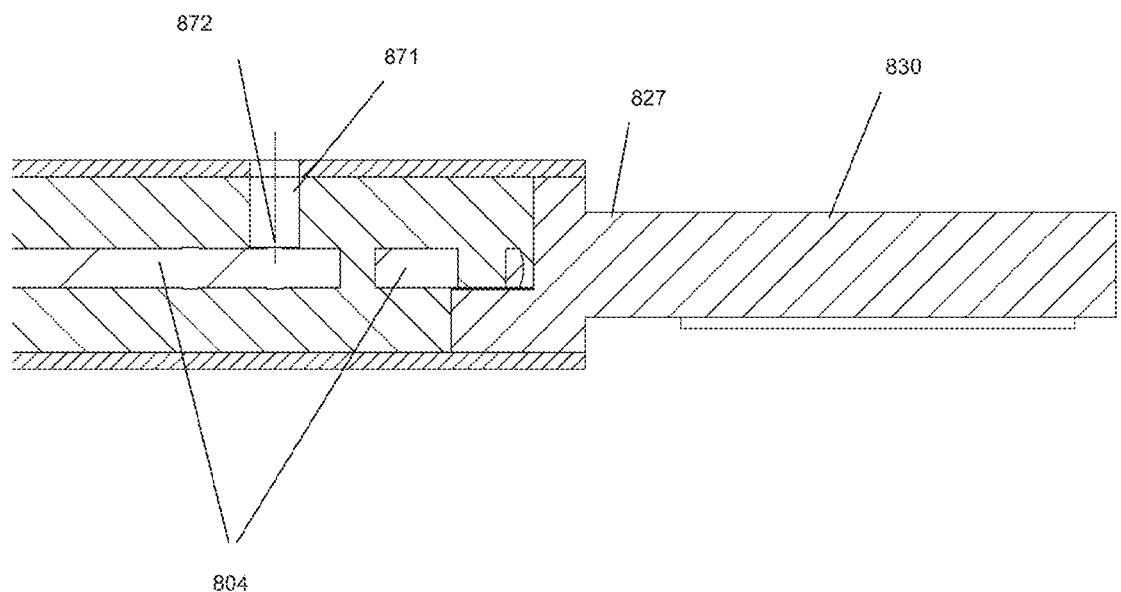
FIG. 42 shows a cross-sectional view of the encapsulated panel assembly.

FIG. 41 shows a top plan view of the encapsulated panel assembly 820A separated from the upper and lower mold presses after removal of the top and bottom plates 821, 822. The center plate 827 may include registration features 828A (FIGS. 37, 39, 41) for positional accuracy in pre- and post-encapsulation processing of the panel. For example, the registration features 828A may be used to accurately position the PCB panel with respect to the center plate during installation or may be engaged by pins in the mold to accurately position the center plate in the mold. Greater positional accuracy may be achieved by making one or more holes 871 through the encapsulant in predetermined regions of the encapsulated PCB to expose corresponding fiducial marks 872 incorporated in the PCB panel. The center plate 827 and its registration features 828A thus may be used to establish an approximate horizontal position (of the PCB panel) for making the holes 871 which preferably would be larger than the fiducial marks 872. The exposed fiducial marks may be used to register the position of the PCB panel with greater accuracy for precise singulation. FIG. 42 shows a cross-sectional view of the encapsulated panel assembly through one of the holes 871 in the encapsulant exposing the fiducial mark 872 on the PCB panel.

Preferably before singulation, the encapsulated panel assembly may be lapped to expose the magnetic cores, finish the surface, and accurately establish the thickness of the panel-molded components. After singulation, the interconnects may be processed and connectors, terminals or adapters may be attached to the components as described above.

C. Direct Molding

Alternatively, the panel molding process may be further adapted to encapsulate the PCB panel directly within the mold cavity without using a center plate (such as center plates 727 in FIGS. 28 and 827 in FIG. 37), heat sink panels (such as panels 721, 722 in FIG. 28) or top and bottom plates (such as plates 821, 822 in FIG. 37). In the direct-mold embodiment, the PCB panel may be placed in the bottom mold, with the top mold closing against the bottom (instead of each mold closing against the center plate). The depth of the mold cavity may be set to match the overall height of the PCB panel and components with a custom mold for each product thickness. Alternatively, the mold cavity may have moveable interior surfaces that may be adjusted for the selected product or changeable shim plates designed for each product may be used with a standardized mold to adjust the depth of the mold cavity and thus the encapsulation thickness.

Figure 43:
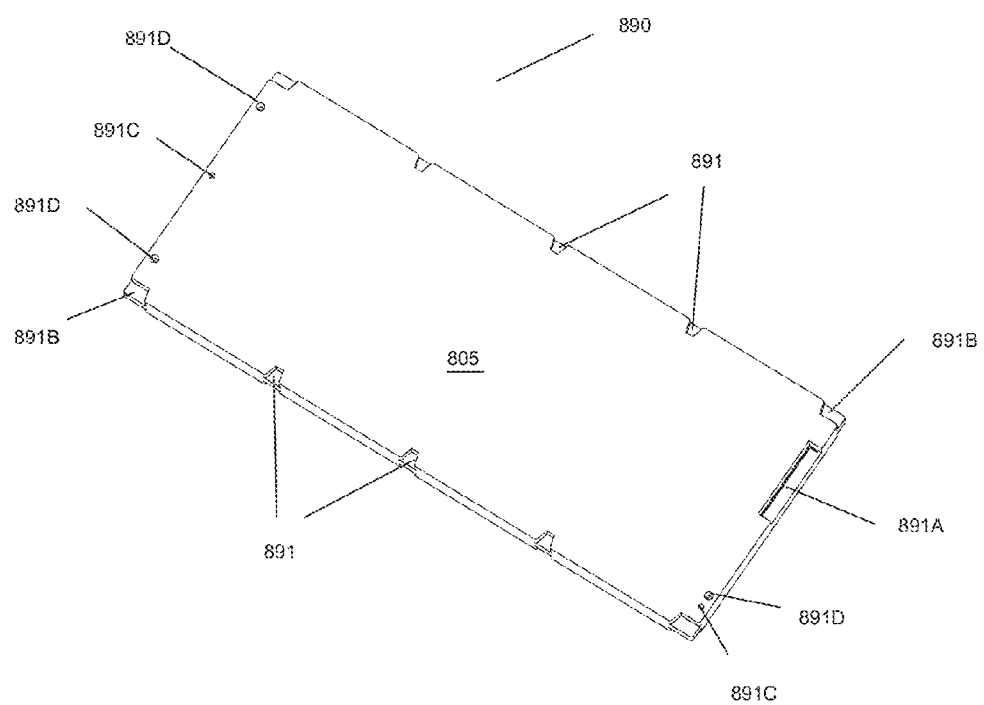
FIG. 43 shows a bottom (as molded) isometric view of an encapsulated PCB panel.
Figure 44:
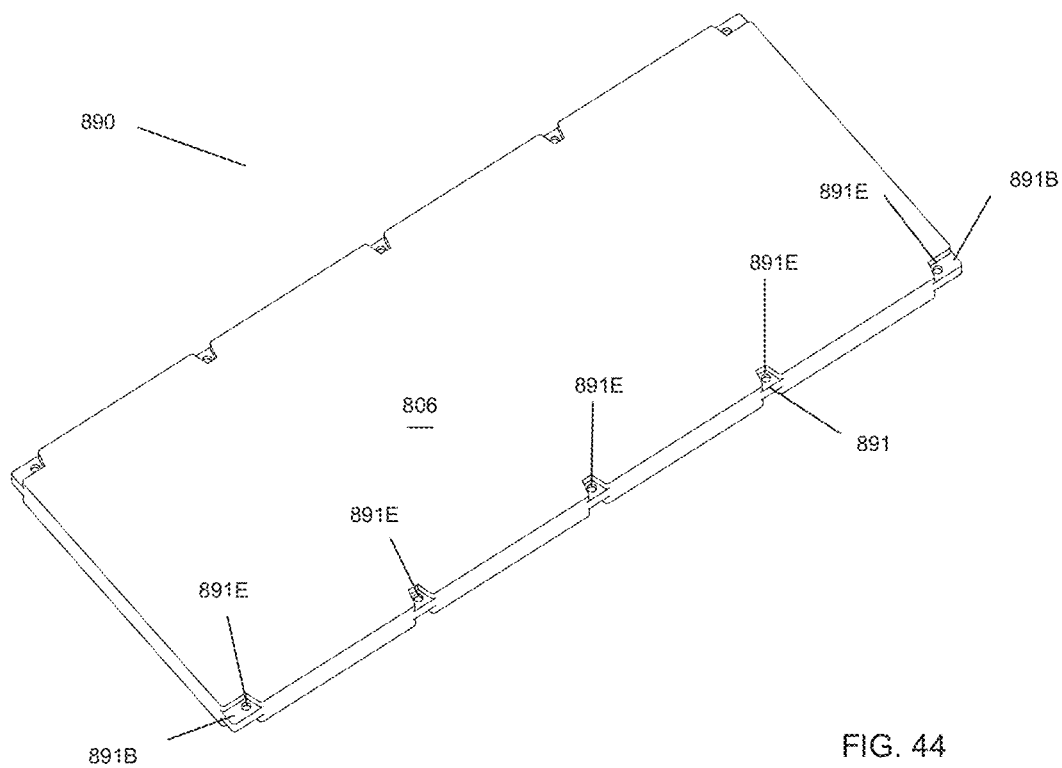
FIG. 44 shows a top (as molded) isometric view of an encapsulated PCB panel.

The mold may include fixed or movable registration supports (e.g. similar to registration shelves 828A provided in the center plate 827 in FIG. 37) preferably along the periphery of the mold cavity. The PCB panel may be seated on the supports to establish the appropriate vertical position in the mold cavity and which may also be used to reduce (displace) the volume of encapsulant in selected regions of the panel. Referring to FIGS. 43 and 44 for example, an encapsulated PCB panel 890 produced using the direct mold technique is shown after removal from the mold cavity. FIG. 43 shows a bottom view as molded (component top view) of the panel revealing indentations in the cured encapsulant 805, indentations 891 along the sides, indentations 891B at the corners, a large indentation 891A at one end, and circular indentations 891C and 891D at each end of the panel 890. The large indentation 891A may be used to expose identifying features on the PCB such as a bar code used during manufacture to identify the panel. Similarly, the circular indentations 891C and 891D may be used to expose positional information on the PCB, such as the fiducial markings described above.

The PCB panel may be placed in the bottom mold cavity, and the upper mold press may be pressed against the lower mold forming a seal around the cavity. As the upper mold is closed against the lower mold, preferably moveable pins within the upper mold may make contact with the PCB in the regions of the supports to bias the PCB against the registration supports in the lower mold and securing the PCB panel. For example, the top view as molded (component bottom view) of FIG. 44 shows, additional circular indentations 891E in the cured encapsulant 806 located within the indentations 891 and 891B revealing potential locations at which moveable pins may be deployed in the top mold section. It may be advantageous to locate the movable pins within other support features to limit the exposed length of the pin.

With the mold closed and the PCB panel secured, molding compound may be injected into the mold cavity and cured, e.g. by elevating the temperature. After the molding compound is cured, the encapsulated PCB panel may be separated from the upper and lower mold presses, and any encapsulant remaining on the PCB in the region of holes 891A, 891C, 891D may be removed as described above (e.g., by drilling or laser ablation) to expose the identifying features (bar code and fiducial marks) on the PCB panel 124. The PCB panel may be lapped, and singulated as required.

In some implementations, after singulation, a portion of the top encapsulant 822 can be removed by mechanical lapping to expose a top surface of a magnetic core structure 826. Similarly, a portion of the bottom encapsulant material 824 can be removed by mechanical lapping to expose a bottom surface of the magnetic core structure 826. The lapping process provides great dimensional control of the finished product.

As described above in connection with the heat sink panel versions, the finished products, e.g. modules made using a standard panel size, may have diverse dimensions not only in the lateral (length and width) directions, but also in the vertical (thickness) direction (e.g. due to component thickness). However, because the lateral PCB panel dimensions remain the same, and variations in component thickness from panel to panel may be accommodated by the molding press, the same general purpose molding equipment may be used for a wide variety of products of diverse dimensions to produce a large mix of products.

In some implementations, a panel molding manufacturing process for a mix of products may include some or all of the following steps. Select a specific product to build. Select the requisite mold presses, e.g. based upon spacing and height for the specific product. Select the appropriate PCB panel for the specific product. Select and assemble the magnetic cores and other components onto the PCB panel, e.g. by surface mount soldering, etc. Dispense a measured quantity of molding compound into the bottom mold press. Press the bottom side of PCB panel up against bottom mold press. Dispense a measured quantity of molding compound on the top side of the PCB panel. Press top mold press into place on the PCB panel. Inject additional molding compound into the cavity between the top and bottom mold presses and the PCB panel through a channel formed between the top and bottom mold presses. Cure the molding compound. Remove the encapsulated PCB panel from the mold presses. Form holes in the encapsulant to expose fiducial marks to facilitate alignment. Cut the encapsulated PCB panel along the cut lines for singulation. Apply a conformal coating to protect the interconnects, or plate the interconnects, or attach a lead frame, motherboard, or connector to the exposed interconnects.

In some implementations, a panel molding manufacturing process for a mix of products may include some or all of the following steps. Select a specific product to build. Select the requisite mold presses, e.g. based upon spacing and height for the specific product. Select the appropriate PCB panel for the specific product. Select and assemble the magnetic cores and other components onto the PCB panel, e.g. by surface mount soldering, etc. Position the PCB panel in a manifold plate (e.g., 827 in FIGS. 37-42). Press top and bottom mold presses against the manifold plate. Inject molding compound into the cavity between the top and bottom mold presses and the PCB panel through chambers and channels formed in the manifold until the PCB panel is entirely enclosed by the molding compound. Cure the molding compound. Remove the manifold plate and the encapsulated PCB panel from the mold presses. Form holes in the encapsulant to expose fiducial marks to facilitate alignment. Mechanically lap one or both surfaces of the panel. Cut the encapsulated PCB panel along the cut lines for singulation. Apply a conformal coating to protect the interconnects, or plate the interconnects, or attach a lead frame, motherboard, or connector to the exposed interconnects.

IV. Connectors Based on 3D Bar Codes

Figure 47:
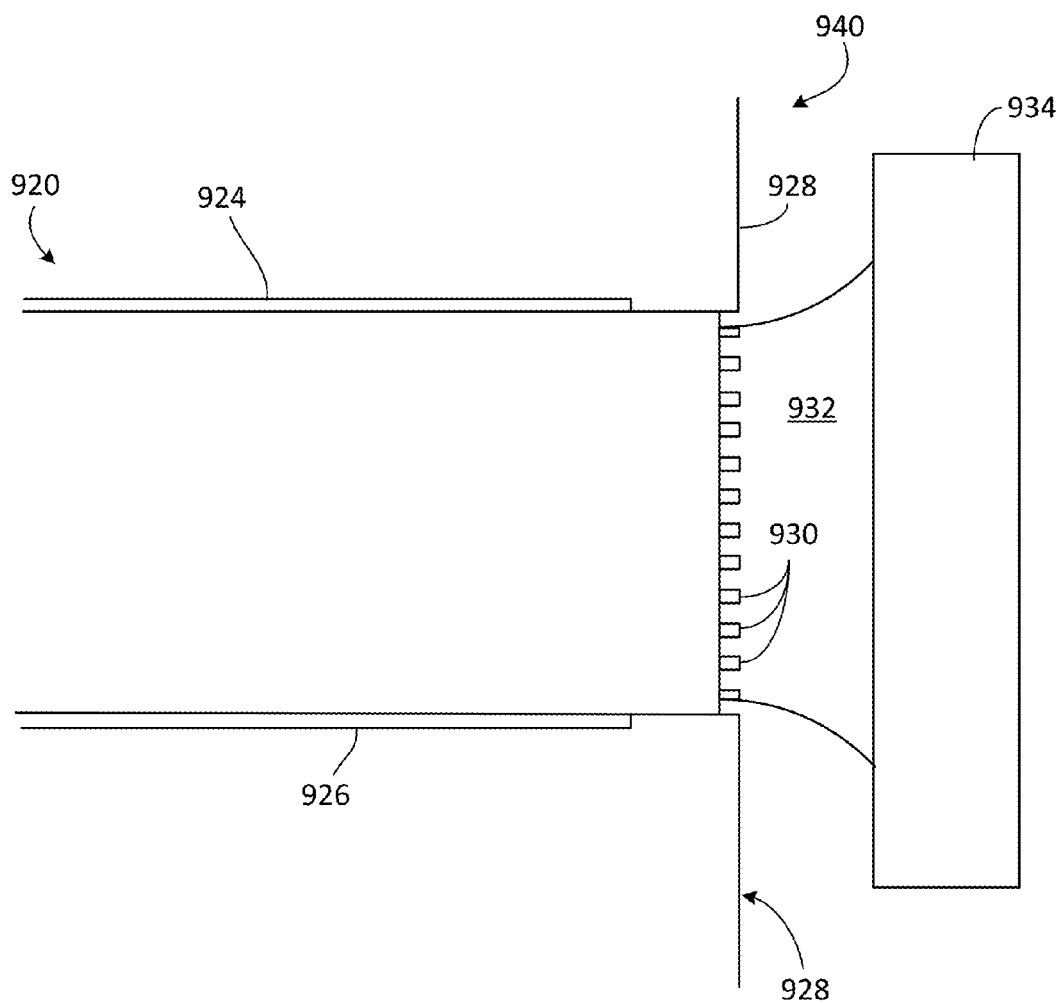
FIG. 47 shows the PCB panel connected to an external circuit board.

The 3D bar codes may be used with any of the adapters and connection methods described above for the standard, i.e., two-dimensional, bar codes. However, because of the mechanically robust solder joints attainable using 3D bar codes, additional connection options are available with 3D bar codes. Referring to FIG. 47 for example, the 3D bar code formed in PCB 920, i.e., exposed conductive features 930, may be surface mount soldered directly to mating contact pads on the external circuit board 934. Solder 932 may be applied between the exposed conductive features 930 and the external circuit board 934 to form a metallic bond to the exposed conductive features 930. Because the exposed surface area of the conductive features 930 is increased after removing a portion of the insulative material 922, the bonding strength between the solder 932 and the conductive features 930 increases, providing a more robust connection between the PCB panel 920 and the external circuit board 934. Although FIGS. 46-47 primarily show the bar code related details of the PCB 920, it should be appreciated that the figures are representative of a 3D bar code of, and solder connections to, a singulated panel molded module, such as, for example, module 940 shown in FIG. 48A or 48B.

In general, components having 3D conductive features can be solder attached to metalized substrates. For example, the 3D conductive features can be attached to metalized lead frames using solder paste and standard SMT reflow profiles for the heat cycle. The 3D conductive features can be attached to the metalized edge of a PCB board. In this process, the surfaces are fluxed and a solder alloy preform is reflowed between the substrates. Alternatively, solder paste can be used.

Figure 48A:
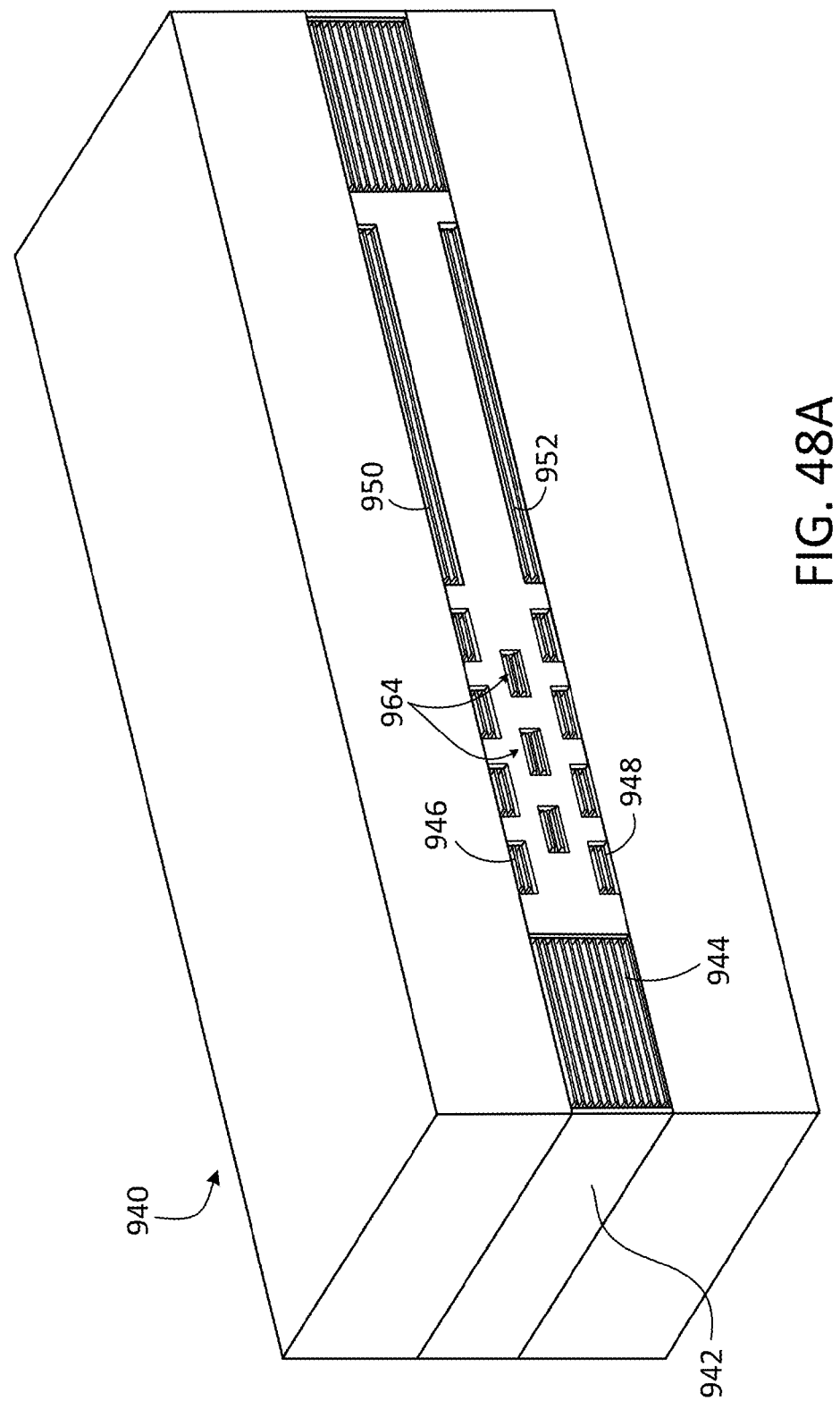
FIGS. 48A and 48B show perspective views of PCB panels having split bar codes.

Owing to their increased mechanical robustness, 3D conductive features may be arranged into two or more bar codes in the same space that might otherwise be provided for a single bar code. Referring to FIG. 48A for example, two sets of conductive features, 946 and 948 are shown making up two individual bar code terminals. Because each of the bar codes 946 and 948 occupy only a portion of the PCB thickness compared to adjacent bar code 944 which occupies nearly the entire PCB thickness, they appear as "split" bar codes. The split refers to establishing two distinct node connections in the space typically occupied by a single bar code. In this example, a panel molded device 940 includes a PCB 942 having several contact sets. For example, a contact set 944 includes a twelve conductive features that together form a single electrical connection node. The number and width of the conductive features making up bar code 944 may be appropriate for providing a power connection that may be used to carry relatively large currents. A contact set 946 includes two 3D conductive features that together form a single electrical connection node. A contact set 948 includes two 3D conductive features that together form a separate single electrical connection node. The fewer and narrower features in 3D bar codes 946 and 948 may be appropriate for carrying relatively smaller currents such as for electrical control or status signals. In some examples, the contact set 946 and the contact set 948 may be separated by a distance that is at least twice as large, or at least five times as large, as the distance between two adjacent conductive features.

Figure 48B:
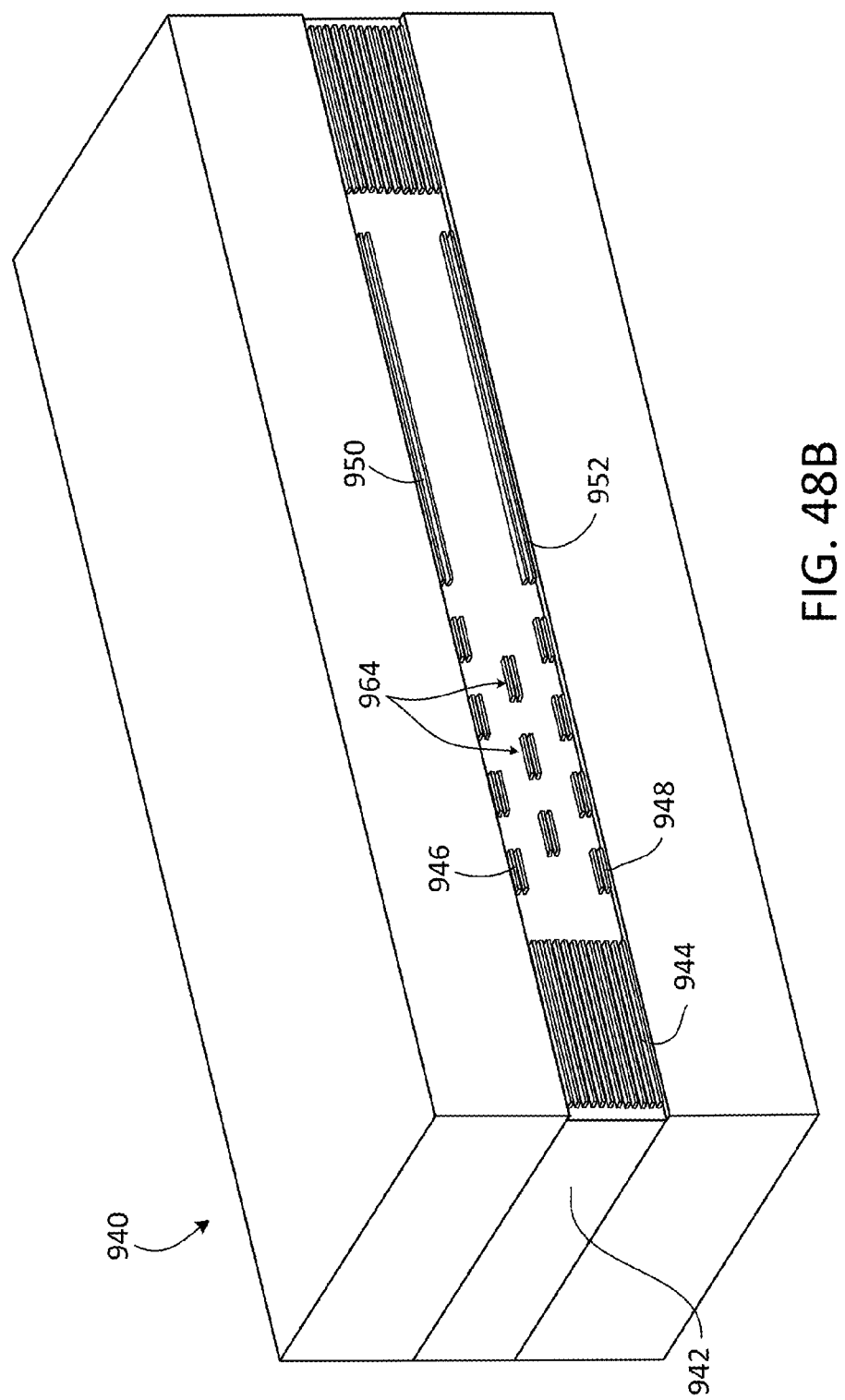

In FIG. 48A, some of the insulation material 922 was masked before etching, so portions of the insulation material 922 away from the conductive features 930 remain intact. Referring to FIG. 48B, in some implementations, the PCB panel 942 is positioned between other modules that are covered by encapsulant. In this case, masking may not be required because the PCB insulation material etches much faster than the encapsulant. The entire edge of the PCB panel 942 is etched, exposing the 3D conductive features. After etching, the conductive features appear to protrude from the edge surface of the insulation material.

A 3D conductive feature has a larger surface area compared to a flat (2D) conductive feature, so when the 3D conductive feature is soldered to a conductive pad of another circuit board, the mechanical strength provided by the 3D conductive feature may be significantly greater than that provided by a flat conductive feature. As a result, fewer 3D conductive features may be needed for establishing a reliable connection for a single node. Another example of split bar codes includes the contact sets 950 and 952 each of which includes two relatively wide 3D conductive features that together provide greater mechanical strength than the two shorter 3D conductive features of contact set shown for bar codes 946 and 948. In some implementations, each conductive layer in the PCB 942 may vary in thickness from 1.3 mils to 3.3 mils depending on the weight and the manufacturer of the PCB. Each conductive feature in a contact set may not have sufficient conductive surface area to provide a mechanically secure solder connection to an external terminal. By using multiple conductive features in a contact set and etching the insulation to make 3D conductive features, mechanically robust solder connections may be established.

Figure 49:
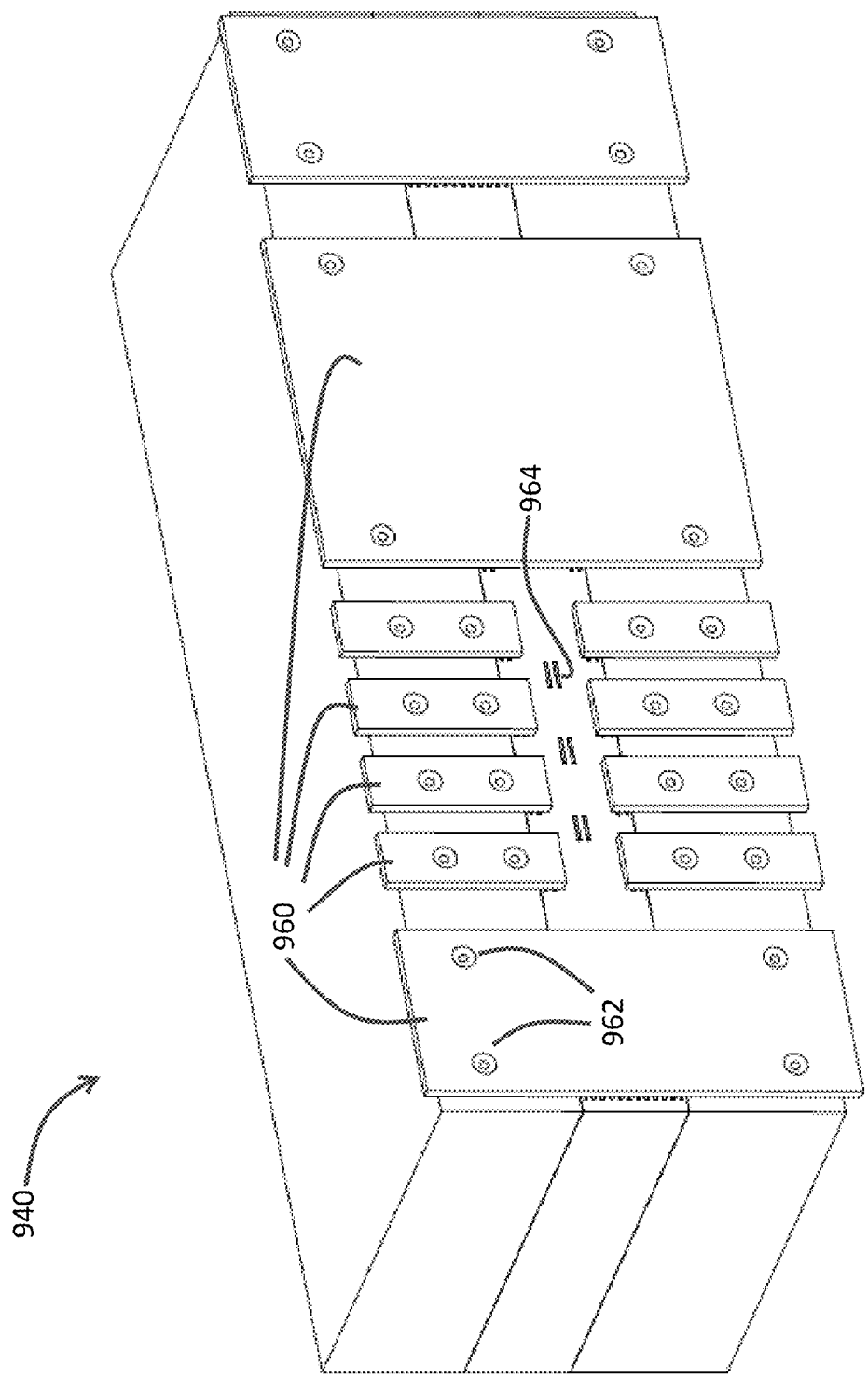
FIG. 49 shows the PCB panel of FIG. 48B in which the bar codes are connected to conductive terminals for surface mounting.
Figure 50:
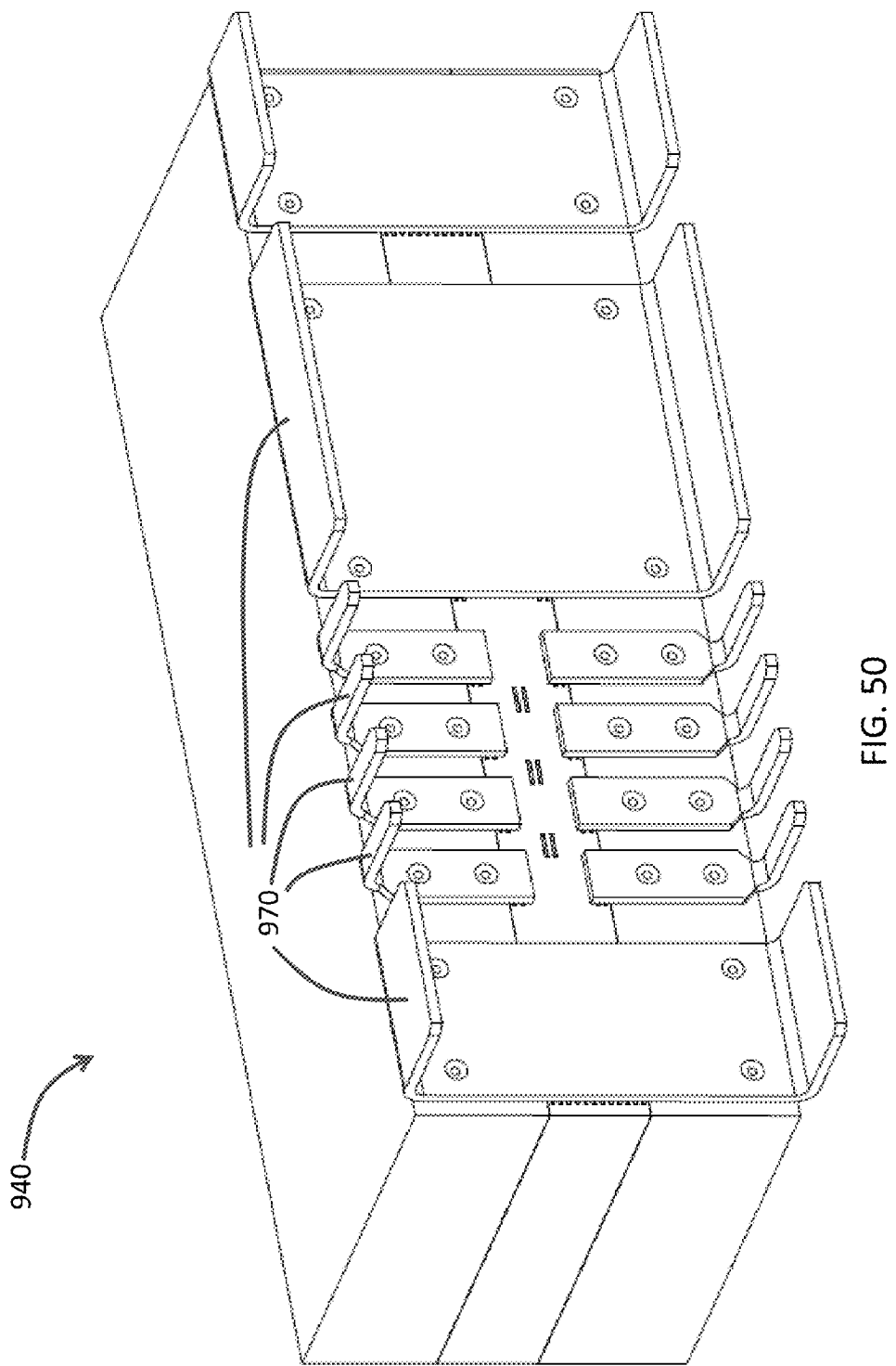
FIG. 50 shows the PCB panel of FIG. 48B in which the bar codes are connected to a lead set for through hole mounting.

The distance between the contact sets 946 and 948 in the thickness direction may be set to provide adequate clearance between adjacent conductive terminals, e.g., in a 14 layer PCB, conductive layers 2 and 3 may form one 3D bar code and conductive layers 14 and 15 may be used to form an adjacent 3D bar code, with conductive layers 4 through 13 being setback to provide clearance between the two 3D bar codes as shown in the example of FIG. 48. Small mid-PCB-elevation bar codes 964 may be located between the split bar codes as shown in FIGS. 48 and 49. The mid-PCB elevation bar codes may be used during manufacture, e.g., for testing or programming, rather than for end-user connections to external components. As shown in FIGS. 49 and 50, the mid-PCB-elevation terminals may be left unconnected to a lead frame, and preferably may be covered with a non-conductive material such as a structural epoxy.

The 3D bar codes 944, 946, 948, 950, and 952 (FIG. 48) may be soldered to respective conductive pads on another printed circuit board or to respective terminals of a lead frame. Referring to FIG. 49, in some implementations, conductive terminals or a lead set can be attached to the 3D bar codes. For example, the panel molded device 940 has split bar codes attached to a lead set 960 for surface mounting to an external PCB. The leads include small dimples 962 that establish a minimum standoff distance between the lead and the panel molded component for preserving a minimum solder thickness for the connection between the two. A lead set 970 adapted for through-hole mounting of a 3D split bar coded component to an external PCB is shown in FIG. 50.

A number of embodiments of the invention have been described. Nevertheless, it will be understood that various modifications may be made without departing from the spirit and scope of the invention. For example, non-metallic mold panels may be used. The center plate may be provided as a single-use consumable or may be modified to be used as a reusable fixture in the molding process. The center plate may be provided with or without the encapsulation channels. The registration holes in the heat sink panels may extend completely through the heat sink panels similar to hole 152 shown in FIG. 4B and the registration pins, e.g. pins 728 (FIGS. 28 and 31), may extend completely through each of the heat sink panels allowing fasteners to be used in conjunction with the pins to hold the panel assembly together before and after the encapsulation process. The fasteners may function as or be used in conjunction with a seal around the pin to contain any encapsulant. Throughput through the mold press may be increased by using panel assemblies that are secured together and removed from the mold press before the panel has cooled or the encapsulant has set or both. The registration pins 728 and corresponding holes 734 may be used to align the panel assembly during the singulation process. In some examples, a panel assembly (e.g., 120) may be formed by dispensing encapsulant into a bottom panel mold (e.g., heat sink panel 122), assembling a substrate (e.g., PCB panel 124) into the bottom panel mold, dispensing encapsulant onto a top of the substrate, and assembling a top panel mold (e.g., heat sink panel 121) onto the substrate. In some examples, the surfaces of the PCB panel 124 may have conductive features that are covered by an insulative layer. Blank mold panels may be machined to provide some or all of the various features described above in an on-demand manufacturing system.

In some examples, the upper and lower heat sinks 121, 122 are clamped together by the upper and lower mold presses 161, 162 at respective clamp regions of the upper and lower heat sinks 121, 122. The clamp region of the upper heat sink 121 can be located at points along a circumference of an internal cavity defined by the interior surface of the upper heat sink 121. The clamp region of the lower heat sink 122 can be located at points along a circumference of an internal cavity defined by the interior surface of the lower heat sink 122. In some examples, the clamp regions are cut away from the panel assembly 120 to expose the interconnects 111, 112, and 113. After the cut, portions of the upper and lower heat sinks 121, 122 near an active circuit area remain attached to the panel assembly 120, allowing heat from the active circuit area during operation to be dissipated through the remaining portions of the upper and lower heat sinks 121, 122. The active circuit area can be, e.g., an area of the PCB panel 124 having active components, such as magnetic core structures 131 and electronic components 132. Interlocking contours, other than the undercuts 148 shown in FIGS. 6, 7, and 12, can also be formed in the interior surface of the mold panel, the contour being filled with cured mold compound enhancing the structural integrity of the singulated module. In some examples, most of the large-footprint components (e.g., 132-2D, 132-2E, 132-2B, 132-2C) are distributed substantially symmetrically between quadrants surrounding the transformer core (e.g., 131-2) on a surface of the PCB panel 124. For example, in FIG. 27, the input FETs 132-2D and 132-2E are distributed substantially symmetrically between the upper-right and lower-right quadrants surrounding the transformer core 131-2. The output FETs 132-2B and 132-2C are distributed substantially symmetrically between the upper-left and lower-left quadrants surrounding the transformer core 131-2.

Accordingly, other embodiments are within the scope of the following claims.

What is claimed is:

1. A method of forming an electrical connection to an electronic module, the method comprising:
   assembling a panel including a substrate and having one or more conductive features enclosed within the panel and unexposed to an exterior surface of the panel, the one or more conductive features each being electrically connected to a respective electrical node of the panel and being located along a cut line;

cutting the panel along the cut line exposing a contact edge of each of the one or more conductive features, wherein each contact edge is embedded in and forms part of a perimeter surface of the electronic module after the cutting; and selectively removing portions of material from the perimeter surface adjacent to selected ones of the contact edges of selected ones of the conductive features exposing additional portions of the selected ones of the conductive features, wherein the additional portions are recessed from the perimeter edge and together with the adjacent exposed edge forms a three dimensional contact.

2. The method of claim 1 further comprising preparing the contact edges and the additional portions of the conductive feature for solder wetting.

3. The method of claim 1 further comprising wetting the contact edges and the additional portions of the conductive features with solder.

4. The method of claim 1 further comprising forming a metallic bond between the contact edges and the additional portions and an external conductive terminal.

5. The method of claim 4, further comprising encapsulating the panel prior to cutting the panel, and cutting the panel comprises cutting the encapsulated panel.

6. The method of claim 1 further comprising forming a metallic bond between the contact edges and the additional portions of the conductive features and a conductive pad on a printed circuit board.

7. The method of claim 6, further comprising encapsulating the panel prior to cutting the panel, and cutting the panel comprises cutting the encapsulated panel.

8. The method of claim 1 further comprising forming a solder connection between the contact edges and the additional portions of the conductive features and a terminal of a lead frame.

9. The method of claim 8, further comprising encapsulating the panel prior to cutting the panel, and cutting the panel comprises cutting the encapsulated panel.

10. The method of claim 1 wherein the additional portions have surface areas that form angles greater than 45 degrees to the perimeter edge.

11. The method of claim 1, comprising forming a plurality of three dimensional contacts,
arranging the three dimensional contacts in a plurality of contact sets, each contact set having a plurality of three dimensional contacts, in which each contact set is separated from adjacent contact sets by a portion of the perimeter edge that is free of conductive features, and
using the plurality of three dimensional contacts of each contact set together to form a distributed electrical connection to a single electrical node in the circuit assembly.

12. The method of claim 11 in which each contact set is separated from adjacent contact sets by a portion of the perimeter edge that is free of conductive features, in which a first distance between two adjacent contact sets is at least twice as large as a second distance between two adjacent conductive features, the first and second distances being measured along a direction substantially perpendicular to a top surface.

13. The method of claim 11 in which each contact set is separated from adjacent contact sets by a portion of the perimeter edge that is free of conductive features, in which a first distance between two adjacent contact sets is at least five times as large as a second distance between two adjacent conductive features, the first and second distances being measured along a direction substantially perpendicular to a top surface.

14. The method of claim 11, further comprising electrically coupling an external conductive terminal to a selected contact set.

15. The method of claim 11, further comprising solder connecting each conductive pad of an external circuit board to a respective contact set.

16. The method of claim 11, further comprising solder connecting each terminal of a lead frame to a respective contact set.

17. The method of claim 11, further comprising encapsulating the panel prior to cutting the panel, and cutting the panel comprises cutting the encapsulated panel.

18. The method of claim 1 wherein assembling a panel including a substrate comprises assembling a panel including a printed circuit board ("PCB"), cutting the panel along the cut line exposing a contact edge comprises cutting the PCB exposing a contact edge of the PCB, the PCB has a plurality of conductive layers, and the conductive features comprise selected portions of the conductive layers and are located at an elevation in the perimeter surface between a first surface and a second surface.

19. The method of claim 18 wherein selectively removing portions of material from the perimeter surface comprises selectively removing portions of the material in insulation layers in the PCB.

20. The method of claim 1, further comprising encapsulating the panel prior to cutting the panel, and cutting the panel comprises cutting the encapsulated panel.

21. A method of forming an electrical connection to an electronic module, the method comprising:
assembling a panel of electronic circuitry including a printed circuit board ("PCB"), a plurality of electronic components mounted to the PCB, and having one or more conductive features enclosed within the panel and unexposed to an exterior surface of the panel, the one or more conductive features each being electrically connected to a respective electrical node of the panel and being located along a cut line;
cutting the assembled panel and the PCB along the cut line exposing a contact edge of the PCB and each of the one or more conductive features, wherein each contact edge is embedded in and forms part of a perimeter surface of the electronic module after the cutting; and
selectively removing portions of material from the perimeter surface adjacent to selected ones of the contact edges of selected ones of the conductive features exposing additional portions of the selected ones of the conductive features,
wherein the additional portions are recessed from the perimeter edge and together with the adjacent exposed edge forms a three dimensional contact.

22. The method of claim 21, further comprising encapsulating the panel prior to cutting the panel, and cutting the panel comprises cutting the encapsulated panel.

23. The method of claim 21 wherein the PCB has a plurality of conductive layers, the conductive features comprise selected portions of the conductive layers and are located at an elevation in the perimeter surface between a first surface and a second surface, and selectively removing portions of material from the perimeter surface comprises selectively removing portions of the material in insulation layers in the PCB.

24. The method of claim 23, further comprising forming a plurality of three dimensional contacts,
- arranging the three dimensional contacts in a plurality of contact sets, each contact set having a plurality of three dimensional contacts, in which each contact set is separated from adjacent contact sets by a portion of the perimeter edge that is free of conductive features, and
- using the plurality of three dimensional contacts of each contact set together to form a distributed electrical connection to a single electrical node in the circuit assembly.

25. The method of claim 24 further comprising separating each contact set from adjacent contact sets by a portion of the perimeter edge that is free of conductive features, wherein a first distance between two adjacent contact sets is at least twice as large as a second distance between two adjacent conductive features, the first and second distances being measured along a direction substantially perpendicular to a top surface.

26. The method of claim 24 further comprising separating each contact set from adjacent contact sets by a portion of the perimeter edge that is free of conductive features, wherein a first distance between two adjacent contact sets is at least five times as large as a second distance between two adjacent conductive features, the first and second distances being measured along a direction substantially perpendicular to a top surface.

27. The method of claim 24 wherein the selectively removing portions of the material in insulation layers in the PCB further comprises plasma etching the insulation layers in the PCB in an etching region.

28. The method of claim 27 wherein the selectively removing portions of the material in insulation layers in the PCB further comprises masking selected areas outside of the etching region before the plasma etching to protect the selected areas.

29. The method of claim 28 wherein the selectively removing portions of the material in insulation layers in the PCB further comprises media blasting the etching region after the plasma etching the etching region.

30. The method of claim 29 wherein the media blasting comprises using dry ice, $CO_2$ as the blast media.

31. The method of claim 30 further comprising forming a solder connection to at least one contact set including a solder joint between the plurality of three dimensional contacts of each contact set and a respective external conductor.

32. The method of claim 31 wherein the respective external conductor comprises a conductive feature of an external PCB.

33. The method of claim 31 wherein the respective external conductor comprises a conductive lead of an adapter or lead set.

* * * * *

UNITED STATES PATENT AND TRADEMARK OFFICE
CERTIFICATE OF CORRECTION

PATENT NO. : 9,936,580 B1
APPLICATION NO. : 14/596914
DATED : April 3, 2018
INVENTOR(S) : Patrizio Vinciarelli et al.

Page 1 of 1

It is certified that error appears in the above-identified patent and that said Letters Patent is hereby corrected as shown below:

In the Specification

Column 15, Line 10, after "etch back processing" insert -- . --.

Column 17, Line 41, delete "FIG." and insert -- FIGS. --.

Column 28, Line 11, delete "FIGS." and insert -- FIG. --.

Signed and Sealed this
Fifth Day of June, 2018

Andrei Iancu
*Director of the United States Patent and Trademark Office*